(12) United States Patent
Park et al.

(10) Patent No.: US 10,743,425 B2
(45) Date of Patent: Aug. 11, 2020

(54) DISPLAY DEVICE AND METHOD FOR MANUFACTURING THE SAME

(71) Applicant: LG Display Co., Ltd., Seoul (KR)

(72) Inventors: Jongchan Park, Paju-si (KR); Hyunchul Um, Paju-si (KR); JeeHwan Oh, Seoul (KR); HaeRi Huh, Seoul (KR)

(73) Assignee: LG Display Co., Ltd., Seoul (KR)

( * ) Notice: Subject to any disclaimer, the term of this patent is extended or adjusted under 35 U.S.C. 154(b) by 112 days.

(21) Appl. No.: 15/796,470

(22) Filed: Oct. 27, 2017

(65) Prior Publication Data
US 2018/0124933 A1     May 3, 2018

(30) Foreign Application Priority Data

Oct. 31, 2016  (KR) .................. 10-2016-0142945
Apr. 26, 2017  (KR) .................. 10-2017-0053936
Oct. 16, 2017  (KR) .................. 10-2017-0133749

(51) Int. Cl.
| | |
|---|---|
| *H05K 5/00* | (2006.01) |
| *G09G 3/3225* | (2016.01) |
| *G09G 3/22* | (2006.01) |
| *H05K 13/04* | (2006.01) |

(52) U.S. Cl.
CPC ............ *H05K 5/0017* (2013.01); *G09G 3/22* (2013.01); *G09G 3/3225* (2013.01); *H05K 13/04* (2013.01); *G09G 2300/0426* (2013.01); *G09G 2300/0439* (2013.01); *H05K 2201/09445* (2013.01)

(58) Field of Classification Search
CPC ........... G09G 3/22; H05K 13/04; H01L 51/56
See application file for complete search history.

(56) References Cited

U.S. PATENT DOCUMENTS

| | | | |
|---|---|---|---|
| 10,038,035 B2 | 7/2018 | Xu et al. | |
| 2005/0242720 A1* | 11/2005 | Sano | ...................... H01L 51/524 313/506 |
| 2007/0170455 A1* | 7/2007 | Choi | ................... H01L 51/5246 257/100 |
| 2008/0017855 A1* | 1/2008 | Kim | ...................... G02F 1/1309 257/48 |
| 2016/0064690 A1* | 3/2016 | Kook | .................. H01L 51/5256 257/40 |
| 2016/0260928 A1* | 9/2016 | Choi | ................... H01L 51/5253 |

FOREIGN PATENT DOCUMENTS

| | | |
|---|---|---|
| CN | 104900681 A | 9/2015 |
| CN | 105895656 A | 8/2016 |
| WO | WO 03/061346 A1 | 7/2003 |

* cited by examiner

*Primary Examiner* — Shaheda A Abdin
(74) *Attorney, Agent, or Firm* — Fenwick & West LLP

(57) ABSTRACT

Disclosed is a display device which is capable of preventing an encapsulation film from being formed in a scribing line, and a method for manufacturing the same. The display device includes a substrate having a display area provided with pixels, a non-display area surrounding the display area, an encapsulation film including an inorganic film which covers the display area, and a buffer layer. The buffer layer is provided at a predetermined interval from the display area in the non-display area and is brought into contact with the edge of the inorganic film.

22 Claims, 30 Drawing Sheets

DISPLAY DEVICE AND METHOD FOR MANUFACTURING THE SAME

CROSS REFERENCE TO RELATED APPLICATIONS

This application claims the benefit of the Korean Patent Application No. 10-2016-0142945 filed on Oct. 31, 2016, the Korean Patent Application No. 10-2017-0053936 filed on Apr. 26, 2017, and the Korean Patent Application No. 10-2017-0133749 filed on Oct. 16, 2017, all of which are hereby incorporated by reference as if fully set forth herein.

BACKGROUND

Field of the Disclosure

Embodiments of the present invention relate to a display device and a method for manufacturing the same.

Discussion of the Related Art

With the advancement of an information-oriented society, various requirements for the display device of displaying an image are increasing. Thus, non self-emission type display devices such as liquid crystal display (LCD) device and plasma display panel (PDP), and electrolulminescence display devices such as organic light emitting display (OLED) device and quantum dot light emitting display (QLED) device have been utilized.

Among the display devices, the OLED device and the QLED device are self light emitting display devices. In comparison to the LCD device, the OLED device and the QLED device have wider viewing angle and greater contrast ratio. Also, the OLED device and the QLED device may be fabricated at a lightweight and slim size as they do not need a separate light source unlike the LCD device, and furthermore the OLED device and the QLED device are favorable in view of power consumption. In addition, the OLED device and the QLED device may be driven by a low DC voltage, and a response speed in each of the OLED device and the QLED device is rapid. Especially, the OLED device and the QLED device may have the advantage of low manufacturing cost.

The OLED device may include pixels respectively provided with light emitting devices, and a bank for dividing the pixels so as to define the pixels. The bank functions as a pixel defining film. The light emitting device may include an anode electrode, a hole transporting layer, an organic light emitting layer, an electron transporting layer, and a cathode electrode. In this case, when a high potential voltage is applied to the anode electrode, and a low potential voltage is applied to the cathode electrode, hole and electron are respectively moved to the organic light emitting layer via the hole transporting layer and the electron transporting layer, and are then combined to each other in the organic light emitting layer, to thereby emit light.

The light emitting device may be easily deteriorated due to external environmental factors such as moisture and oxygen. In order to prevent the deterioration of the light emitting device, the OLED device may include an encapsulation film for preventing external moisture and oxygen from being permeated into the inside of the light emitting device.

The QLED device includes a light emitting structure. The light emitting structure may include an anode electrode, a cathode electrode confronting the anode electrode, and a light emitting device disposed between the anode electrode and the cathode electrode. The light emitting device may include a hole transporting layer, a light emitting layer, and an electron transporting layer. The light emitting layer may include a quantum dot material.

FIG. 1 illustrates a mother substrate with a plurality of display panels. FIG. 2 is a cross sectional view along I-I' of FIG. 1, which shows a related art display device. FIG. 3 is a cross sectional view for explaining a method of manufacturing an inorganic film in the related art display device.

Referring to FIGS. 1 to 3, a mother substrate (MS) is prepared to manufacture a plurality of display panels (PNL) at the same time for convenience of process. The plurality of display panels (PNL) are separated from each other, wherein each separated display panel (PNL) serve as a display device. The plurality of display panels (PNL) are manufactured at the same time on the mother substrate (MS), and then the plurality of display panels (PNL) are separated from each other by a cutting process or a scribing process.

In the related art display device, an encapsulation film 30 is provided on a substrate 10 with a light emitting device 20. In this case, the encapsulation film 30 may include a first inorganic film 30a, an organic film 30b, and a second inorganic film 30c. The encapsulation film 30 prevents moisture or oxygen from being permeated into a light emitting layer and an electrode.

The first inorganic film 30a and the second inorganic film 30c are deposited on the substrate 10 by a chemical vapor deposition (CVD) method. In case of the CVD method, as shown in FIG. 3, a mask 40 is disposed on a substrate 10, and then a gas including elements for the first inorganic film 30a or the second inorganic film 30c is supplied to the substrate 10. The supplied gas causes a chemical reaction in the surface of the substrate 10 where the mask 40 is not provided, whereby the first inorganic film 30a or the second inorganic film 30c is formed on the surface of the substrate 10 where the mask 40 is not provided.

However, as the mask 40 is provided at a predetermined interval from the substrate 10, the gas permeates through the interval between the mask 40 and the substrate 10 so that the chemical reaction generates in the surface corresponding to the predetermined area of the substrate 10 where the mask 40 is provided. Accordingly, the first inorganic film 30a or second inorganic film 30c may be formed even in the surface corresponding to the predetermined area of the substrate 10 where the mask 40 is provided.

If the first inorganic film 30a or the second inorganic film 30c is formed in the surface corresponding to the predetermined area of the substrate 10 where the mask 40 is provided, especially, if first inorganic film 30a or the second inorganic film 30c is formed in a scribing line (SL), a crack may generate in the first inorganic film 30a or the second inorganic film 30c by the cutting process for separating the display panels (PNL) from each other, that is, laser cutting process or mechanical scribing process. The crack may spread to the inside through the inorganic film by an external impact, and moisture or oxygen introduced through the crack may cause spots of dark points or dark lines.

Recently, in order to overcome a low step coverage of the CVD method, a new method using an atomic layer deposition (ALD) method for depositing the first inorganic film 30a or the second inorganic film 30c on the substrate 10 has been attracted great attentions. In case of the ALD method, under the condition that a mask 40 is disposed on a substrate 10, a thin film is formed by alternately supplying a base material including ALD metal and a reaction gas. This ALD method has greater adsorption and step coverage in comparison to the CVD method. Thus, in case of the ALD method, it is possible to adjust a thickness of the thin film, which is advantageous to the process of forming the thin film.

However, as described above, the ALD method has the good adsorption, whereby the mask 40 may be lengthily provided on the substrate 10. Thus, it has a high possibility of forming the first inorganic film 30a or the second inorganic film 30c in the scribing line (SL).

In order to overcome the above problem, the mask 40 is disposed adjacent to the light emitting device 20 so as to reduce a distance between the mask 40 and the substrate 10, and further to prevent the first inorganic film 30a or the second inorganic film 30c from being permeated into the area where the mask 40 is disposed. However, if the mask 40 is disposed adjacent to the light emitting device 20, the light emitting device 20 may be damaged or deformed, whereby dark points may generate.

Meanwhile, a plurality of metal lines are disposed on the substrate 10. Specifically, the metal lines disposed in a non-display area are covered only by a thin protection film for the CVD process. If a high voltage is applied instantaneously for the CVD process, the protection film for protecting the metal lines may be damaged by the high voltage, whereby static electricity may generate between the mask 40 and the metal lines in the non-display area. In this case, the metal lines may be damaged by the static electricity, and the display panel (PNL) may be damaged by the damaged metal lines. In addition, it is impossible to reuse the mask 40.

SUMMARY

Accordingly, embodiments of the present invention are directed to a display device that substantially obviates one or more problems due to limitations and disadvantages of the related art, and a method for manufacturing the same.

An aspect of embodiments of the present invention is directed to provide a display device which is capable of preventing an encapsulation film from being formed in an unintended area, for example, a scribing line, and preventing static electricity between a mask and a metal line, and a method for manufacturing the same.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided a display device that may include a substrate having a display area provided with pixels, and a non-display area surrounding the display area, an encapsulation film which covers the display area and includes an inorganic film, and a buffer layer which is provided at a predetermined interval from the display area in the non-display area and is brought into contact with the edge of the inorganic film.

In another aspect of an embodiment of the present invention, there is provided a method for manufacturing a display device that may include providing pixels in a display area on a substrate, and providing a buffer layer in a non-display area, disposing a mask on the buffer layer, and providing an inorganic film for covering the display area, and removing the mask.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention.

DETAILED DESCRIPTION OF THE INVENTION

Figure 1:
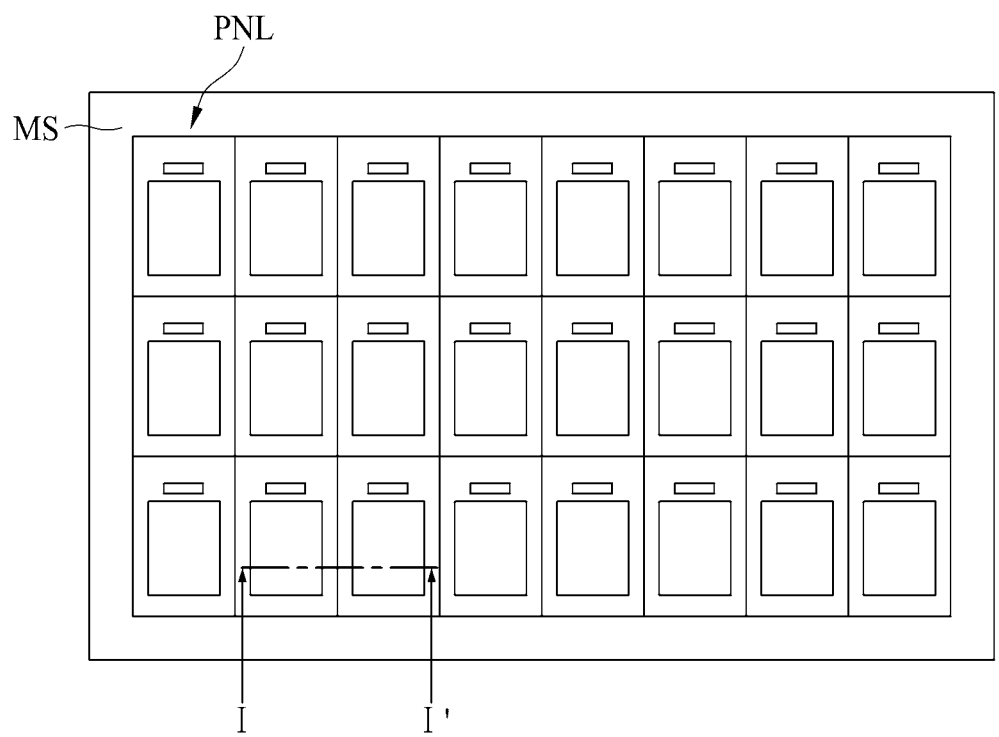
FIG. 1 illustrates a mother substrate on which a plurality of display panel are provided.
Figure 2:
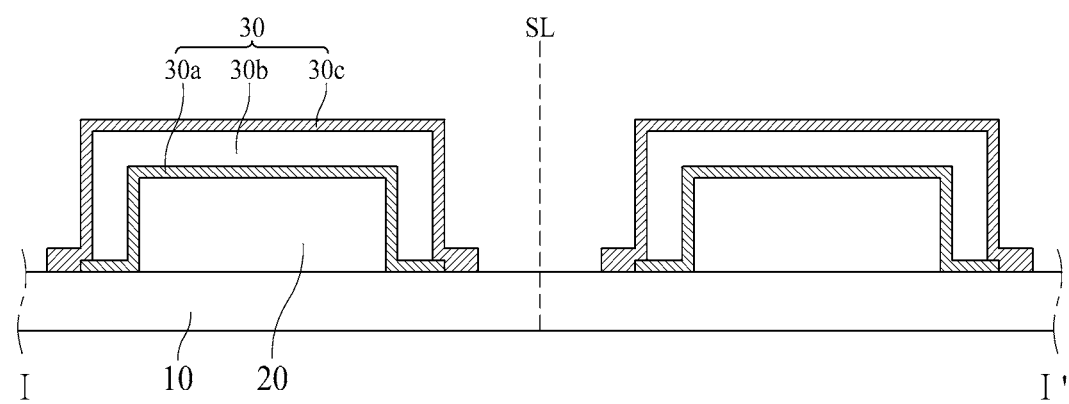
FIG. 2 is a cross sectional view along I-I' of FIG. 1, which shows a plurality of display devices according to the related art.
Figure 3:
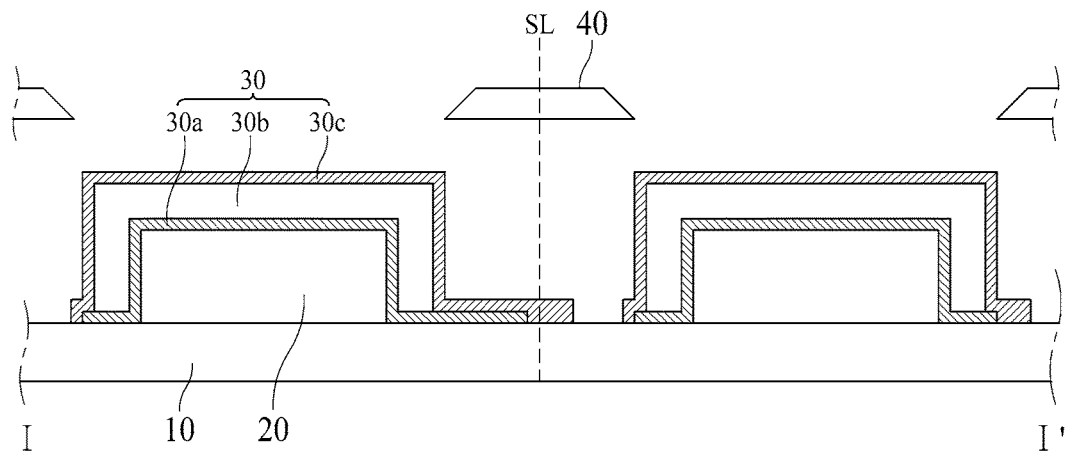
FIG. 3 is a cross sectional view for explaining a method of manufacturing an inorganic film in the related art display device.

Reference will now be made in detail to the exemplary embodiments of the present invention, examples of which are illustrated in the accompanying drawings. Wherever possible, the same reference numbers will be used throughout the drawings to refer to the same or like parts. Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In a case where "comprise", "have", and "include" described in the present specification are used, another part may be added unless "only" is used. The terms of a singular form may include plural forms unless referred to the contrary.

In construing an element, the element is construed as including an error region although there is no explicit description.

In describing a position relationship, for example, when the positional order is described as "on", "above", "below", and "next", a case which is not contact may be included unless "just" or "direct" is used.

In describing a time relationship, for example, when the temporal order is described as "after", "subsequent", "next", and "before", a case which is not continuous may be included unless "just" or "direct" is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Also, "X-axis direction", "Y-axis direction", and "Z-axis direction" are not limited to a perpendicular geometric configuration. That is, "X-axis direction", "Y-axis direction", and "Z-axis direction may include an applicable wide range of a functional configuration.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, a display device according to the embodiment of the present invention and a method for manufacturing the same will be described in detail with reference to the accompanying drawings.

Figure 4:
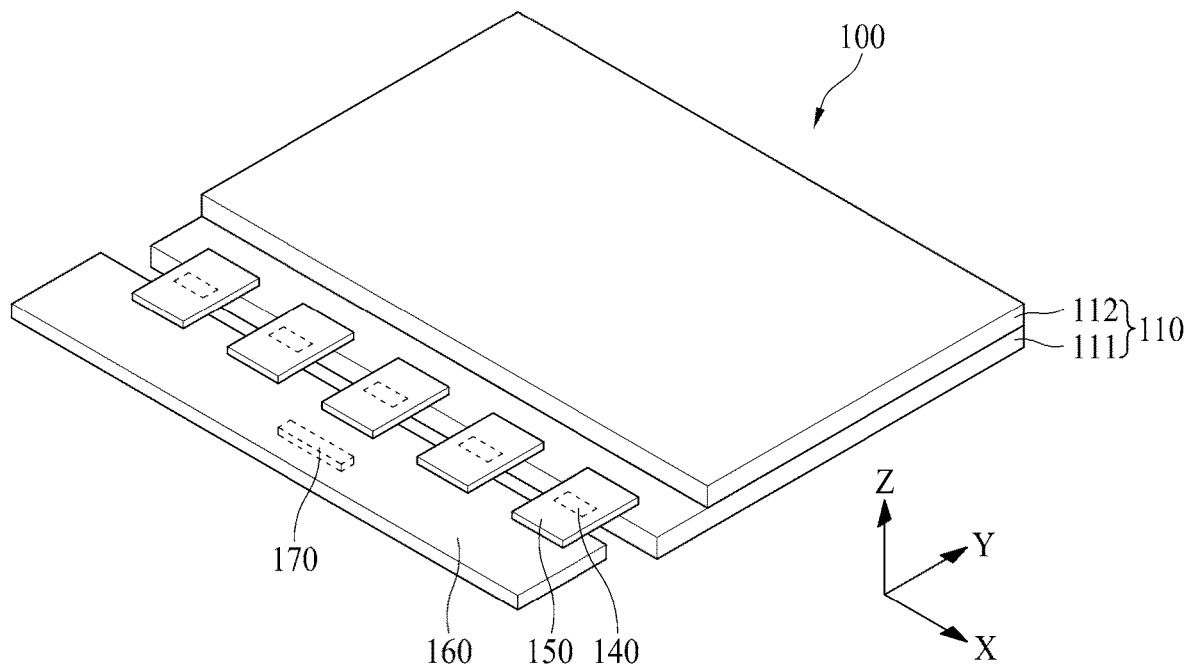
FIG. 4 is a perspective view illustrating a display device according to one embodiment of the present invention.
Figure 5:
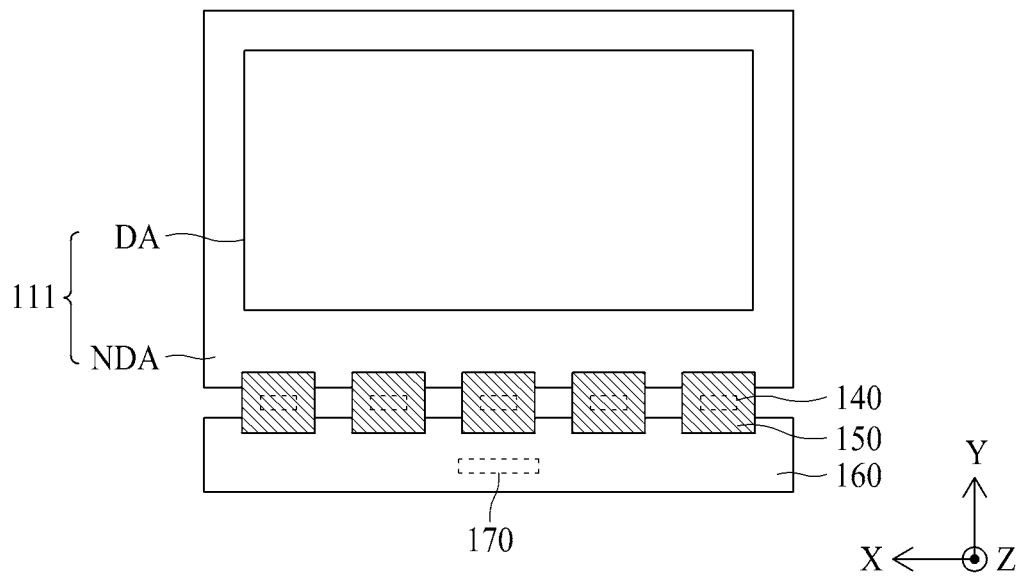
FIG. 5 is a plane view illustrating a first substrate, a source drive IC, a flexible film, a circuit board, and a timing controller of FIG. 4.

FIG. 4 is a perspective view illustrating a display device according to one embodiment of the present invention. FIG. 5 is a plane view illustrating a first substrate, a source drive IC, a flexible film, a circuit board, and a timing controller of FIG. 4. For the following description, it shows a display device according to one embodiment of the present invention corresponding to an organic light emitting display (OLED) device, but not limited to this type. That is, the display device according to one embodiment of the present invention may be any one among a liquid crystal display device, an electroluminescence display device, a quantum dot light emitting diode device, and an electrophoresis display device.

Referring to FIGS. 4 and 5, the display device 100 according to one embodiment of the present invention may include a display panel 110, a source drive integrated circuit (hereinafter, referred to as "source drive IC") 140, a flexible film 150, a circuit board 160, and a timing controller 170.

The display panel 110 may include a first substrate 111 and a second substrate 112. The second substrate 112 may be an encapsulation substrate. The first substrate 111 may be a plastic film or a glass substrate, but not limited to this type. The second substrate 112 may be a plastic film, a glass substrate, or an encapsulation film, but not limited to this type.

On one surface of the first substrate 111 confronting the second substrate 112, there are gate lines, data lines and pixels. The pixels are prepared in respective areas defined by crossing the gate lines and the data lines.

Each of the pixels may include a thin film transistor, and a light emitting device including a first electrode, a light emitting layer, and a second electrode. If a gate signal is supplied from the gate line to each pixel through the use of thin film transistor, a predetermined current is supplied to the light emitting device in accordance with a data voltage of the data line. Accordingly, the light emitting device for each of the pixels may emit light with a predetermined brightness in accordance with the predetermined current. A structure of each of the pixels will be described in detail with reference to FIGS. 6 and 7.

As shown in FIG. 5, the display panel 110 may include a display area (DA) provided with the pixels for displaying an image, and a non-display area (NDA) in which an image is not displayed. The gate lines, the data lines, and the pixels may be provided in the display area (DA), and a gate driver and pads may be provided in the non-display area (NDA).

The gate driver supplies gate signals to the gate lines in accordance with a gate control signal which is input from the timing controller 170. The gate driver may be provided in one side of the display area (DA) of the display panel 110, or the non-display area (NDA) of both peripheral sides of the display panel 110 by a gate driver in panel (GIP) method. In another way, the gate driver may be manufactured in a driving chip, may be mounted on the flexible film, and may be attached to one side of the display area (DA) of the display panel 110, or the non-display area (NDA) of both peripheral sides of the display panel 110 by a tape automated bonding (TAB) method.

The source drive IC 140 receives digital video data and source control signals from the timing controller 170. The source drive IC 140 converts the digital video data into analog data voltages in accordance with the source control signal, and supplies the analog data voltages to the data lines. If the source drive IC 140 is manufactured in a driving chip, the source drive IC 140 may be mounted on the flexible film 150 by a chip on film (COF) method or a chip on plastic (COP) method.

The pads such as data pads may be provided in the non-display area (NDA) of the display panel 110. In the flexible film 150, there are lines for connecting the pads with the source drive IC 140, and lines for connecting the pads with the lines of the circuit board 160. The flexible film 150 is attached to the pads by the use of anisotropic conducting film, whereby the pads may be connected with the lines of the flexible film 150.

The circuit board 160 may be attached to the flexible film 150. A plurality of circuits, which are realized in a plurality of driving chips, may be mounted on the circuit board 160. For example, the timing controller 170 may be mounted on the circuit board 160. The circuit board 160 may be a printed circuit board or a flexible printed circuit board.

The timing controller 170 receives digital video data and a timing signal from an external system board via a cable of the circuit board 160. The timing controller 170 generates the gate control signal for controlling an operation timing of the gate driver and the source control signal for controlling the source drive IC 140 on the basis of the timing signal. The timing controller 170 supplies the gate control signal to the gate driver, and supplies the source control signal to the source drive IC 140.

First Embodiment

Figure 6:
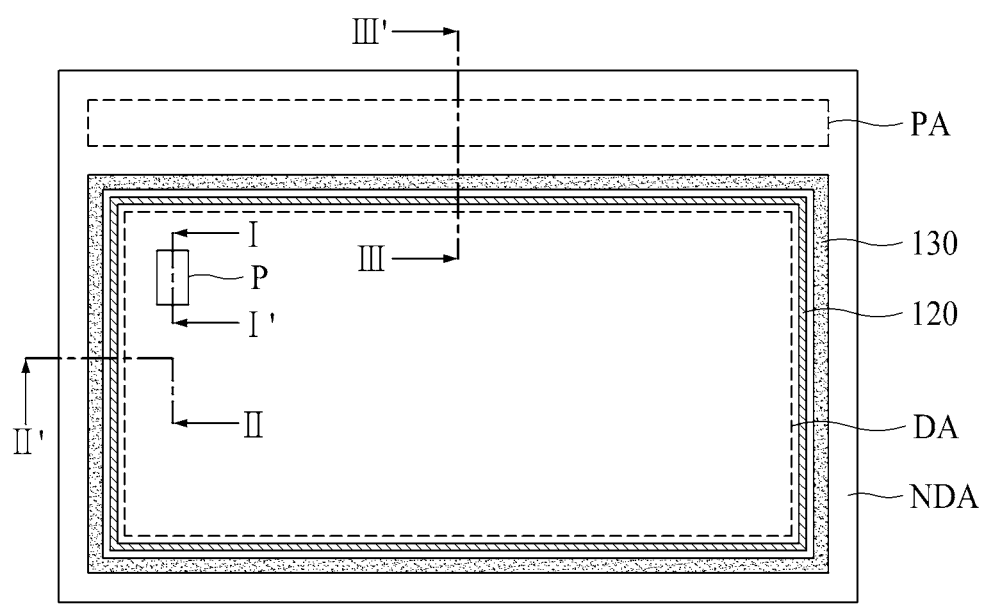
FIG. 6 is a plane view illustrating a first substrate according to the first embodiment of the present invention.

FIG. 6 is a plane view illustrating a first substrate according to the first embodiment of the present invention.

Referring to FIG. 6, the first substrate 111 is divided into a display area (DA) and a non-display area (NDA). In the non-display area (NDA), there are a pad area (PA) for pads, a dam 120, and a buffer layer 130.

In the display area (DA), there are pixels (P) for displaying an image. Each of the pixels may include a thin film transistor, and a light emitting device including a first electrode, a light emitting layer, and a second electrode. If a gate signal is supplied from the gate line to each pixel through the use of thin film transistor, a predetermined current is supplied to the light emitting device in accordance with a data voltage of the data line. Accordingly, the light emitting device for each of the pixels may emit light with a predetermined brightness in accordance with the predetermined current.

Hereinafter, a structure of each of the pixels (P) in the display area (DA) according to the embodiment of the present invention will be described in detail with reference to FIG. 7.

Figure 7:
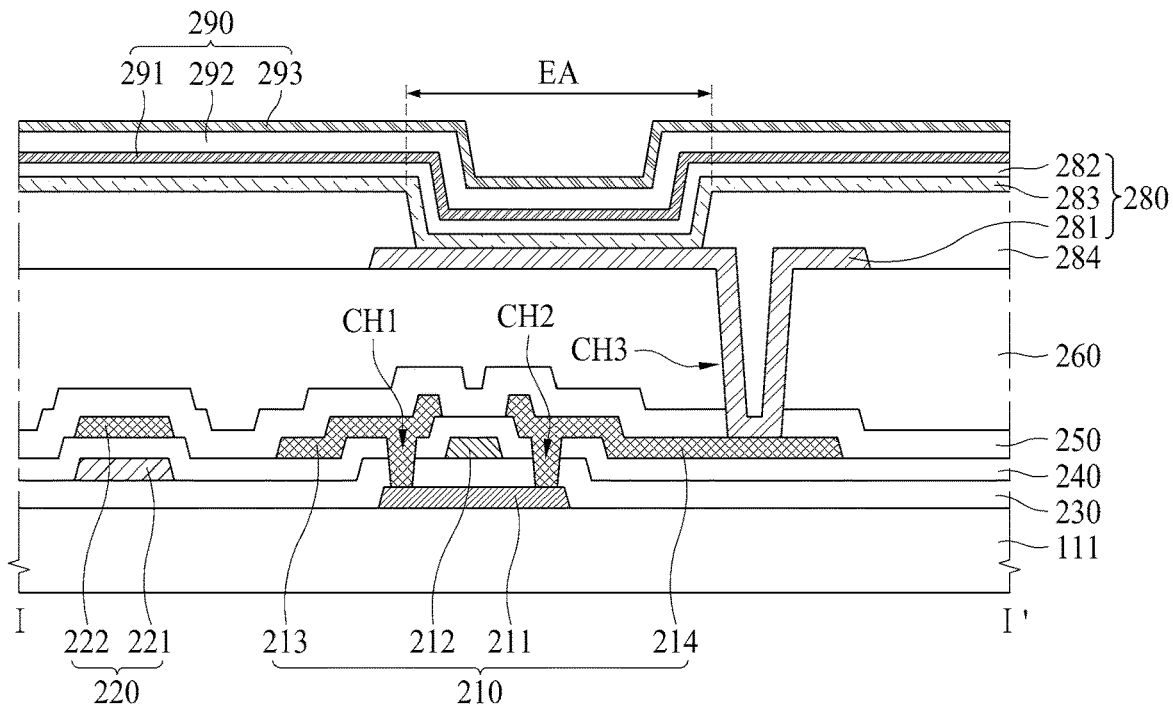
FIG. 7 is a cross sectional view along I-I' of FIG. 6.

FIG. 7 is a cross sectional view illustrating one example of the pixel in the display area of FIG. 6.

Referring to FIG. 7, thin film transistors 210 and capacitors 220 are formed on one surface of the first substrate 111 confronting the second substrate 112.

A buffer layer is provided on the first substrate 111 so as to protect the thin film transistors 210 from moisture permeating through the first substrate 111 which is vulnerable to moisture permeability.

Each of the thin film transistors 210 includes an active layer 211, a gate electrode 212, a source electrode 213, and a drain electrode 214. In FIG. 7, the thin film transistor 210 is provided in a top gate type where the gate electrode 212 is positioned above the active layer 211, but not limited to this type. For example, the thin film transistor 210 may be provided in a bottom gate type where the gate electrode 212 is positioned below the active layer 211, or a double gate type where the gate electrode 212 is positioned both above and below the active layer 211.

The active layer 211 is provided on the buffer layer. The active layer 211 may be formed a silicon-based semiconductor material or an oxide-based semiconductor material. A light shielding layer may be provided on the first substrate 111 so as to block external light being incident on the active layer 211.

A gate insulating film 230 may be provided on the active layer 211. The gate insulating film 220 may be formed in a single-layered structure of the inorganic insulating material such as silicon oxide (SiOx) or silicon nitride (SiNx), or a multi-layered structure of the above silicon oxide (SiOx) and silicon nitride (SiNx).

The gate electrode 212 may be provided on the gate insulating film 230. The gate electrode 212 may be formed in a single-layered structure or multi-layered structure among molybdenum (Mo), aluminum (Al), chrome (Cr), aurum (Au), titanium (Ti), nickel (Ni), neodymium (Nd), copper (Cu) and their alloys, but not limited to these materials.

An insulating interlayer 240 may be provided on the gate electrode 212. The insulating interlayer 240 may be formed in a single-layered structure of the inorganic insulating material such as silicon oxide (SiOx) or silicon nitride (SiNx), or a multi-layered structure of the above silicon oxide (SiOx), silicon nitride (SiNx) and their alloys.

The source electrode 213 and the drain electrode 214 may be provided on the insulating interlayer 240. Each of the source electrode 213 and the drain electrode 214 may be connected with the active layer 211 via contact holes (CH1, CH2) penetrating through the gate insulating film 230 and the insulating interlayer 240. Each of the source electrode 213 and the drain electrode 214 may be formed in a single-layered structure or multi-layered structure among molybdenum (Mo), aluminum (Al), chrome (Cr), aurum (Au), titanium (Ti), nickel (Ni), neodymium (Nd), copper (Cu) and their alloys, but not limited to these materials.

Each of the capacitors 220 may include a lower electrode 221 and an upper electrode 222. The lower electrode 221 is provided on the gate insulating film 230, and the lower electrode 221 is formed of the same material as that of the gate electrode 212. The upper electrode 222 is provided on the insulating interlayer 240, and the upper electrode 222 is formed of the same material as those of the source electrode 213 and the drain electrode 214.

A protection film 250 may be provided on the thin film transistor 210 and the capacitor 220. The protection film 250 may serve as an insulating film. The protection film 250 may be formed in a single-layered structure of the inorganic material such as silicon oxide (SiOx) or silicon nitride (SiNx), or a multi-layered structure of the above silicon oxide (SiOx) and silicon nitride (SiNx).

A planarization film 260 may be provided on the protection film 240 so as to planarize a step difference area caused by the thin film transistor 210 and the capacitor 220. The planarization film 260 may be formed of an organic film of an organic material, for example, acryl resin, epoxy resin, phenolic resin, polyamide resin, polyimide resin, and etc.

A light emitting device 280 and a bank 284 are provided on the planarization film 260. The light emitting device 280 may include a first electrode 282, a light emitting layer 283, and a second electrode 281. The first electrode 282 may serve as a cathode electrode, and the second electrode 281 may serve as an anode electrode. A deposition area of the first electrode 282, the light emitting layer 283, and the second electrode 281 may be defined as a light-emission area (EA).

The second electrode 281 may be provided on the planarization film 260. The second electrode 281 may be connected with the drain electrode 214 of the thin film transistor 210 via a contact hole (CH3) penetrating through the protection film 250 and the planarization film 260. The second electrode 281 may be formed of a metal material with high reflectance, and more particularly, a deposition structure of aluminum and titanium (Ti/Al/Ti), a deposition structure of aluminum and Indium Tin Oxide (ITO/AL/ITO), an APC alloy, and a deposition structure of APC alloy and Indium Tin Oxide (ITO/APC/ITO). Herein, the APC alloy is an alloy of argentums (Ag), palladium (Pd), and copper (Cu).

The bank 284 is provided to cover the edge of the second electrode 281 on the planarization film 260, to thereby divide the light-emission area (EA). The bank 284 may be formed of an organic film of an organic material, for example, acryl resin, epoxy resin, phenolic resin, polyamide resin, polyimide resin, and etc.

The light emitting layer 283 is provided on the second electrode 281 and the bank 284. The light emitting layer 283 may include a hole transporting layer, at least one light emitting layer, and an electron transporting layer. In this case, if a voltage is applied to the second electrode 281 and the first electrode 282, hole and electron are respectively moved to the light emitting layer via the hole transporting layer and the electron transporting layer, and are then combined to each other in the light emitting layer, to thereby emit light.

The light emitting layer 283 may be a white light emitting layer for emitting white light. In this case, the light emitting layer 283 may cover the second electrode 281 and the bank 284. A color filter (not shown) may be provided on the second substrate 112.

The light emitting layer 283 may be formed of a red light emitting layer for emitting red light, a green light emitting layer for emitting green light, or a blue light emitting layer for emitting blue light. The light emitting layer 283 may be provided in the area corresponding to the second electrode 281. In this case, it is possible not to provide a color filter on the second substrate 112.

The first electrode 282 is provided on the light emitting layer 283. If the OLED device is formed in a top emission type, the first electrode 282 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). A capping layer may be provided on the first electrode 282.

An encapsulation film 290 is provided on the light emitting device 280. The encapsulation film 290 prevents moisture or oxygen from being permeated into the first electrode 282. To this end, the encapsulation film 290 may include at least one inorganic film and at least one organic film.

For example, the encapsulation film 290 may include a first inorganic film 291, an organic film 292, and a second inorganic film 293. In this case, the first inorganic film 291 covers the first electrode 282, and the organic film 292 is provided on the first inorganic film 291. The organic film 292 may be formed at a thickness enough to prevent particles from getting into the light emitting layer 283 and the first electrode 282 through the first inorganic film 291, preferably. The second inorganic film 293 covers the organic film 292.

Then, first to third color filters (not shown) and a black matrix (not shown) may be provided on the encapsulation film 290, wherein a red color filter 323 is provided in a red light-emission area, a blue color filter 322 is provided in a blue light-emission area, and a green color filter 321 is provided in a green light-emission area.

The encapsulation film 290 of the first substrate 111 is attached to the color filters (not shown) of the second substrate 112 by the use of adhesive layer 330, to thereby bond the first and second substrates 111 and 112 to each other. The adhesive layer 330 may be transparent adhesive resin.

Referring once again to FIG. 6, the pad area (PA) may be provided at one side of the first substrate 111. The pad area (PA) includes the plurality of pads, and the plurality of pads are electrically connected with the lines of the flexible film 150 by the use of anisotropic conducting film.

The dam 120 surrounds the display area (DA), to thereby prevent the organic film 292 from overflowing. Also, the dam 120 is disposed between the display area (DA) and the pad area (PA), to thereby prevent the organic film 292 from overflowing and being positioned in the pad area (PA).

The buffer layer 130 is positioned in the non-display area (NDA) and is provided at a predetermined interval from the display area (DA). The buffer layer 130 is in contact with the first inorganic film 291 or second inorganic film 293 included in the encapsulation film 290 of the pixel (P).

Hereinafter, the dam and the buffer layer according to the first embodiment of the present invention will be described in detail with reference to FIGS. 8 to 10.

Figure 8:
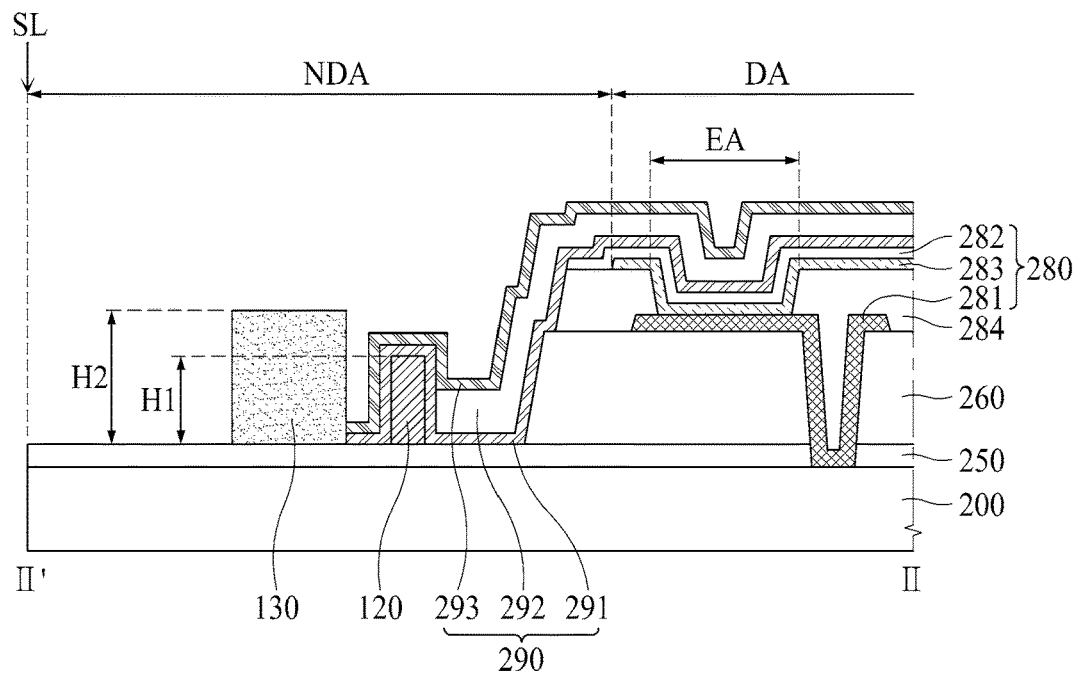
FIG. 8 is a cross sectional view along II-II' of FIG. 6.

FIG. 8 is a cross sectional view along II-II' of FIG. 6. FIG. 9 is a cross sectional view along III-III' of FIG. 6. FIG. 10 is a cross sectional view illustrating a mask arranged on a buffer layer of FIG. 8.

Figure 9:
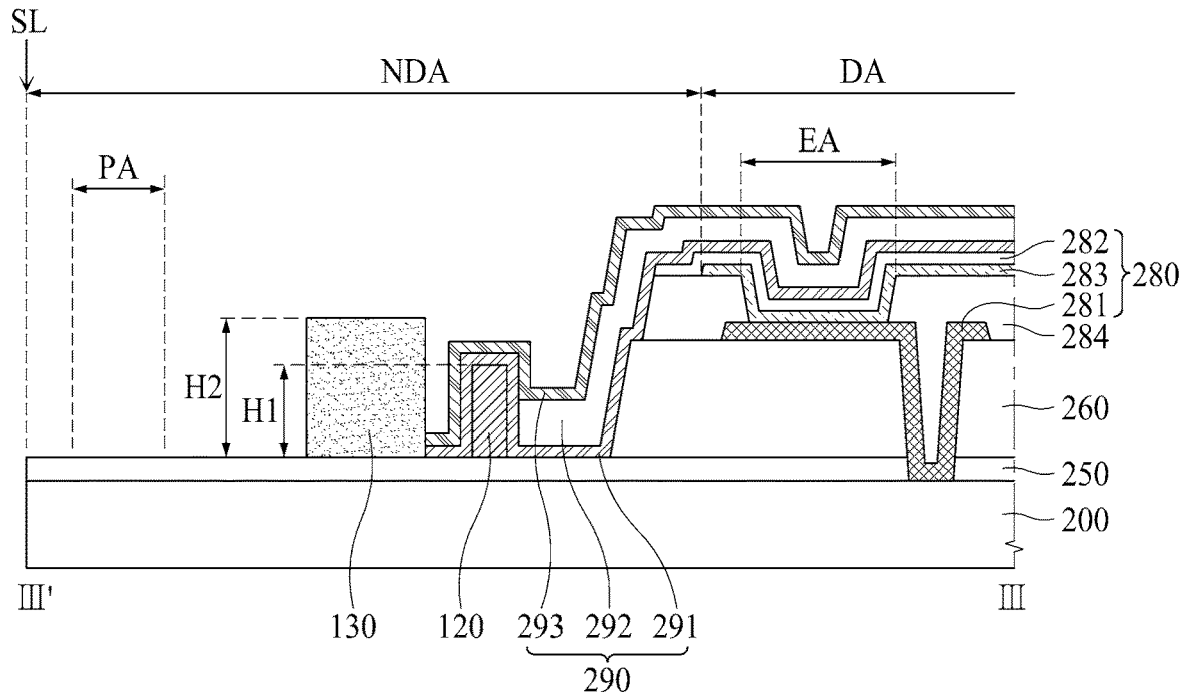
FIG. 9 is a cross sectional view along III-III' of FIG. 6.
Figure 10:
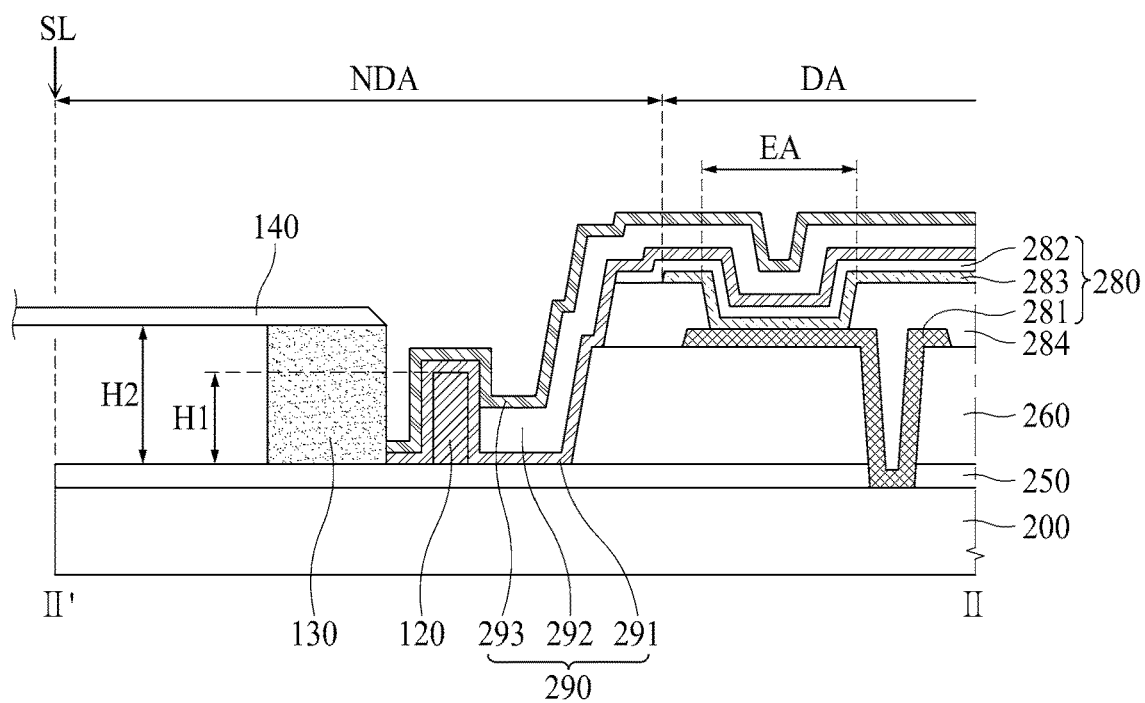
FIG. 10 is a cross sectional view illustrating a mask arranged on a buffer layer of FIG. 8.

FIGS. 8 to 10 illustrate a thin film transistor (TFT) substrate 200, wherein a detailed structure of the thin film transistors 210 and the capacitors 220 is not shown in the TFT substrate 200, for convenience of explanation. The TFT substrate 200 may include the first substrate 111, the gate insulating film 230 and the insulating interlayer 240, as shown in the FIG. 7.

The display device shown in FIG. 8 includes the encapsulation film 290, the dam 120, and the buffer layer 130 provided on the first substrate 111. In this case, the first substrate 111 includes the display area (DA) provided with the pixels (P), and the non-display area (NDA) provided with the plurality of pads.

The encapsulation film 290 covers the light emitting device 280 provided in the display area (DA), to thereby prevent oxygen or moisture from being permeated into the light emitting device 280. In this case, the encapsulation film 290 may include at least one inorganic film and at least one organic film. For example, the encapsulation film 290 may include the first inorganic film 291, the organic film 292, and the second inorganic film 293. In this case, the first inorganic film 291 covers the first electrode 282, the organic film 292 is provided on the first inorganic film 291, and the second inorganic film 293 covers the organic film 292.

Each of the first and second inorganic films 291 and 293 may be formed of silicon nitride, aluminum nitride, zirconium nitride, titanium nitride, hafnium nitride, tantalum nitride, silicon oxide, aluminum oxide, or titanium oxide. The first and second inorganic films 291 and 293 may be deposited by a chemical vapor deposition (CVD) method or an atomic layer deposition (ALD) method, but not limited to this method.

The organic film 292 may be formed of a transparent material capable of transmitting the light emitted from the light emitting layer 283. The organic film 292 may be formed of an organic material capable of transmitting at least 99% of the light emitted from the light emitting layer 283, for example, acryl resin, epoxy resin, phenolic resin, polyamide resin, polyimide resin, and etc. The organic film 292 may be formed of a process using an organic material, for example, a vapor deposition method, a printing method, or a slit coating method, but not limited to these methods. The organic film 292 may be formed by an ink-jet process.

The dam 120 is provided to surround the periphery of the display area (DA), to thereby prevent the organic film 292 for the encapsulation film 290 from overflowing. The organic film 292 for the encapsulation film 290 has good covering properties and poor barrier properties, whereby the organic film 292 is necessarily encapsulated by the second inorganic film 293. However, if the organic film 292 flows out of a desired area, the organic film 292 is not encapsulated by the second inorganic film 293, whereby oxygen or moisture permeates through the exposed organic film 292. In order to overcome this problem, the dam 120 is provided to prevent the organic film 292 from overflowing, to thereby prevent the organic film 292 from being exposed to the outside of the display device.

Also, the dam 120 is disposed between the display area (DA) and the pad area (PA) so that it is possible to prevent the organic film 292 for the encapsulation film 290 from overflowing, and more particularly, to prevent the organic film 292 from flowing into the pad area (PA). If the organic film 292 for the encapsulation film 290 flows into the pad area (PA), it is difficult to make a proper electrical contact in the pad due to the organic film 292 flowing into the pad area (PA), whereby a driving defect or lighting inspection defect might occur. In order to overcome this problem, the dam 120 is provided to prevent the organic film 292 for the encapsulation film 290 from overflowing, to thereby prevent the organic film 292 from flowing into the pad area (PA).

FIGS. 8 to 10 illustrate one dam 120, but not limited to this structure. According to another example, the dam 120 may include a first dam, and a second dam disposed in the non-display area and provided at a predetermined interval from the first dam. The second dam prevents the organic film 292 from flowing out of the first dam.

The dam 120 may be manufactured together with at least any one of the planarization film 260 of the pixel (P) and the bank 284, and may be formed of the same material as that of at least any one of the planarization film 260 and the bank 284. In this case, the dam 120 may be formed of an organic material, for example, acryl resin, epoxy resin, phenolic resin, polyamide resin, polyimide resin, and etc.

The buffer layer 130 is positioned in the non-display area (NDA) and is provided at a predetermined interval from the display area (DA). The buffer layer is in contact with at least one of the first inorganic film 291 and the second inorganic film 293. In more detail, the buffer layer 130 is disposed between the scribing line (SL) and the dam 120 in the non-display area (NDA), to thereby support the mask 140 so as to maintain a predetermined distance between the mask 140 and the TFT substrate 200 for a process of depositing the first inorganic film 291 or the second inorganic film 293. To this end, the mask 140 is disposed on the buffer layer 130 while being in contact with the buffer layer 130.

If the first inorganic film 291 or the second inorganic film 293 is deposited after disposing the mask 140 on the buffer layer 130, the first inorganic film 291 or the second inorganic film 293 is formed in the remaining area except the area with the mask 140. In this case, there is no space between the mask 140 and the TFT substrate 200 by the use of buffer layer 130 so that it is possible to prevent the first inorganic film 291 or the second inorganic film 293 from being permeated into the area with the mask 140. Eventually, the buffer layer 130 is disposed between the dam 120 and the scribing line (SL), and the mask 140 is disposed on the buffer layer 130 while being in contact with the buffer layer 130, whereby it is possible to prevent the first inorganic film 291 or the second inorganic film 293 from being formed in the periphery of the buffer layer 130, and more particularly, in the scribing line (SL).

Meanwhile, as shown in FIG. 9, the buffer layer 130 is provided between the dam 120 and the pad area (PA) so that it is possible to prevent the first inorganic film 291 or the second inorganic film 293 from being formed in the pad area (PA). Accordingly, it is possible to prevent the driving defect or lighting inspection defect caused by the defect of the electrical contact in the pad by the first inorganic film 291 or the second inorganic film 293.

As described above, the buffer layer 130 is in contact with the edge of at least one of the first inorganic film 291 and the second inorganic film 293. FIG. 8 shows that the buffer layer 130 is in contact with the edge of the first inorganic film 291 and the edge of the second inorganic film 293, but not limited to this structure.

According to another example, the buffer layer 130 may be in contact with the edge of the second inorganic film 293. In more detail, the first inorganic film 291 and the second inorganic film 293 may be deposited by the different deposition masks. The first inorganic film 291 may be deposited by the use of first mask, and the second inorganic film 293 may be deposited by the use of second mask. In this case, the first mask is relatively larger than the second mask, and is disposed close to the light emitting device 280, whereby the first inorganic film 291 is relatively smaller than the second inorganic film 293. Accordingly, an area of the first inorganic film 291 is relatively smaller than an area of the second inorganic film 293. The second inorganic film 293 perfectly covers the first inorganic film 291, and the organic film 292 provided on the first inorganic film 291.

According to another example, the buffer layer 130 may be in contact with the edge of the first inorganic film 291. In more detail, the first inorganic film 291 and the second inorganic film 293 may be deposited by the different deposition methods. Since the first inorganic film 291 is provided on the light emitting device 280 which is not flat, the first inorganic film 291 is deposited by the use of ALD method having high step coverage. Under the condition that the mask 140 is disposed on the buffer layer 130 while being in contact with the buffer layer 130, the first inorganic film 291 may be deposited by the ALD method. Accordingly, the buffer layer 130 may be in contact with the first inorganic film 291. Meanwhile, since the second inorganic film 293 is provided on the organic film 292 which is relatively flat, the second inorganic film 293 may be deposited by the CVD method. Under the condition that the mask 140 is disposed above the buffer layer 130 while being spaced from the buffer layer 130, the second inorganic film 293 may be deposited by the CVD method. Accordingly, the second inorganic film 293 perfectly covers the first inorganic film 291 and the organic film 292.

Meanwhile, a height (H2) of the buffer layer 130 may be the same as or larger than a height (H1) of the dam 120. If the height (H2) of the buffer layer 130 is smaller than the height (H1) of the dam 120, the dam 120 may be damaged by the mask 140 in a step of disposing the mask 140 on the buffer layer 130 for a process of depositing the first inorganic film 291 or the second inorganic film 293. If the organic film 292 is brought into contact with the damaged dam 120, oxygen or moisture permeating through the damaged dam 120 may be absorbed in the organic film 292, and then permeated into the light emitting device 280, to thereby deteriorate the light emitting device 280.

Preferably, as shown in FIG. 8, the height (H2) of the buffer layer 130 is larger than the height (H1) of the dam 120 so that it is possible to prevent the dam 120 from being damaged in the step of disposing the mask 140 on the buffer layer 130, but not limited to this structure. If it is possible to realize a precise control of the mask 140, a possibility of the dam 120 damaged by the mask 140 is largely lowered. Thus, it lowers a necessity to provide the buffer layer 130 whose height (H2) is larger than the height (H1) of the dam 120.

The buffer layer 130 may be manufactured together with at least any one of the planarization film 260 of the pixel (P) and the bank 284, and may be formed of the same material as that of at least any one of the planarization film 260 and the bank 284. In this case, the buffer layer 130 may be formed of an organic material, for example, acryl resin, epoxy resin, phenolic resin, polyamide resin, polyimide resin, and etc.

Second Embodiment

Figure 11:
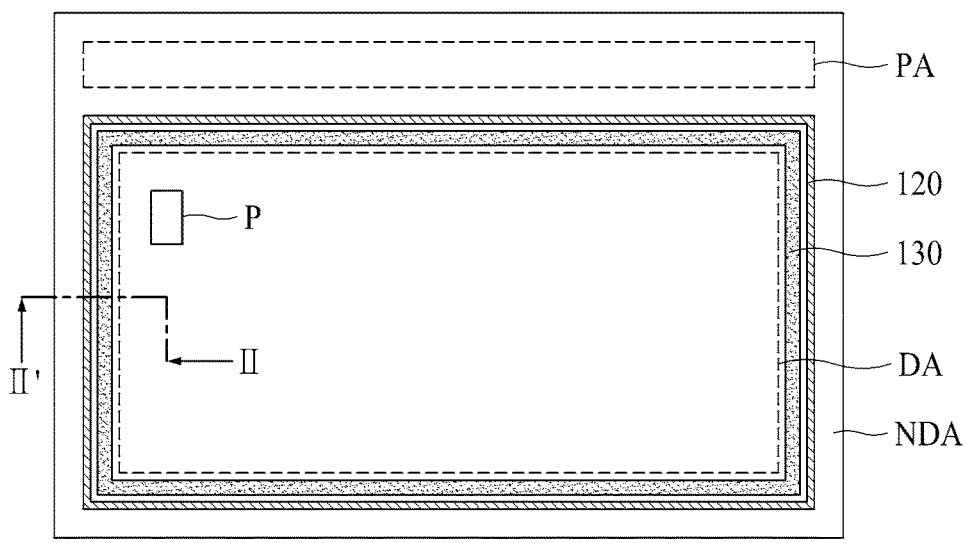
FIG. 11 is a plane view illustrating a first substrate according to the second embodiment of the present invention.
Figure 12:
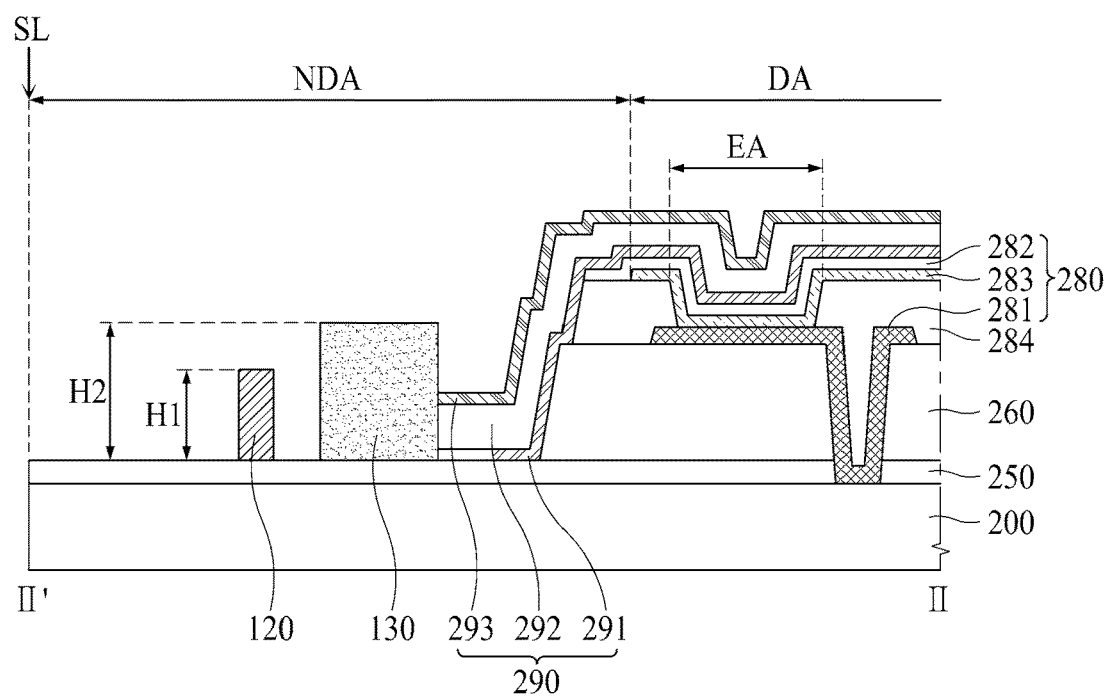
FIG. 12 is a cross sectional view along II-II' of FIG. 11.

FIG. 11 is a plane view illustrating a first substrate according to the second embodiment of the present invention. FIG. 12 is a cross sectional view along II-II' of FIG. 11.

FIGS. 11 to 12 illustrate a thin film transistor (TFT) substrate 200, wherein a detailed structure of thin film transistors 210 and capacitors 220 is not shown in the TFT substrate 200, for convenience of explanation. The TFT substrate 200 may include the first substrate 111, the gate insulating film 230 and the insulating interlayer 240, as shown in the FIG. 7.

Referring to FIG. 11, a first substrate 111 is divided into a display area (DA) and a non-display area (NDA). In the non-display area (NDA), there are a pad area (PA) for pads, a dam 120, and a buffer layer 130. In terms of the buffer layer 130 disposed between the dam 120 and the display area (DA), the first substrate 111 shown in FIGS. 11 and 12 is different from the first substrate shown in FIGS. 6 to 10. Hereinafter, a detailed description for the same parts as those shown in FIGS. 6 to 10 will be omitted.

The dam 120 is provided to surround the periphery of the buffer layer 130 in the non-display area (NDA), to thereby prevent an organic film 292 from flowing out of the periphery of the buffer layer 130. Also, the dam 120 is disposed between the buffer layer 130 and the pad area (PA) so that it is possible to prevent the organic film 292 from flowing into the pad area (PA).

FIGS. 11 and 12 show one dam 120, but not limited to this structure. According to another example, the dam 120 may include a first dam, and a second dam disposed in the non-display area and provided at a predetermined interval from the first dam. The second dam prevents the organic film 292 from flowing out of the periphery of the first dam.

The buffer layer 130 is positioned in the non-display area (NDA). The buffer layer is in contact with at least one of a first inorganic film 291 and a second inorganic film 293. In more detail, the buffer layer 130 is disposed between the display area (DA) and the dam 120 in the non-display area (NDA), to thereby support a mask 140 so as to maintain a predetermined distance between the mask 140 and the TFT substrate 200 for a process of depositing the first inorganic film 291 or the second inorganic film 293. To this end, the mask 140 is disposed on the buffer layer 130 while being in contact with the buffer layer 130.

If the first inorganic film 291 or the second inorganic film 293 is deposited after disposing the mask 140 on the buffer layer 130, the first inorganic film 291 or the second inorganic film 293 is formed in the remaining area except the area with the mask 140. In this case, there is no space between the mask 140 and the TFT substrate 200 by the use of buffer layer 130 so that it is possible to prevent the first inorganic film 291 or the second inorganic film 293 from being permeated into the area with the mask 140. Eventually, the buffer layer 130 is disposed between the dam 120 and the display area (DA), and the mask 140 is disposed on the buffer layer 130 while being in contact with the buffer layer 130, whereby it is possible to prevent the first inorganic film 291 or the second inorganic film 293 from being formed in the periphery of the buffer layer 130, and more particularly, in a scribing line (SL).

As described above, the buffer layer 130 is in contact with the edge of at least one of the first inorganic film 291 and the second inorganic film 293. FIG. 12 shows that the buffer layer 130 is in contact with the edge of the first inorganic film 291 and the edge of the second inorganic film 293, but not limited to this structure.

According to another example, the buffer layer 130 may be in contact with the edge of the first inorganic film 291. In more detail, the first inorganic film 291 and the second inorganic film 293 may be deposited by the different deposition masks and the different deposition methods. First, since the first inorganic film 291 is provided on a light emitting device 280 which is not flat, the first inorganic film 291 is deposited by the use of ALD method having high step coverage. Under the condition that the first mask is disposed on the buffer layer 130 while being in contact with the buffer layer 130, the first inorganic film 291 may be deposited by the ALD method. Accordingly, the buffer layer 130 may be in contact with the first inorganic film 291. Meanwhile, since the second inorganic film 293 is provided on the organic film 292 which is relatively flat, the second inorganic film 293 may be deposited by the CVD method. Under the condition that the second mask is disposed on the TFT substrate 200 while being not overlapped with the buffer layer 130 and the dam 120, the second inorganic film 293 may be deposited by the CVD method. In comparison to the first mask, the second mask has a relatively-small masking (or forming) area, and a relatively-large open area so as to provide the second inorganic film 293 which is larger than the first inorganic film 291. Accordingly, the second inorganic film 293 perfectly covers the first inorganic film 291, and the organic film 292 provided on the first inorganic film 291.

Meanwhile, a height (H2) of the buffer layer 130 may be larger than a height (H1) of the dam 120. If the height (H2) of the buffer layer 130 is the same as or smaller than the height (H1) of the dam 120, the dam 120 may be damaged by the mask 140 in a step of disposing the mask 140 on the buffer layer 130 for a process of depositing the first inorganic film 291 or the second inorganic film 293. If the organic film 292 is brought into contact with the damaged dam 120, oxygen or moisture permeating through the damaged dam 120 may be absorbed in the organic film 292, and then permeated into the light emitting device 280, to thereby deteriorate the light emitting device 280.

According to the embodiment of the present invention, the height (H2) of the buffer layer 130 is larger than the height (H1) of the dam 120 so that it is possible to prevent the dam 120 from being damaged in the step of disposing the mask 140 on the buffer layer 130 for the process of depositing the first inorganic film 291 or the second inorganic film 293, but not limited to this structure.

Also, the buffer layer 130 is not overlapped with a first electrode 282. If the buffer layer 130 is overlapped with the first electrode 282, the first electrode 282 may be damaged by the movement of the mask 140 when the mask 140 is disposed on the buffer layer 130 for the process of depositing the first inorganic film 291 or the second inorganic film 293. If the first electrode 282 is damaged, it is difficult to properly drive the pixel (P), whereby dark points might occur.

According to the embodiment of the present invention, the buffer layer 130 is not overlapped with the first electrode 282 so that it is possible to prevent (or reduce) the first electrode 282 from being damaged when the mask 140 is disposed on the buffer layer 130 for the process of depositing the first inorganic film 291 or the second inorganic film 293.

Third Embodiment

Figure 13:
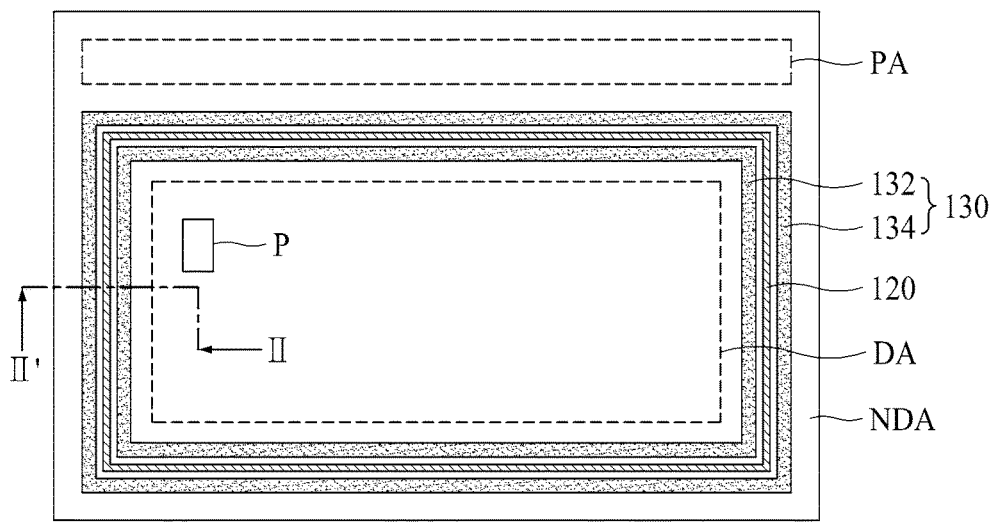
FIG. 13 is a plane view illustrating a first substrate according to the third embodiment of the present invention.
Figure 14:
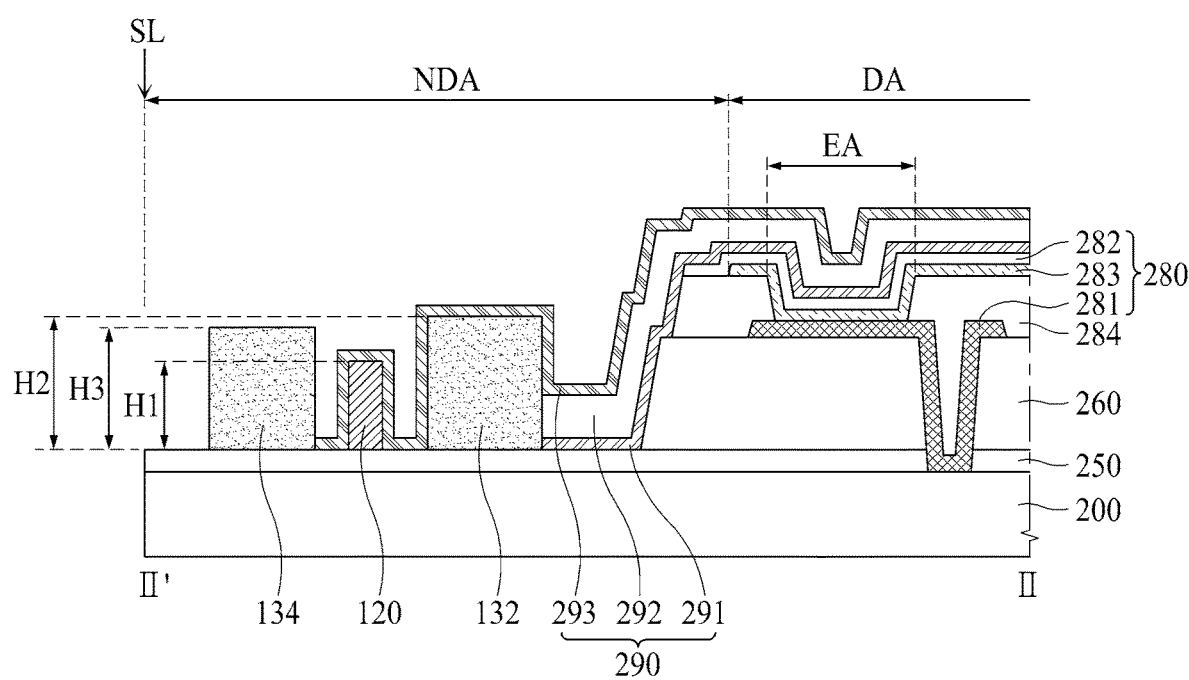
FIG. 14 is a cross sectional view along II-II' of FIG. 13.

FIG. 13 is a plane view illustrating a first substrate according to the third embodiment of the present invention. FIG. 14 is a cross sectional view along II-II' of FIG. 13.

FIGS. 13 to 14 illustrate a thin film transistor (TFT) substrate 200, wherein a detailed structure of thin film transistors 210 and capacitors 220 is not shown in the TFT substrate 200, for convenience of explanation. The TFT substrate 200 may include the first substrate 111, the gate insulating film 230 and the insulating interlayer 240, as shown in the FIG. 7.

Referring to FIGS. 13 and 14, a first substrate 111 is divided into a display area (DA) and a non-display area (NDA). In the non-display area (NDA), there are a pad area (PA) for pads, a dam 120, a first buffer layer 132, and a second buffer layer 134. In terms of a buffer layer 130 including the first and second buffer layers 132 and 134, the first substrate 111 shown in FIGS. 13 and 14 is different from the first substrate shown in FIGS. 6 to 10. Hereinafter, a detailed description for the same parts as those shown in FIGS. 6 to 10 will be omitted.

The dam 120 is provided to surround the periphery of the first buffer layer 132 in the non-display area (NDA), to thereby prevent an organic film 292 from flowing out of the periphery of the first buffer layer 132. Also, the dam 120 is disposed between the first buffer layer 132 and the pad area (PA) so that it is possible to prevent the organic film 292 from flowing into the pad area (PA).

FIGS. 13 and 14 show one dam 120, but not limited to this structure. According to another example, the dam 120 may include a first dam, and a second dam disposed in the non-display area and provided at a predetermined interval from the first dam. The second dam prevents the organic film 292 from flowing out of the periphery of the first dam.

The first buffer layer 132 is positioned in the non-display area (NDA), and the first buffer layer 132 is in contact with the edge of a first inorganic film 291. In more detail, the first buffer layer 132 is provided between the dam 120 and the display area (DA) in the non-display area (NDA), to thereby support a first mask so as to maintain a predetermined distance between the first mask and the TFT substrate 200 for a process of depositing the first inorganic film 291. To this end, the first mask is disposed on the first buffer layer 132 while being in contact with the first buffer layer 132.

If the first inorganic film 291 is deposited after disposing the first mask on the first buffer layer 132, the first inorganic film 291 is formed in the remaining area except the area with the first mask. In this case, there is no space between the first mask and the TFT substrate 200 by the use of first buffer layer 132 so that it is possible to prevent the first inorganic film 291 from being permeated into the area with the first mask. Eventually, the first buffer layer 132 is disposed between the dam 120 and the display area (DA), and the first mask is disposed on the first buffer layer 132 while being in contact with the first buffer layer 132, whereby it is possible to prevent the first inorganic film 291 from being formed in the periphery of the first buffer layer 132, and more particularly, in a scribing line (SL).

Also, the first buffer layer 132 is not overlapped with a first electrode 282. If the first buffer layer 132 is overlapped with the first electrode 282, the first electrode 282 may be damaged by the movement of the first mask when the first mask is disposed on the first buffer layer 132 for the process of depositing the first inorganic film 291. If the first electrode 282 is damaged, it is difficult to properly drive the pixel, whereby dark points might occur.

According to the embodiment of the present invention, the first buffer layer 132 is not overlapped with the first electrode 282 so that it is possible to prevent (or reduce) the first electrode 282 from being damaged when the first mask is disposed on the first buffer layer 132 for the process of depositing the first inorganic film 291.

The second buffer layer 134 is positioned in the non-display area (NDA), and the second buffer layer 134 is in contact with the edge of a second inorganic film 293. In more detail, the second buffer layer 134 is provided between the dam 120 and the scribing line (SL) in the non-display area (NDA), to thereby support a second mask so as to maintain a predetermined distance between the second mask and the TFT substrate 200 for a process of depositing the second inorganic film 293. To this end, the second mask is disposed on the second buffer layer 134 while being in contact with the second buffer layer 134.

If the second inorganic film 293 is deposited after disposing the second mask on the second buffer layer 134, the second inorganic film 293 is formed in the remaining area except the area with the second mask. In this case, there is no space between the second mask and the TFT substrate 200 by the use of second buffer layer 134 so that it is possible to prevent the second inorganic film 293 from being permeated into the area with the second mask. Eventually, the second buffer layer 134 is disposed between the dam 120 and the scribing line (SL), and the second mask is disposed on the second buffer layer 134 while being in contact with the second buffer layer 134, whereby it is possible to prevent the second inorganic film 293 from being formed in the periphery of the second buffer layer 134, and more particularly, in the scribing line (SL).

According to the embodiment of the present invention, the first buffer layer 132 and the second buffer layer 134 are provided so that the first inorganic film 291 and the second inorganic film 293 have the different sizes from each other. In more detail, the first buffer layer 132 is provided between the dam 120 and the display area (DA), and the second buffer layer 132 is provided in the periphery of the dam 120 so that the first inorganic film 291 and the dam 120 prevent the organic film 292 from overflowing, and the second inorganic film 293 completely covers the organic film 292, to thereby prevent the permeation of moisture or oxygen. In this case, the first inorganic film 291 and the second inorganic film 293 may be formed by the same deposition method or by the different deposition methods.

Meanwhile, a height (H2) of the first buffer layer 132 may be larger than a height (H1) of the dam 120. If the height (H2) of the first buffer layer 132 is the same as or smaller than the height (H1) of the dam 120, the dam 120 may be damaged by the first mask in the step of disposing the first mask on the first buffer layer 132 for the process of depositing the first inorganic film 291. Also, a height (H3) of the second buffer layer 134 may be the same as or larger than the height (H1) of the dam 120. If the height (H3) of the second buffer layer 134 is smaller than the height (H1) of the dam 120, the dam 120 may be damaged by the second mask in the step of disposing the second mask on the second buffer layer 134 for the process of depositing the second inorganic film 293. If the organic film 292 is brought into contact with the damaged dam 120, oxygen or moisture permeating through the damaged dam 120 may be absorbed in the organic film 292, and then permeated into the light emitting device 280, to thereby deteriorate the light emitting device 280.

The first buffer layer 132 and the second buffer layer 134 may be manufactured together with at least any one of a planarization film 260 of the pixel (P) and a bank 284, and may be formed of the same material as that of at least any one of the planarization film 260 and the bank 284. In this case, the first buffer layer 132 and the second buffer layer 134 may be formed of an organic material, for example, acryl resin, epoxy resin, phenolic resin, polyamide resin, polyimide resin, and etc.

Fourth Embodiment

Figure 15:
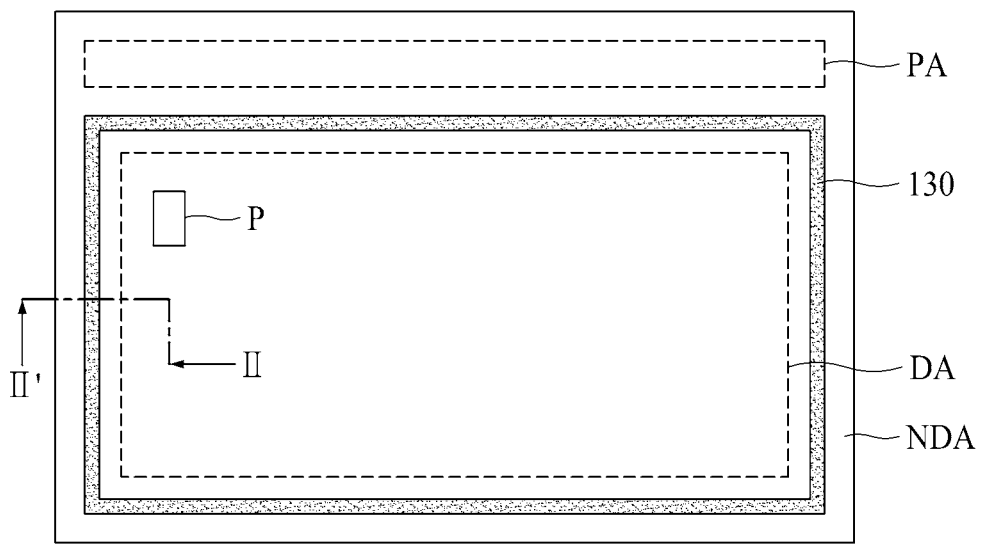
FIG. 15 is a plane view illustrating a first substrate according to the fourth embodiment of the present invention.
Figure 16:
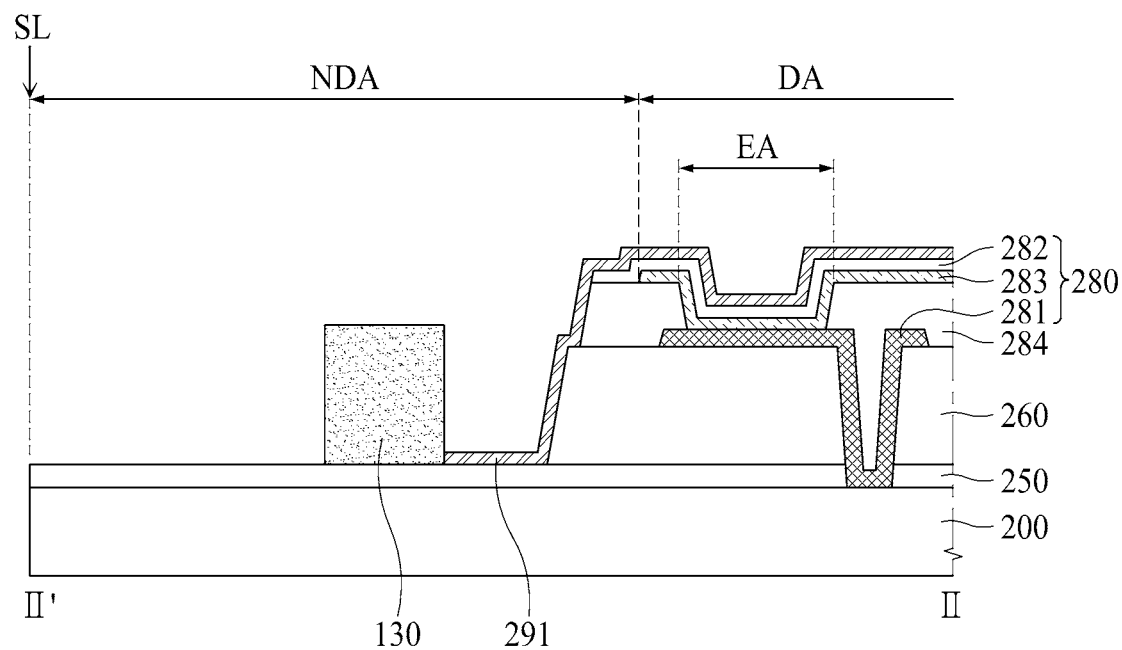
FIG. 16 is a cross sectional view along II-II' of FIG. 14.

FIG. 15 is a plane view illustrating a first substrate according to the fourth embodiment of the present invention. FIG. 16 is a cross sectional view along II-II' of FIG. 15.

FIGS. 15 to 16 illustrate a thin film transistor (TFT) substrate 200, wherein a detailed structure of thin film transistors 210 and capacitors 220 is not shown in the TFT substrate 200, for convenience of explanation. The TFT substrate 200 may include the first substrate 111, the gate insulating film 230 and the insulating interlayer 240, as shown in the FIG. 7.

Referring to FIGS. 15 and 16, a first substrate 111 is divided into a display area (DA) and a non-display area (NDA). In the non-display area (NDA), there are a pad area (PA) for pads, and a buffer layer 130. Unlike the first substrate shown in FIGS. 6 to 10, the first substrate shown in FIGS. 15 and 16 is not provided with a dam, and an encapsulation film included in the first substrate shown in FIGS. 15 and 16 is not provided with an organic film. Hereinafter, a detailed description for the same parts as those shown in FIGS. 6 to 10 will be omitted.

The encapsulation film 290 covers a light emitting device 280 provided on the display area (DA), to thereby prevent moisture or oxygen from being permeated into the light emitting device 280. The encapsulation film 290 includes at least one inorganic film. The encapsulation film 290 includes at least one of first inorganic film 291. In this case, the first inorganic film 291 covers a first electrode 282.

The first inorganic film 291 may be formed of silicon nitride, aluminum nitride, zirconium nitride, titanium nitride, hafnium nitride, tantalum nitride, silicon oxide, aluminum oxide, or titanium oxide. The first inorganic films 291 may be deposited by a chemical vapor deposition (CVD) method or an atomic layer deposition (ALD) method, but not limited to this method.

FIGS. 15 and 16 illustrate one of the first inorganic film 291, but not limited to this structure. According to another example, there may be first and second inorganic films 291 and 292.

The buffer layer 130 is provided in the non-display area (NDA), and is brought into contact with the edge of the first inorganic film 291. In more detail, the buffer layer 130 is provided at a predetermined interval from a scribing line (SL) in the non-display area (NDA), to thereby support a mask 140 so as to maintain a predetermined distance between the mask 140 and the TFT substrate 200 for a process of depositing the first inorganic film 291. To this end, the mask 140 is disposed on the buffer layer 130 while being in contact with the buffer layer 130.

If the first inorganic film 291 is deposited after disposing the mask 140 on the buffer layer 130, the first inorganic film 291 is formed in the remaining area except the area with the mask 140. In this case, there is no space between the mask 140 and the TFT substrate 200 by the use of buffer layer 130 so that it is possible to prevent the first inorganic film 291 from being permeated into the area with the mask 140. Eventually, the buffer layer 130 is provided at a predetermined interval from the scribing line (SL) in the non-display area (NDA), and the mask 140 is disposed on the buffer layer 130 while being in contact with the buffer layer 130, whereby it is possible to prevent the first inorganic film 291 from being formed in the periphery of the buffer layer 130, and more particularly, in the scribing line (SL).

The buffer layer 130 may be manufactured together with at least any one of a planarization film 260 of a pixel (P) and a bank 284, and may be formed of the same material as that of at least any one of the planarization film 260 and the bank 284. In this case, the buffer layer 130 may be formed of an organic material, for example, acryl resin, epoxy resin, phenolic resin, polyamide resin, polyimide resin, and etc.

Fifth Embodiment

Figure 17:
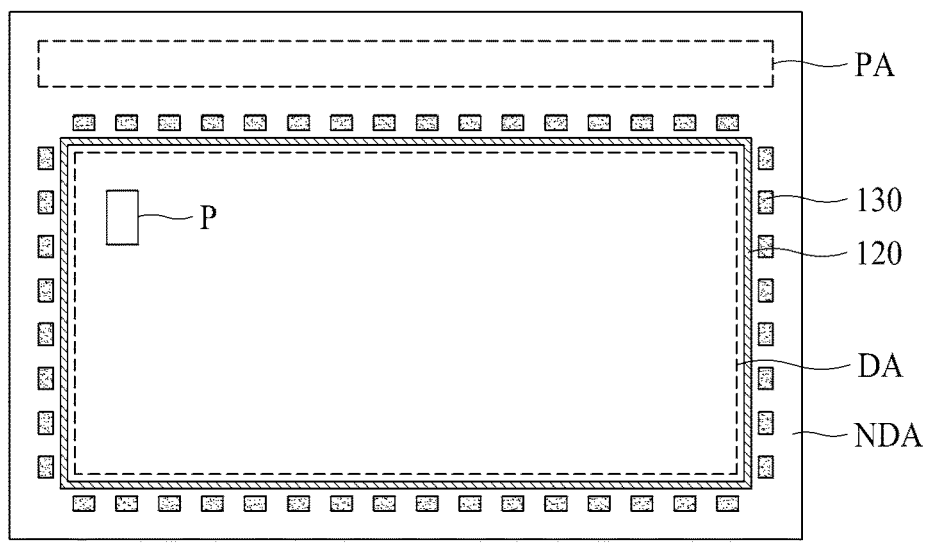
FIG. 17 is a plane view illustrating a first substrate according to the fifth embodiment of the present invention.

FIG. 17 is a plane view illustrating a first substrate according to the fifth embodiment of the present invention.

Referring to FIG. 17, a first substrate 111 is divided into a display area (DA) and a non-display area (NDA). In the non-display area (NDA), there are a pad area (PA) for pads, a dam 120, and a buffer layer 130. In this case, the buffer layer 130 shown in FIG. 17 may be formed of a plurality of island-shaped patterns. The buffer layer 130 formed of the plurality of island-shaped patterns may be applied to other embodiments of the present invention.

The buffer layer 130 may be formed of the plurality of island-shaped patterns along the periphery of the dam 120. According to the fifth embodiment of the present invention, the buffer layer 130 is formed of the plurality of island-shaped patterns instead of a line shaped pattern so that it is possible to reduce the increase of stress in the non-display area (NDA).

Sixth Embodiment

Figure 18:
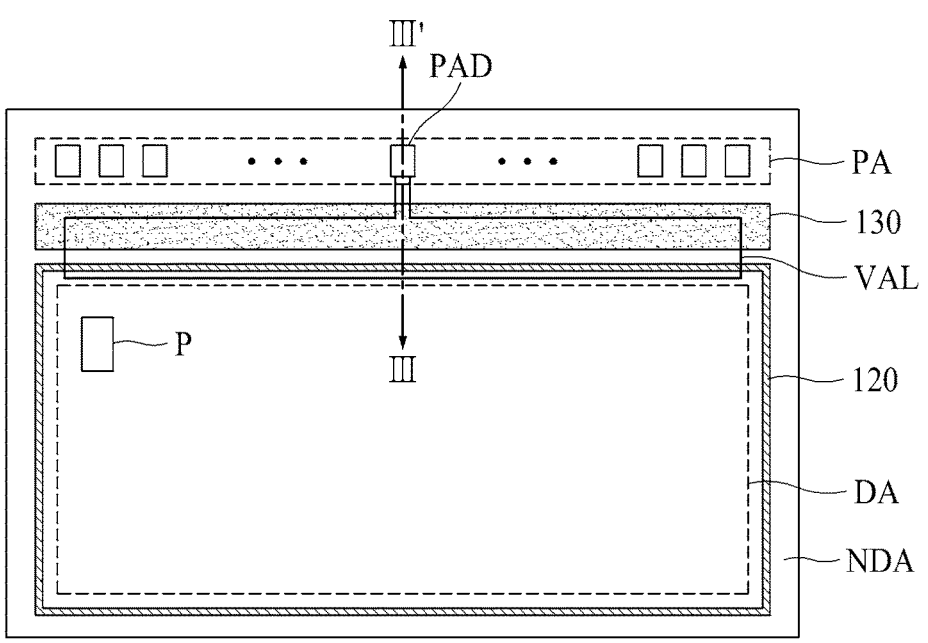
FIG. 18 is a plane view illustrating a first substrate according to the sixth embodiment of the present invention.

FIG. 18 is a plane view illustrating a first substrate according to the sixth embodiment of the present invention.

In a display area (DA), there are gate and data lines crossing each other. In the display area (DA), there are pixels (P) for displaying an image in a matrix configuration defined by the gate and data lines crossing each other. If a gate signal is supplied from the gate line to each pixel (P), a predetermined current is supplied to a light emitting device 280 in accordance with a data voltage of the data line. Accordingly, the light emitting device 280 for each of the pixels (P) may emit light with a predetermined brightness in accordance with the predetermined current. Also, a power source voltage is supplied to a power source line. The power source line supplies the power source voltage to each pixel (P).

In a non-display area (NDA), there are a power source auxiliary line (VAL) connected with the power source lines, pads (PAD) connected with the power source auxiliary line (VAL), and a buffer layer 130. Even though a detailed structure of the first substrate 111 is not shown, for convenience of explanation, data link lines (DLL) connected with the data lines are provided in the non-display area (NDA).

A pad area (PA) may be provided at one side of the first substrate 111. The pad area (PA) includes the plurality of pads, and the plurality of pads are electrically connected with lines of a flexible film 150 by the use of anisotropic conducting film.

A dam 120 surrounds the display area (DA), to thereby prevent an organic film 292 from overflowing. Also, the dam 120 is disposed between the display area (DA) and the pad area (PA), to thereby prevent the organic film 292 included in an encapsulation film 290 of the pixel (P) from flowing into the pad area (PA).

The data link lines (DLL) are connected with the pads (PAD) of the pad area (PA) by a one-to-one correspondence, and are connected with the data lines of the display area (DA) by a one-to-one correspondence. In detail, one end of the data link line (DDL) is connected with the data line via a first contact hole, and the other end of the data link line (DDL) is connected with the pad (PAD) via a second contact hole. The pad (PAD) may be electrically connected with the lines of the flexible film 150 via a third contact hole by the use of anisotropic conducting film.

Herein, one end of the data link line (DLL) which is connected with the data line is parallel to the data line, the other end of the data link line (DLL) which is connected with the pad (PAD) is parallel to the pad (PAD), and the remaining area of the data link line (DLL) is oblique relative to the data line.

The data link lines (DLL) may be provided in a gate metal pattern which is formed of the same material as that of a gate electrode 212. The data line and pad (PAD) may be provided in a source/drain metal pattern which is formed of the same material as that of source/drain electrodes 213/214.

The power source auxiliary line (VAL), which is parallel to the gate lines, is connected with the pad (PAD) of the pad area (PA), and the power source lines of the display area (DA). If the power source voltage is applied from the pad (PAD) to the power source auxiliary line (VAL), the power source auxiliary line (VAL) supplies the power source voltage to the power source line. In this case, the power source auxiliary line (VAL) is not directly connected with the power source lines, but connected with the power source lines through the use of connection lines by a one-to-one correspondence.

The connection lines may be provided in a gate metal pattern which is formed of the same material as that of the gate electrode 212. The power source auxiliary line (VAL) and the power source line may be provided in a source/drain metal pattern which is formed of the same material as that of source/drain electrodes 213/214.

The buffer layer 130 is disposed on the metal pattern of the non-display area (NDA), and more particularly, on the power source auxiliary line (VAL) to which the power source voltage is applied from the pad (PAD). Also, the buffer layer 130 is brought into contact with a first inorganic film 291 or a second inorganic film 293 constituting an encapsulation film 290 of the pixel (P). According to the sixth embodiment of the present invention, the first inorganic film 291 or the second inorganic film 293 covers some area of an upper surface of the buffer layer 130.

Hereinafter, the buffer layer according to the sixth embodiment of the present invention will be described in detail with reference to FIG. 19.

Figure 19:
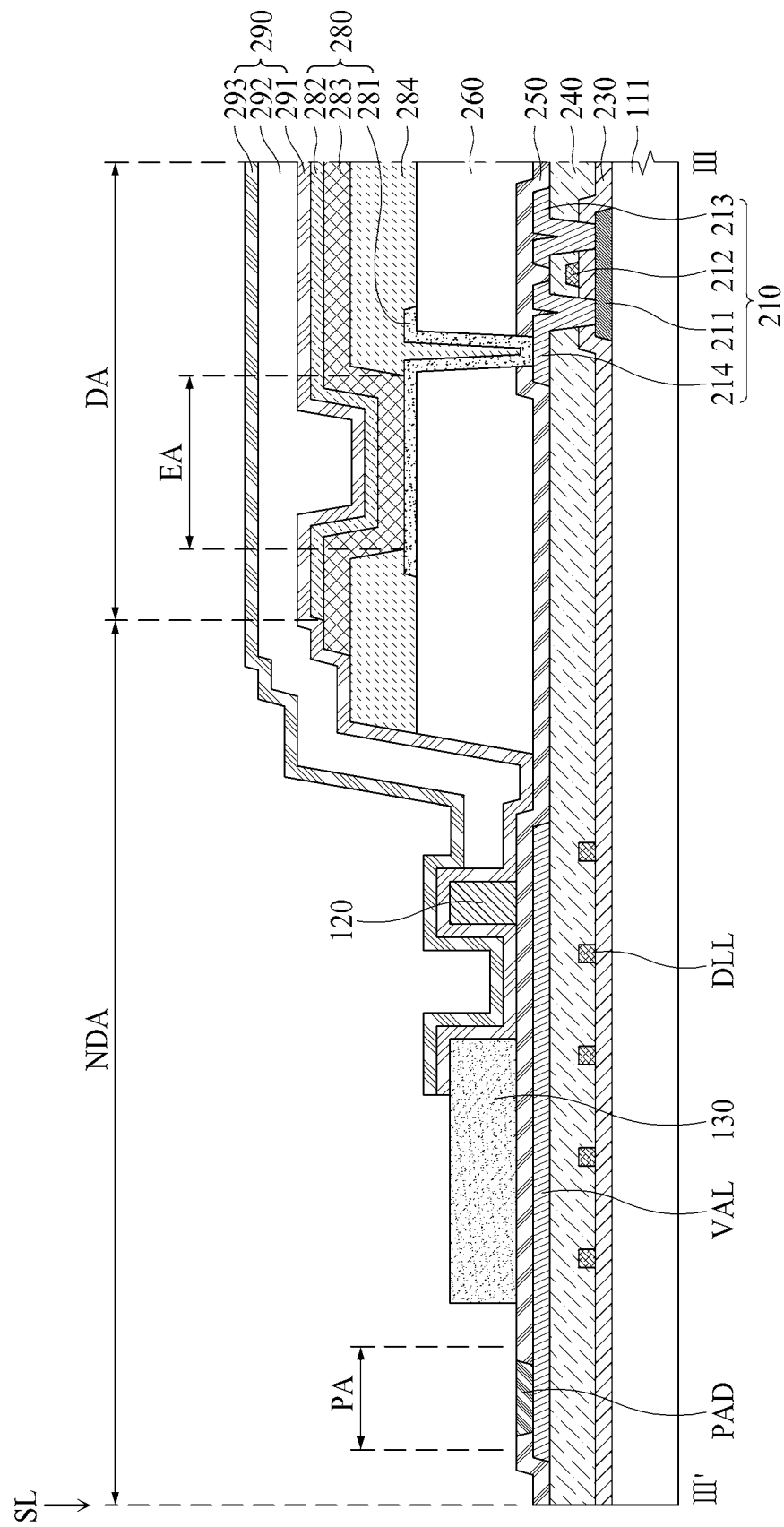
FIG. 19 is a cross sectional view along III-III' of FIG. 18.
Figure 20:
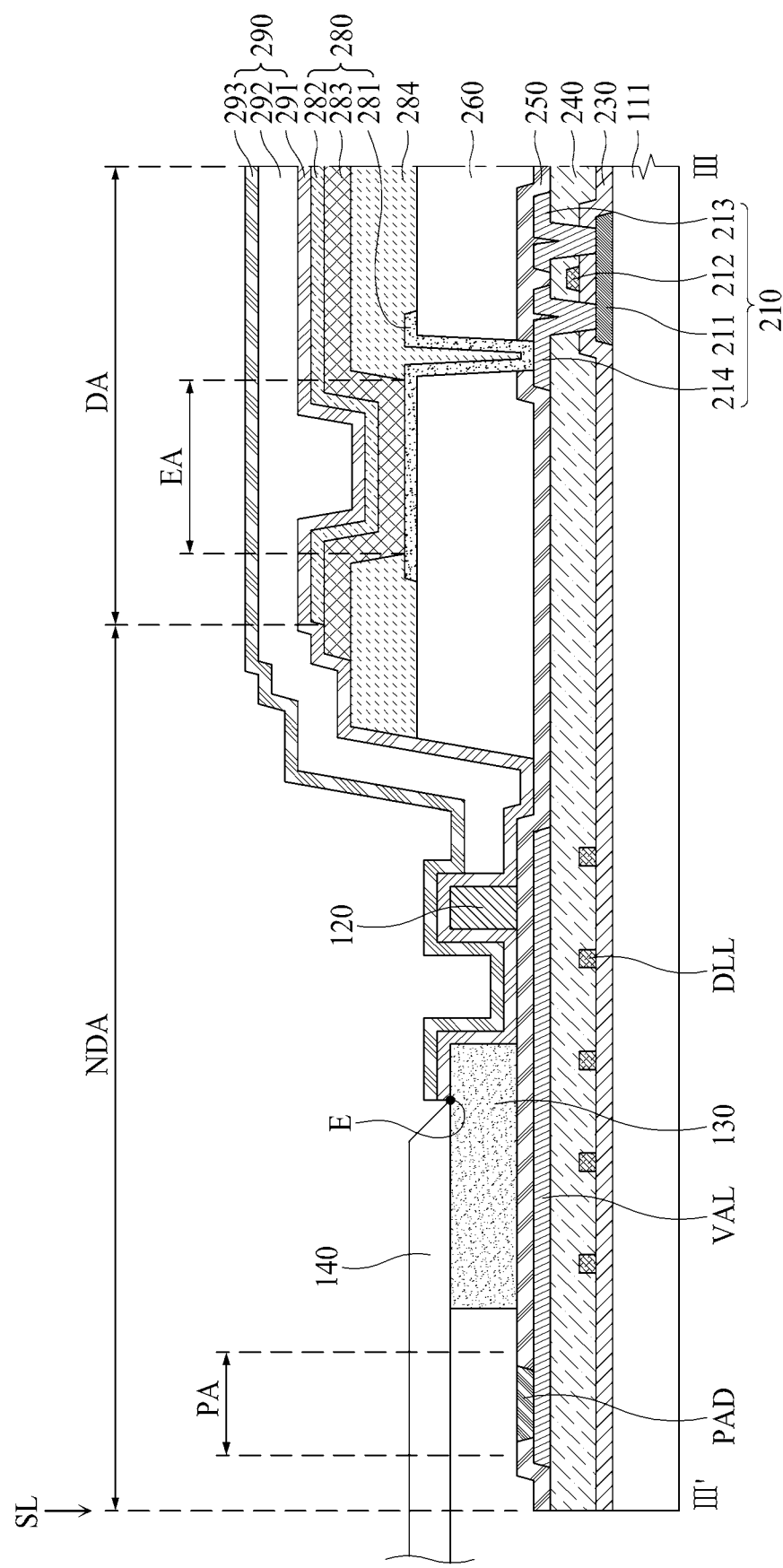
FIG. 20 is a cross sectional view illustrating a mask arranged on a buffer layer of FIG. 19.
Figure 21:
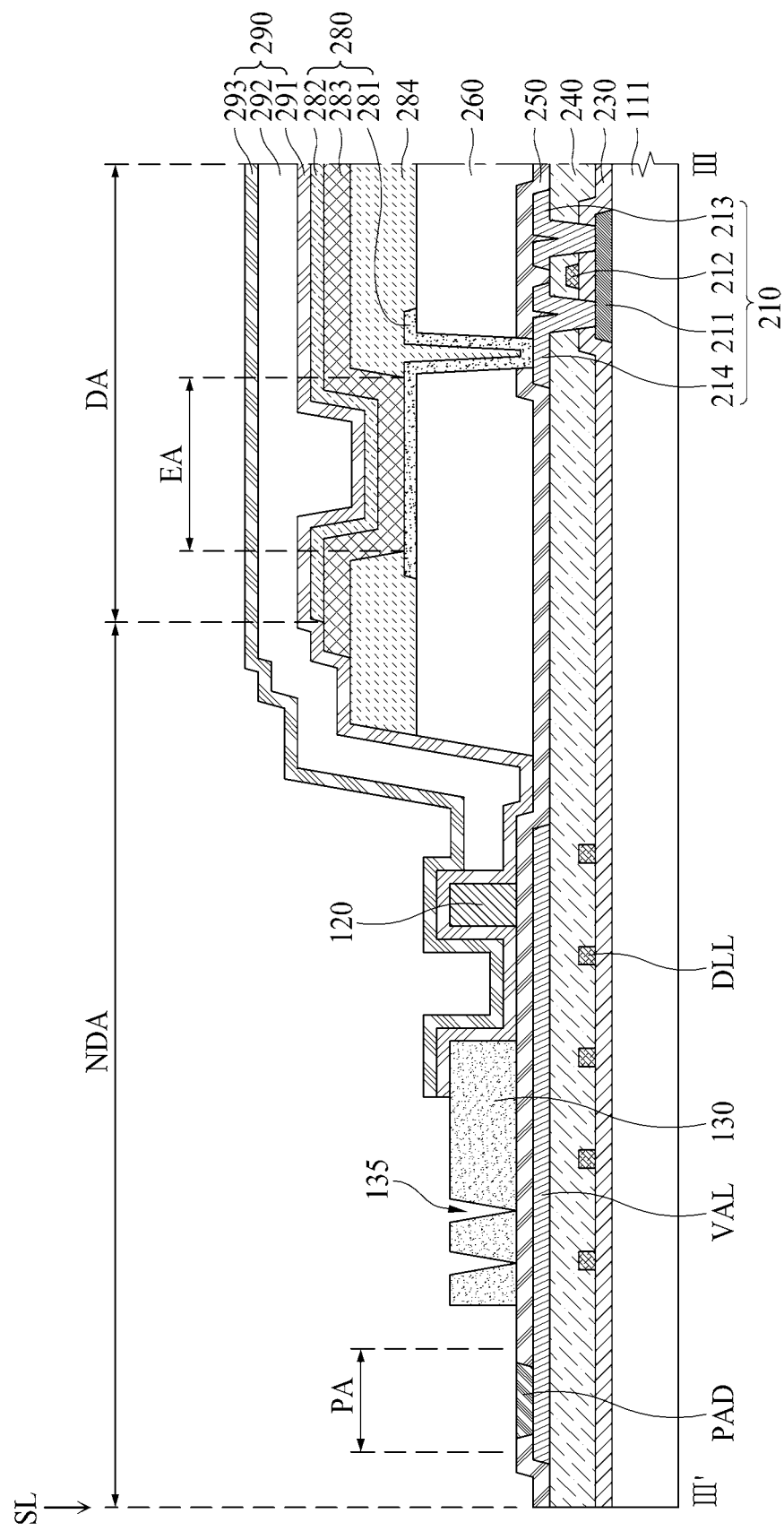
FIG. 21 is a cross sectional view illustrating a modified embodiment of FIG. 19.

FIG. 19 is a cross sectional view along III-III' of FIG. 18. FIG. 20 is a cross sectional view illustrating a mask arranged on the buffer layer of FIG. 19. FIG. 21 is a cross sectional view illustrating a modified embodiment of FIG. 19. Hereinafter, differences between the first embodiment and the sixth embodiment will be described mainly, and a description for the same parts will be omitted.

On the first substrate 111 of the display device shown in FIG. 19, there are the encapsulation film 290, the dam 120, and the buffer layer 130. In this case, the first substrate 111 is divided into the display area (DA) provided with the pixels (P), and the non-display area (NDA). The non-display area (NDA) includes the pad area (PA) provided with the plurality of pads (PAD).

The encapsulation film 290 covers the light emitting device 280 provided in the display area (DA), to thereby prevent moisture or oxygen from being permeated into the light emitting device 280. In this case, the encapsulation film 290 may include at least one inorganic film and at least one organic film. For example, the encapsulation film 290 may include the first inorganic film 291, the organic film 292, and the second inorganic film 293. The first inorganic film 291 covers the first electrode 282, the organic film 292 is provided on the first inorganic film 291, and the second inorganic film 293 covers the organic film 292.

The dam 120 is provided to surround the periphery of the display area (DA), to thereby prevent the organic film 292 included in the encapsulation film 290 from overflowing. The organic film 292 included in the encapsulation film 290 has good covering properties and poor barrier properties, whereby the organic film 292 is necessarily encapsulated by the second inorganic film 293. However, if the organic film 292 flow out of a desired area, the organic film 292 is not encapsulated by the second inorganic film 293, whereby oxygen or moisture permeates through the exposed organic film 292. In order to overcome this problem, the dam 120 is provided to prevent the organic film 292 from overflowing, to thereby prevent the organic film 292 from being exposed to the outside of the display device.

Also, the dam 120 is disposed between the display area (DA) and the pad area (PA) so that it is possible to prevent the organic film 292 included in the encapsulation film 290 from overflowing, and more particularly, to prevent the organic film 292 from flowing into the pad area (PA). If the organic film 292 for the encapsulation film 290 flows into the pad area (PA), it is difficult to make a proper electrical contact in the pad due to the organic film 292 flowing into the pad area (PA), whereby a driving defect or lighting inspection defect might occur. In order to overcome this problem, the dam 120 is provided to prevent the organic film 292 for the encapsulation film 290 from overflowing, to thereby prevent the organic film 292 from flowing into the pad area (PA).

FIGS. 19 to 20 illustrate one dam 120, but not limited to this structure. According to another example, the dam 120 may include a first dam, and a second dam disposed in the non-display area and provided at a predetermined interval from the first dam. The second dam prevents the organic film 292 from flowing out of the first dam.

The dam 120 may be manufactured together with at least any one of a planarization film 260 and a bank 284 in the pixel (P), and may be formed of the same material as that of at least any one of the planarization film 260 and the bank 284 in the pixel (P). In this case, the dam 120 may be formed of an organic material, for example, acryl resin, epoxy resin, phenolic resin, polyamide resin, polyimide resin, and etc.

The buffer layer 130 is positioned in the non-display area (NDA). The buffer layer is in contact with the edge of at least one of the first inorganic film 291 and the second inorganic film 293. In more detail, the buffer layer 130 is disposed between a scribing line (SL) and the dam 120 in the non-display area (NDA), to thereby support the mask 140 so as to maintain a predetermined distance between the mask 140 and the TFT substrate 200 for a process of depositing the first inorganic film 291 or the second inorganic film 293. To this end, the mask 140 is disposed on the buffer layer 130 while being in contact with the buffer layer 130, as shown in FIG. 20.

If the first inorganic film 291 or the second inorganic film 293 is deposited after disposing the mask 140 on the buffer layer 130, the first inorganic film 291 or the second inorganic film 293 is formed in the remaining area except the area with the mask 140. In this case, there is no space between the mask 140 and the TFT substrate 200 by the use of buffer layer 130 so that it is possible to prevent the first inorganic film 291 or the second inorganic film 293 from being permeated into the area with the mask 140. Eventually, the buffer layer 130 is disposed between the dam 120 and the scribing line (SL), and the mask 140 is disposed on the buffer layer 130 while being in contact with the buffer layer 130, whereby it is possible to prevent the first inorganic film 291 or the second inorganic film 293 from being formed in the periphery of the buffer layer 130, and more particularly, in the scribing line (SL).

Also, the buffer layer 130 is provided between the dam 120 and the pad area (PA) so that it is possible to prevent the first inorganic film 291 or the second inorganic film 293 from being formed in the pad area (PA). Accordingly, it is possible to prevent the driving defect or lighting inspection defect caused by the defect of the electrical contact in the pad due to the first inorganic film 291 or the second inorganic film 293.

Meanwhile, if the first inorganic film 291 or the second inorganic film 293 is deposited by a CVD method, a high voltage is instantaneously formed for the process of depositing the first inorganic film 291 or the second inorganic film 293. Especially, electric charges are instantaneously gathered in the edge (E) of the mask 140, whereby static electricity may be generated between the mask 140 and the power source auxiliary line (VAL) arranged in the area corresponding to the edge (E), which may cause defects on the mask 140 and the power source auxiliary line (VAL). A protection film 250 is formed on the power source auxiliary line (VAL). However, since the protection film 250 is generally thin, the protection film 250 may be peeled off due to the high voltage for the process of depositing the first inorganic film 291 or the second inorganic film 293.

In order to overcome these problems, according to the sixth embodiment of the present invention, the buffer layer 130 is provided on the metal pattern provided in the non-display area (NDA), and more particularly, on the power source auxiliary line (VAL). For the process of depositing the first inorganic film 291 or the second inorganic film 293, as shown in FIG. 20, the mask 140 is provided to cover some area of the upper surface of the buffer layer 130. The buffer layer 130 is in contact with the edge of the first inorganic film 291 or the second inorganic film 293, and some area of the upper surface of the buffer layer 130 is covered by the first inorganic film 291 or the second inorganic film 293.

Accordingly, the buffer layer 130 is provided between the power source auxiliary line (VAL) and the edge (E) of the mask 140. Thus, even though a large amount of electric charges is instantaneously gathered in the edge (E) of the mask 140 for the process of depositing the first inorganic film 291 or the second inorganic film 293, it is possible to prevent static electricity between the mask 140 and the power source auxiliary line (VAL) by the use of buffer layer 130.

As described above, some area of the upper surface of the buffer layer 130 is covered by at least one of the first inorganic film 291 and the second inorganic film 293. FIG. 19 shows that some area of the upper surface of the buffer layer 130 is covered by the first inorganic film 291 and the second inorganic film 293, but not limited to this structure.

According to another example of the present invention, only the second inorganic film 293 may be formed on some area of the upper surface of the buffer layer 130, and the buffer layer 130 may be in contact with the edge of the second inorganic film 293. In more detail, the first inorganic film 291 and the second inorganic film 293 may be deposited by the different deposition methods. As the first inorganic film 291 is provided on the light emitting device 280 which is not flat, the first inorganic film 291 is deposited by the use of ALD method having high step coverage. In case of the ALD method, the high voltage is not generated, unlike the CVD method, whereby static electricity is not generated between the mask and the power source auxiliary line. Accordingly, the first inorganic film 291 may be deposited by the ALD method after the mask is provided at a predetermined interval from the first substrate 111. In this case, the mask may be in contact with the buffer layer 130, or may be provided at a predetermined interval from the buffer layer 130. The mask may be provided to cover the entire upper surface of the buffer layer 130.

Meanwhile, since the second inorganic film 293 is provided on the organic film 292 which is relatively flat, the second inorganic film 293 may be deposited by the CVD method. Under the condition that the mask 140 is disposed on the buffer layer 130 while being in contact with the buffer layer 130, the second inorganic film 293 may be deposited by the CVD method. In this case, the mask 140 may be provided to cover some area of the upper surface of the buffer layer 130. Accordingly, the second inorganic film 293 perfectly covers the first inorganic film 291 and the organic film 292.

As shown in FIG. 21, the buffer layer 130 is provided with at least one groove 135 for exposing the protection film 250, to thereby prevent moisture or oxygen from being permeated into the display area (DA).

The buffer layer 130 may be manufactured together with at least any one of a planarization film 260 and a bank 284 in the pixel (P), and may be formed of the same material as that of at least any one of the planarization film 260 and the bank 284 in the pixel (P). In this case, the buffer layer 130 may be formed of an organic material, for example, acryl resin, epoxy resin, phenolic resin, polyamide resin, polyimide resin, and etc.

Seventh Embodiment

Figure 22:
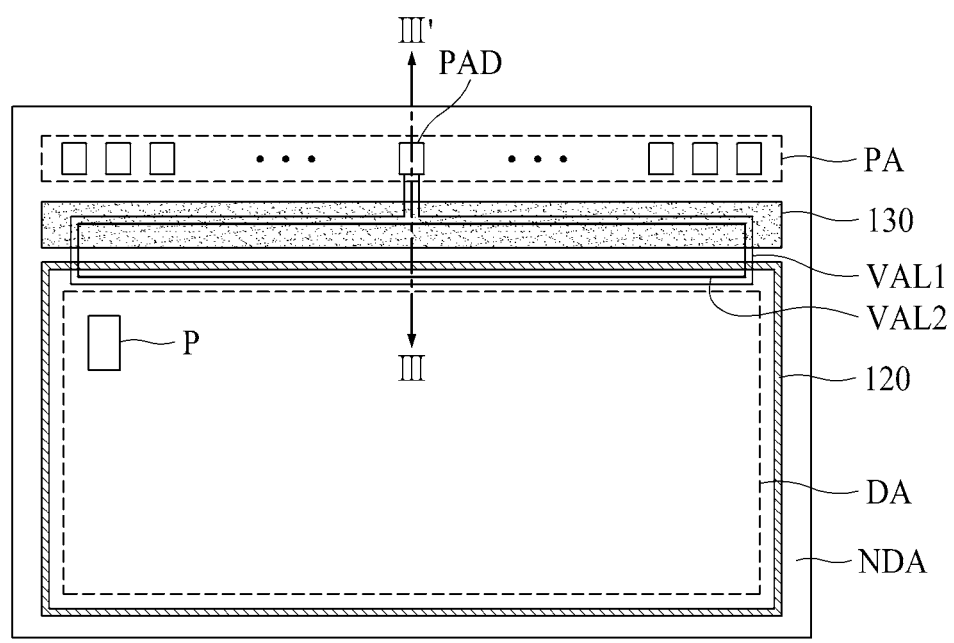
FIG. 22 is a plane view illustrating a first substrate according to the seventh embodiment of the present invention.

FIG. 22 is a plane view illustrating a first substrate according to the seventh embodiment of the present invention. In terms of a power source auxiliary line including a first power source auxiliary line (VAL1) and a second power source auxiliary line (VAL2), the first substrate shown in FIG. 22 is different from the first substrate shown in FIG. 18. Hereinafter, a detailed description for the same parts as those of FIG. 18 will be omitted.

In a non-display area (NDA), there are a dam 120, a first power source auxiliary line (VAL1) connected with power source lines, a second power source auxiliary line (VAL2) disposed on the first power source auxiliary line (VAL1), pads (PAD) connected with the first power source auxiliary line (VAL1), and a buffer layer 130. Even though a detailed structure of the first substrate 111 is not shown, for convenience of explanation, data link lines (DLL) connected with data lines are provided in the non-display area (NDA).

The power source auxiliary line (VAL), which is parallel to the gate lines, is connected with the pad (PAD) of a pad area (PA), and the power source lines of a display area (DA). If a power source voltage is applied from the pad (PAD) to the power source auxiliary line (VAL), the power source auxiliary line (VAL) supplies the power source voltage to the power source line. In this case, the power source auxiliary line (VAL) is not directly connected with the power source lines, but connected with the power source lines through the use of connection lines by a one-to-one correspondence.

The power source auxiliary line (VAL) may include the first power source auxiliary line (VAL1), and the second power source auxiliary line (VAL2). The second power source auxiliary line (VAL2) is provided on the first power source auxiliary line (VAL1), and is connected with the first power source auxiliary line (VAL1) via a contact hole. In more detail, the second power source auxiliary line (VAL2) is connected with the first power source auxiliary line (VAL1) via a contact hole penetrating through a third buffer layer 136. According as the second power source auxiliary line (VAL2) is additionally provided on the first power source auxiliary line (VAL1), it is possible to increase a cross sectional area of the power source auxiliary line (VAL). Eventually, it is possible to realize a stable supply of power source by decreasing a resistance.

The connection lines may be provided in a gate metal pattern which is formed of the same material as that of a gate electrode 212. The first power source auxiliary line (VAL1) and the power source line may be provided in a source/drain metal pattern which is formed of the same material as that of source/drain electrodes 213/214.

The buffer layer 130 is disposed on the metal pattern of the non-display area (NDA), and more particularly, on the power source auxiliary line (VAL) to which the power source voltage is applied from the pad (PAD). Also, the buffer layer 130 is brought into contact with a first inorganic film 291 or a second inorganic film 293 constituting an encapsulation film 290 of the pixel (P). According to the seventh embodiment of the present invention, the buffer layer 130 includes a third buffer layer 136 and a fourth buffer layer 138, and the first inorganic film 291 or the second inorganic film 293 covers some area of an upper surface of the fourth buffer layer 138.

Hereinafter, the buffer layer according to the seventh embodiment of the present invention will be described in detail with reference to FIGS. 23 and 24.

Figure 23:
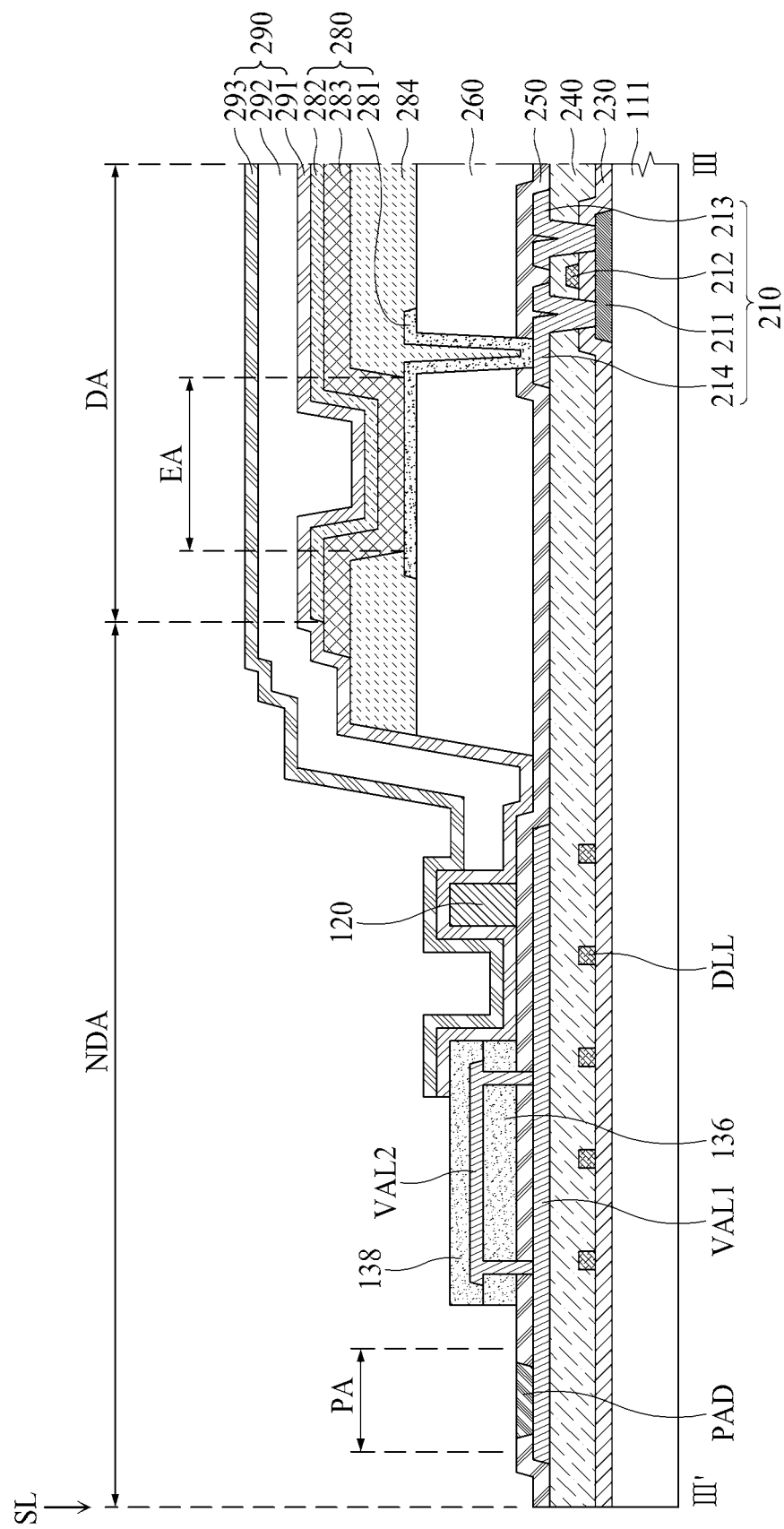
FIG. 23 is a cross sectional view along III-III' of FIG. 22.
Figure 24:
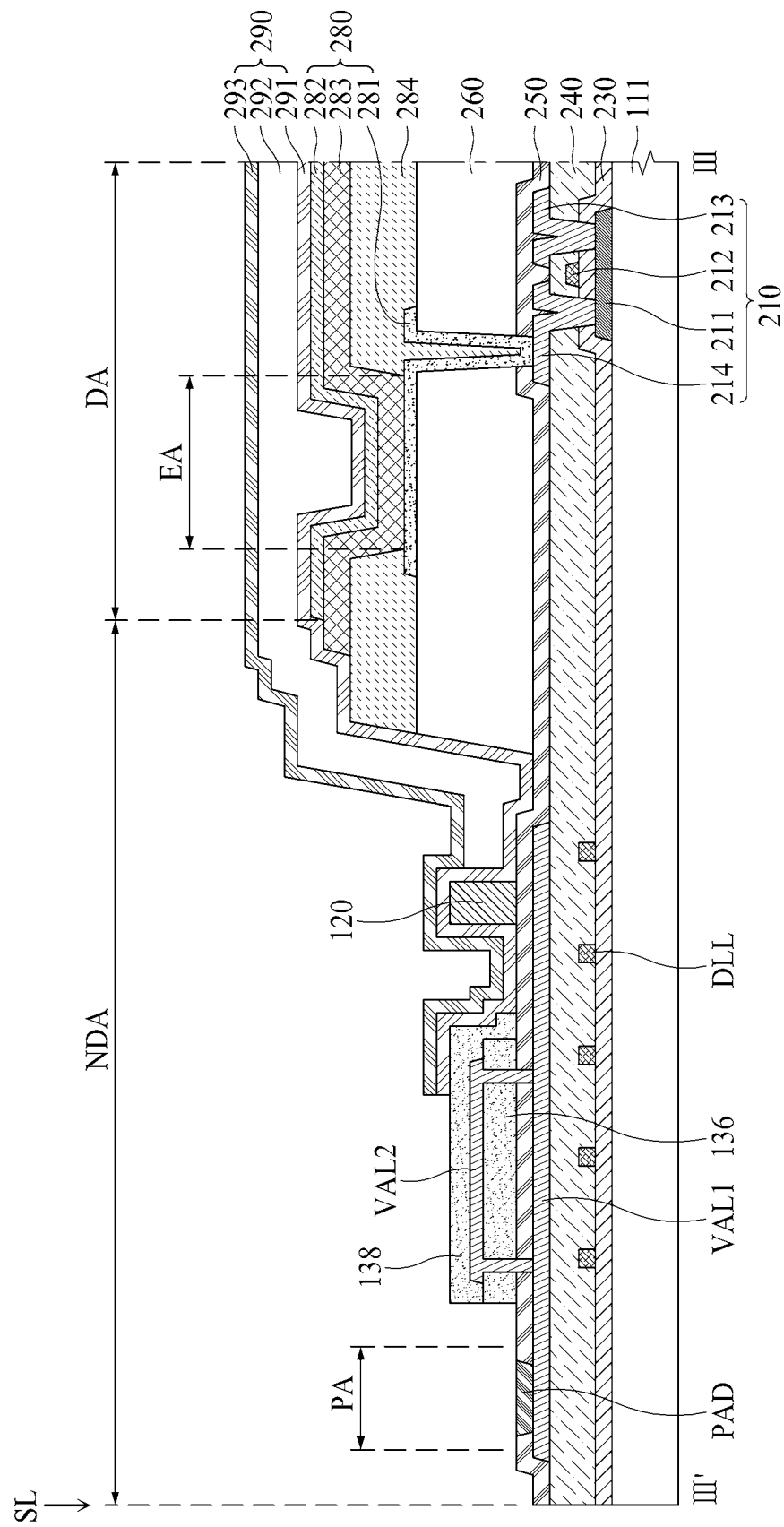
FIG. 24 is a cross sectional view illustrating a modified embodiment of FIG. 23.
Figure 25:
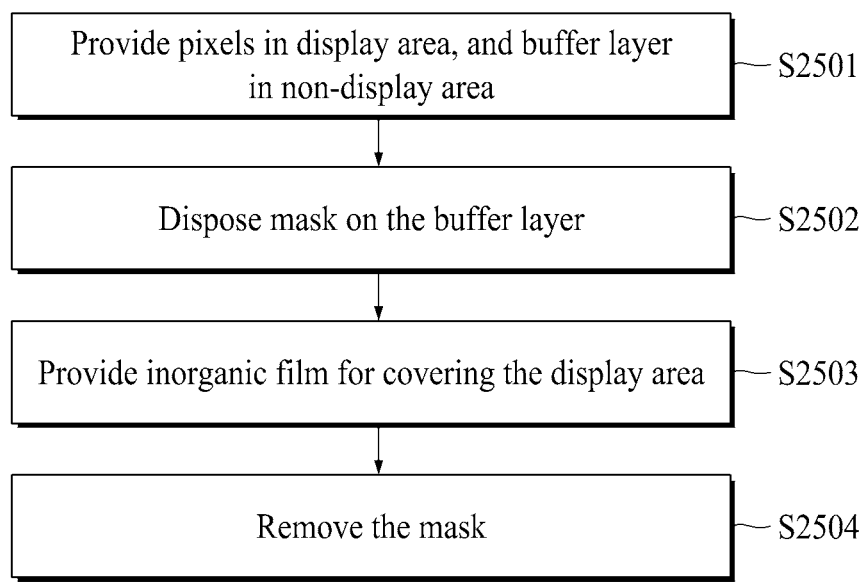
FIG. 25 is a flow chart illustrating a method for manufacturing a display device according to the first embodiment of the present invention.

FIG. 23 is a cross sectional view along III-III' of FIG. 22. FIG. 24 is a cross sectional view illustrating a modified embodiment of FIG. 23. In terms of the buffer layer 130 including the third buffer layer 136 and the fourth buffer layer 138, and the second power source auxiliary line (VAL2) disposed between the third buffer layer 136 and the fourth buffer layer 138, the first substrate shown in FIGS. 23 and 25 is different from the first substrate shown in FIGS. 18 to 20. Hereinafter, a detailed description for the same parts as those of FIGS. 18 to 20 will be omitted.

On the first substrate 111 of the display device shown in FIG. 22, there are the encapsulation film 290, the dam 120, and the buffer layer 130. In this case, the first substrate 111 is divided into the display area (DA) provided with the pixels, and the non-display area (NDA). The non-display area (NDA) includes the pad area (PA) provided with the plurality of pads (PAD).

The buffer layer 130 includes the third buffer layer 136 and the fourth buffer layer 138. The third buffer layer 136 is provided on the first power source auxiliary line (VAL1) in the non-display area (NDA). The second power source auxiliary line (VAL2) is provided on the third buffer layer 136, and is connected with the first power source auxiliary line (VAL1) via the contact hole penetrating through the third buffer layer 136 and the protection film 250. The fourth buffer layer 138 is provided on the second power source auxiliary line (VAL2).

The fourth buffer layer 138 is in contact with the edge of at least one of the first inorganic film 291 and the second inorganic film 293. For the process of depositing the first inorganic film 291 or the second inorganic film 293, the mask 140 is provided to cover some area of the upper surface of the fourth buffer layer 138. The fourth buffer layer 138 is in contact with the edge of the first inorganic film 291 or the second inorganic film 293, and some area of the upper surface of the fourth buffer layer 138 is covered by the first inorganic film 291 or the second inorganic film 293.

Accordingly, the fourth buffer layer 138 is provided between the second power source auxiliary line (VAL2) and the edge (E) of the mask 140. Thus, even though a large amount of electric charges is instantaneously gathered in the edge (E) of the mask 140 for the process of depositing the first inorganic film 291 or the second inorganic film 293, it is possible to prevent static electricity between the mask 140 and the second power source auxiliary line (VAL2) by the use of fourth buffer layer 138. Also, the third buffer layer 136 and the fourth buffer layer 138 are provided between the first power source auxiliary line (VAL1) and the edge (E) of the mask 140. Thus, even though a large amount of electric charges is instantaneously gathered in the edge (E) of the mask 140 for the process of depositing the first inorganic film 291 or the second inorganic film 293, it is possible to prevent static electricity between the mask 140 and the first power source auxiliary line (VAL1) by the use of third buffer layer 136 and fourth buffer layer 138.

As described above, some area of the upper surface of the fourth buffer layer 138 may be covered by at least one of the first inorganic film 291 and the second inorganic film 293. FIG. 23 shows the some area of the upper surface of the fourth buffer layer 138 is covered by the first inorganic film 291 and the second inorganic film 293.

According to another example of the present invention, only the second inorganic film 293 may be formed on some area of the upper surface of the fourth buffer layer 138, and the fourth buffer layer 138 may be in contact with the edge of the second inorganic film 293. In more detail, the first inorganic film 291 and the second inorganic film 293 may be deposited by the different deposition methods. As the first inorganic film 291 is provided on the light emitting device 280 which is not flat, the first inorganic film 291 is deposited by the use of ALD method having high step coverage. In case of the ALD method, the high voltage is not generated, unlike the CVD method, whereby static electricity is not generated between the mask and the power source auxiliary line. Accordingly, the first inorganic film 291 may be deposited by the ALD method after the mask is provided at a predetermined interval from the first substrate 111. In this case, the mask may be in contact with the fourth buffer layer 138, or may be provided at a predetermined interval from the fourth buffer layer 138. The mask may be provided to cover the entire upper surface of the fourth buffer layer 138.

Meanwhile, since the second inorganic film 293 is provided on the organic film 292 which is relatively flat, the second inorganic film 293 may be deposited by the CVD method. Under the condition that the mask 140 is disposed on the fourth buffer layer 138 while being in contact with the fourth buffer layer 138, the second inorganic film 293 may be deposited by the CVD method. In this case, the mask 140 may be provided to cover some area of the upper surface of the fourth buffer layer 138. Accordingly, the second inorganic film 293 perfectly covers the first inorganic film 291 and the organic film 292.

Meanwhile, as shown in FIG. 23, the third buffer layer 136 and the fourth buffer layer 138 may have the same size, but not limited to this structure. According to another example of the present invention, as shown in FIG. 24, an area of the fourth buffer layer 138 may be relatively larger than an area of the third buffer layer 136.

The buffer layer 130 may be manufactured together with at least any one of a planarization film 260 and a bank 284 in the pixel (P), and may be formed of the same material as that of at least any one of the planarization film 260 and the bank 284 in the pixel (P). For example, the third buffer layer 136 and the planarization film 260 may be manufactured at the same time, and may be formed of the same material. The fourth buffer layer 138 and the bank 284 may be manufactured at the same time, and may be formed of the same material.

FIGS. 18 to 28 show that the buffer layer 130 is disposed between the dam 120 and the pad area (PA), but not limited to this structure. According to another example of the present invention, the buffer layer 130 may be disposed to surround the dam 120. Also, the buffer layer 130 may be formed of a plurality of island-shaped patterns. If the buffer layer 130 is formed of the plurality of island-shaped patterns, the buffer layer 130 extends in a continuous pattern on the plurality of metal lines provided in the non-display area (NDA), preferably. In the non-display area (NDA), if needed, the plurality of metal lines (not shown) may be provided in addition to the power source auxiliary line (VAL). According to a panel design, the plurality of metal lines may be disposed between the display area (DA) and the pad area (PA), or may be disposed at one side of the non-display area (NDA) where the pad area (PA) is not provided. According as the buffer layer 130 is provided on the plurality of metal lines, it is possible to prevent static electricity between the metal line and the edge (E) of the mask 140 for the process of depositing the first inorganic film 291 or the second inorganic film 293 for the encapsulation film.

FIG. 25 is a flow chart illustrating a method for manufacturing the display device according to the first embodiment of the present invention. FIGS. 26A to 26G are cross sectional views illustrating the method for manufacturing the display device according to the first embodiment of the present invention.

First, the pixel (P) is formed in the display area (DA), and the buffer layer 130 is formed in the non-display area (NDA) (S2501).

Figure 26A:
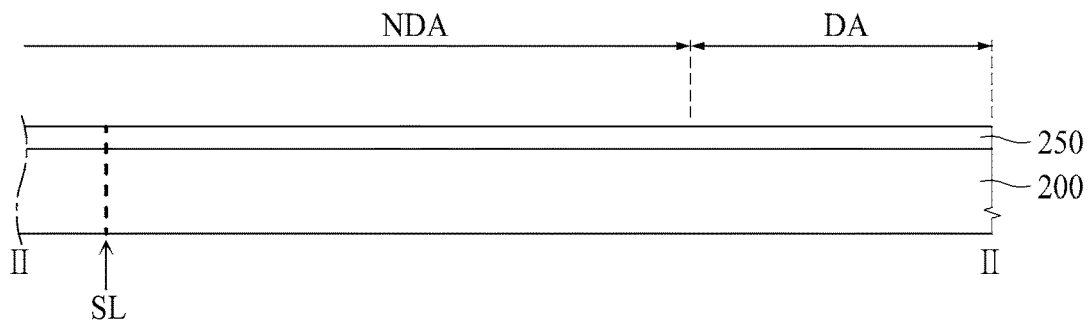
FIGS. 26A, 26B, 26C, 26D, 26E, 26F, 26G, and 26H are cross sectional views illustrating the method for manufacturing the display device according to the first embodiment of the present invention.

In more detail, as shown in FIG. 26A, the TFT substrate 200 is prepared, and the protection film 250 is formed on the TFT substrate 200. The protection film 250 functions as an insulating film. The protection film 250 may be formed in a single-layered structure of the inorganic insulating material such as silicon oxide (SiOx) or silicon nitride (SiNx), or a multi-layered structure of the above silicon oxide (SiOx) and silicon nitride (SiNx).

Figure 26B:
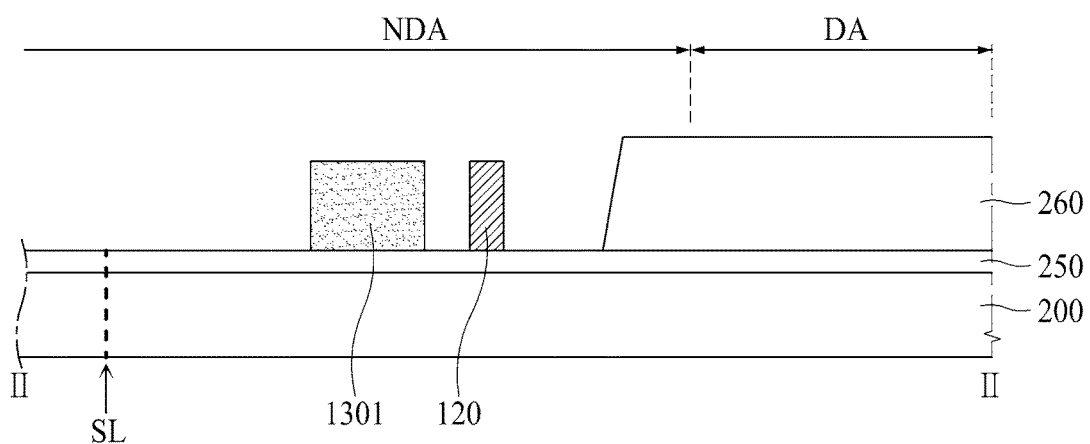

As shown in FIG. 26B, the planarization film 260, the dam 120, and a lower buffer layer 1301 are provided. In more detail, the planarization film 260, the dam 120, and the lower buffer layer 1301 are provided on the protection film 250. In this case, the dam 120 is provided in the non-display area (NDA), and the lower buffer layer 1301 is provided in the periphery of the dam 120. Each of the planarization film 260, the dam 120, and the lower buffer layer 1301 may be formed of an organic film of an organic material, for example, acryl resin, epoxy resin, phenolic resin, polyamide resin, polyimide resin, and etc. The planarization film 260 is formed in a single-layered structure, but not limited to this structure. The planarization film 260 may be formed in a multi-layered structure including two or more layers. For example, if the planarization film 260 is formed in a double-layered structure including two layers, a protection film (not shown) may be additionally interposed between the two layers of the planarization film 260. If the planarization film 260 includes a lower planarization film and an upper planarization film, the buffer layer 1301 and the dam 120 may be manufactured together with the lower planarization film or the upper planarization film, selectively. For example, the buffer layer 1301 and the dam 120 may be manufactured together with the lower planarization film (not shown), or only the buffer layer 1301 may be manufactured together with the lower planarization film. Also, the buffer layer 1301 and the dam 120 may be manufactured together with the upper planarization film (not shown), or only the buffer layer 1301 may be manufactured together with the upper planarization film.

FIG. 26B shows that the dam 120 is provided between the lower buffer layer 1301 and the planarization film 260.

According to another example of the present invention, it is possible to omit the dam 120.

Meanwhile, FIG. 26B shows that the lower buffer layer 1301 is provided in the periphery of the dam 120. According to another example of the present invention, the lower buffer layer 1301 may be provided between the dam 120 and the planarization film 260.

FIG. 26B shows that the dam 120 and the planarization film 260 are manufactured at the same time. According to another example of the present invention, the dam 120 may be manufactured together with the protection film 250 or the bank 284.

Figure 26C:
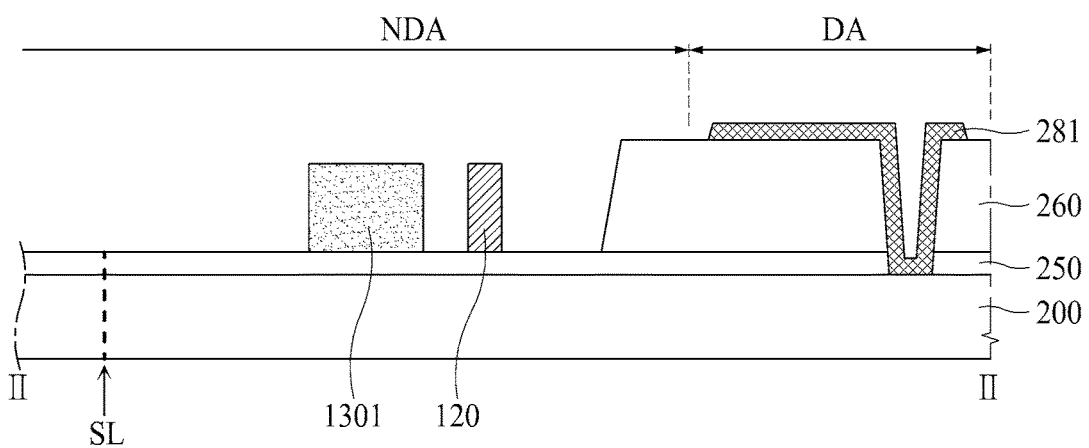

As shown in FIG. 26C, the contact hole (CH3) penetrating through the protection film 250 and the planarization film 260 is provided to expose the source or drain electrode of the thin film transistor 210, and the second electrode 281 is formed. The second electrode 281 may be formed of a metal material with high reflectance, and more particularly, a deposition structure of aluminum and titanium (Ti/Al/Ti), a deposition structure of aluminum and Indium Tin Oxide (ITO/AL/ITO), an APC alloy, and a deposition structure of APC alloy and Indium Tin Oxide (ITO/APC/ITO). Herein, the APC alloy is an alloy of argentums (Ag), palladium (Pd), and copper (Cu).

Figure 26D:
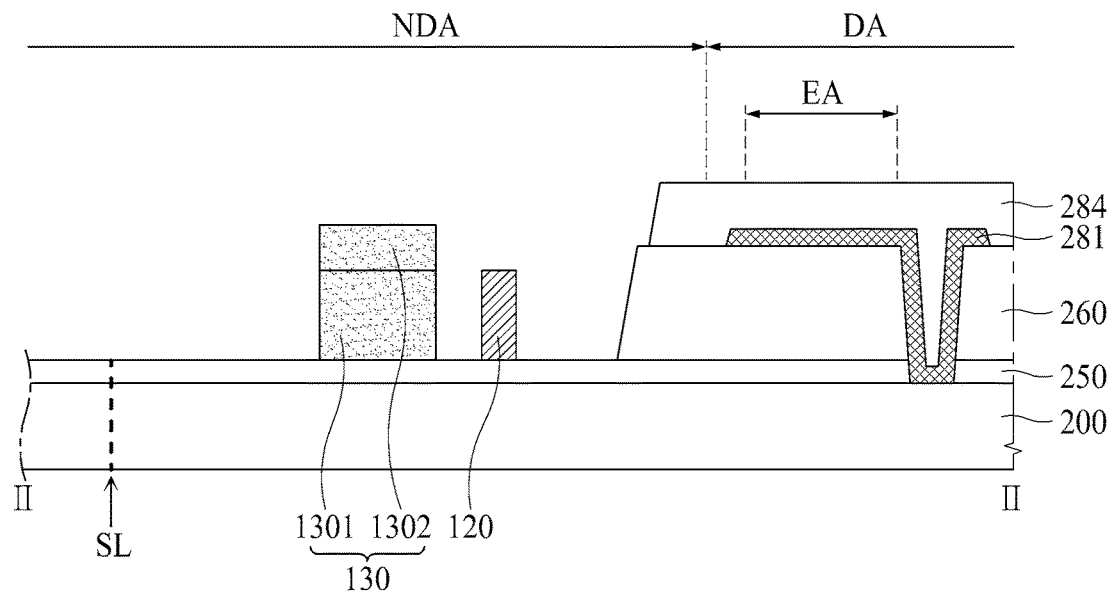

As shown in FIG. 26D, the bank 284 and an upper buffer layer 1302 are formed. In more detail, the bank 284 is provided to cover the edge of the second electrode 281 on the planarization film 260, to thereby divide the light-emission area (EA). Then, the upper buffer layer 1302 is provided on the lower buffer layer 1301. Each of the bank 284 and the upper buffer layer 1302 may be formed of an organic film of an organic material, for example, acryl resin, epoxy resin, phenolic resin, polyamide resin, polyimide resin, and etc.

Figure 26E:
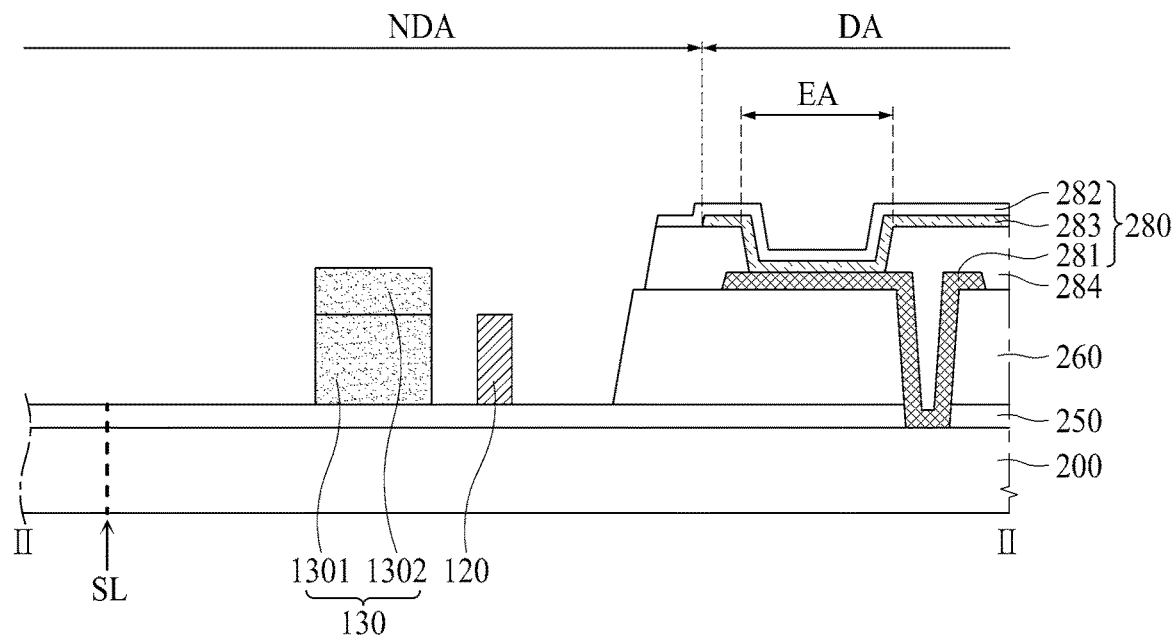

As shown in FIG. 26E, the light emitting layer 283 and the first electrode 282 are provided. In more detail, the light emitting layer 283 is provided on the second electrode 281 and the bank 284. Then, the first electrode 282 is provided on the light emitting layer 283. The first electrode 282 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). The capping layer may be provided on the first electrode 282.

Figure 26F:
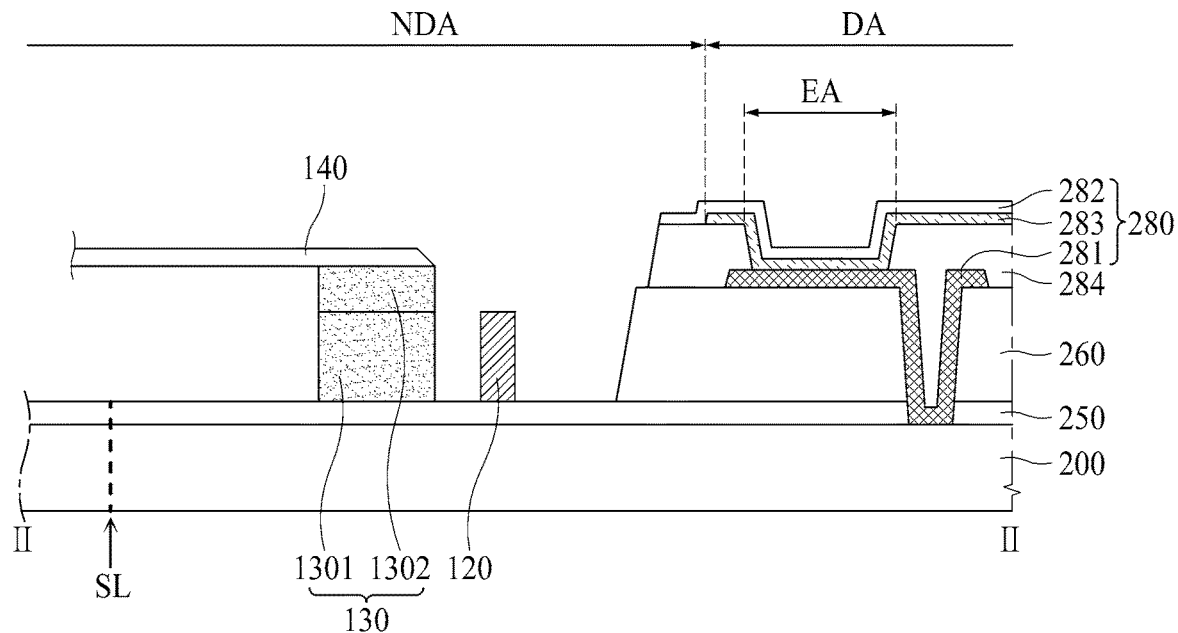

Then, the mask 140 is disposed on the buffer layer 130 (S2502). In more detail, as shown in FIG. 26F, the mask 140 is disposed on the upper buffer layer 1302 while being in contact with the upper buffer layer 1302.

Thereafter, an inorganic film is provided to cover the display area (DA) (S2503).

Figure 26G:
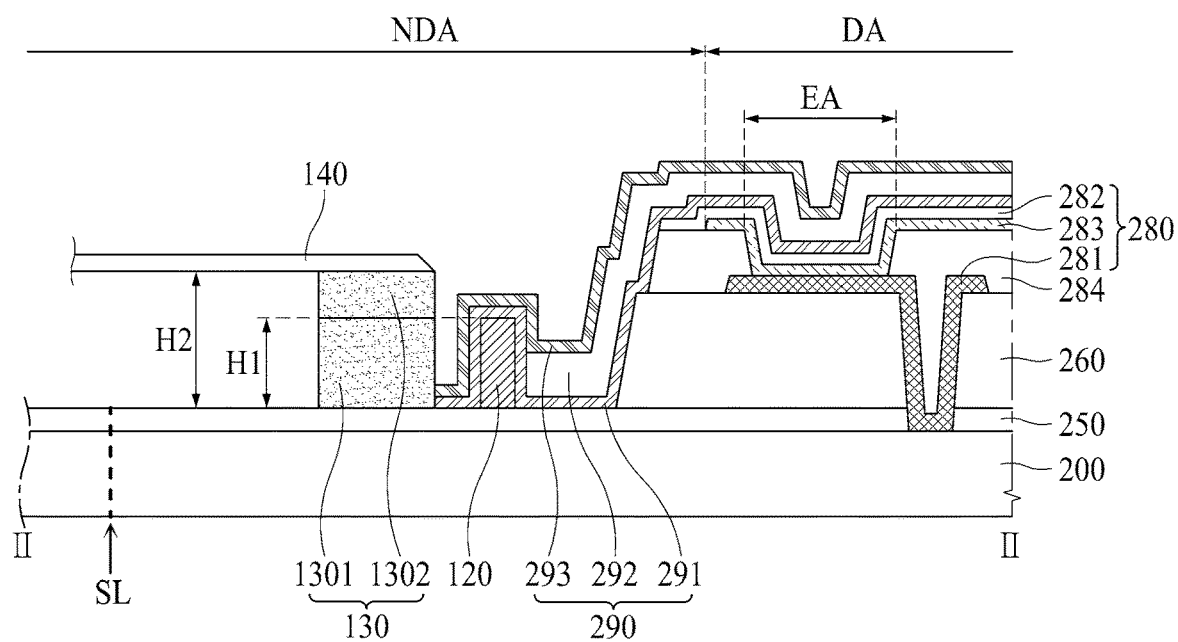

As shown in FIG. 26G, the first inorganic film 291, the organic film 292, and the second inorganic film 293 are provided. In more detail, the first inorganic film 291 is provided to cover the display area (DA). In this case, the first inorganic film 291 is formed in the remaining area except the area with the mask 140 by the CVD method or the ALD method. The first inorganic film 291 may be formed of silicon nitride, aluminum nitride, zirconium nitride, titanium nitride, hafnium nitride, tantalum nitride, silicon oxide, aluminum oxide, or titanium oxide.

Then, the organic film 292 is provided to cover the first inorganic film 291, and not to cover the dam 120. The organic film 292 may be formed of an organic material capable of transmitting 99% or more than 99% of the light emitted from the light emitting layer 283, for example, acryl resin, epoxy resin, phenolic resin, polyamide resin, polyimide resin, and etc.

Then, the second inorganic film 293 is provided to cover the organic film 292. In this case, the second inorganic film 293 is provided in the remaining area except the area with the mask 140 by the CVD method or the ALD method. The second inorganic film 293 may be formed of silicon nitride, aluminum nitride, zirconium nitride, titanium nitride, hafnium nitride, tantalum nitride, silicon oxide, aluminum oxide, or titanium oxide.

As shown in FIG. 26G, the organic film 292 and the second inorganic film 293 are provided on the first inorganic film 291. According to another example of the present invention, it is possible not to provide the organic film 292 and the second inorganic film 293. Also, if the organic film 292 is formed in a double-layered structure including two layers, a third inorganic film (not shown) may be interposed between the two layers of the organic film 292.

Figure 26H:
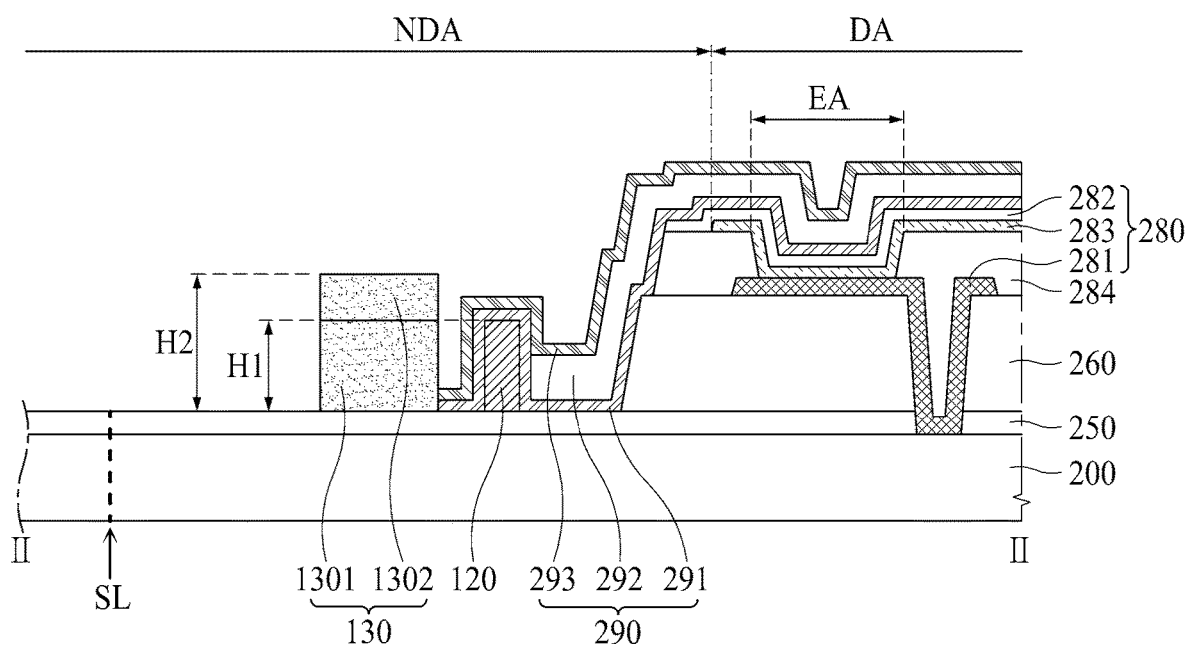

Then, the mask 140 is removed (S2504). In more detail, as shown in FIG. 26H, the mask 140 disposed on the upper buffer layer 1302 is removed. In more detail, after removing the mask 140 disposed on the upper buffer layer 1302, although not shown, the first and second substrates 111 and 112 are bonded to each other. If the plurality of display devices are manufactured at the same time by the use of one mother substrate, a scribing process is carried out to divide the plurality of display panels on the mother substrate into the plurality of display devices. The scribing line (SL) is formed between each of the neighboring display panels, and a cutting process is carried out along the scribing line (SL), to thereby obtain the display device by separating the plurality of display panels from each other.

According to the embodiment of the present invention, the first inorganic film 291 and the second inorganic film 293 are not provided in the scribing line (SL) by the use of buffer layer 130. Thus, it is possible to prevent cracks in the first inorganic film 291 and the second inorganic film 293 for the scribing process. Accordingly, it is possible to prevent the deterioration of the light emitting device 280.

Figure 27:
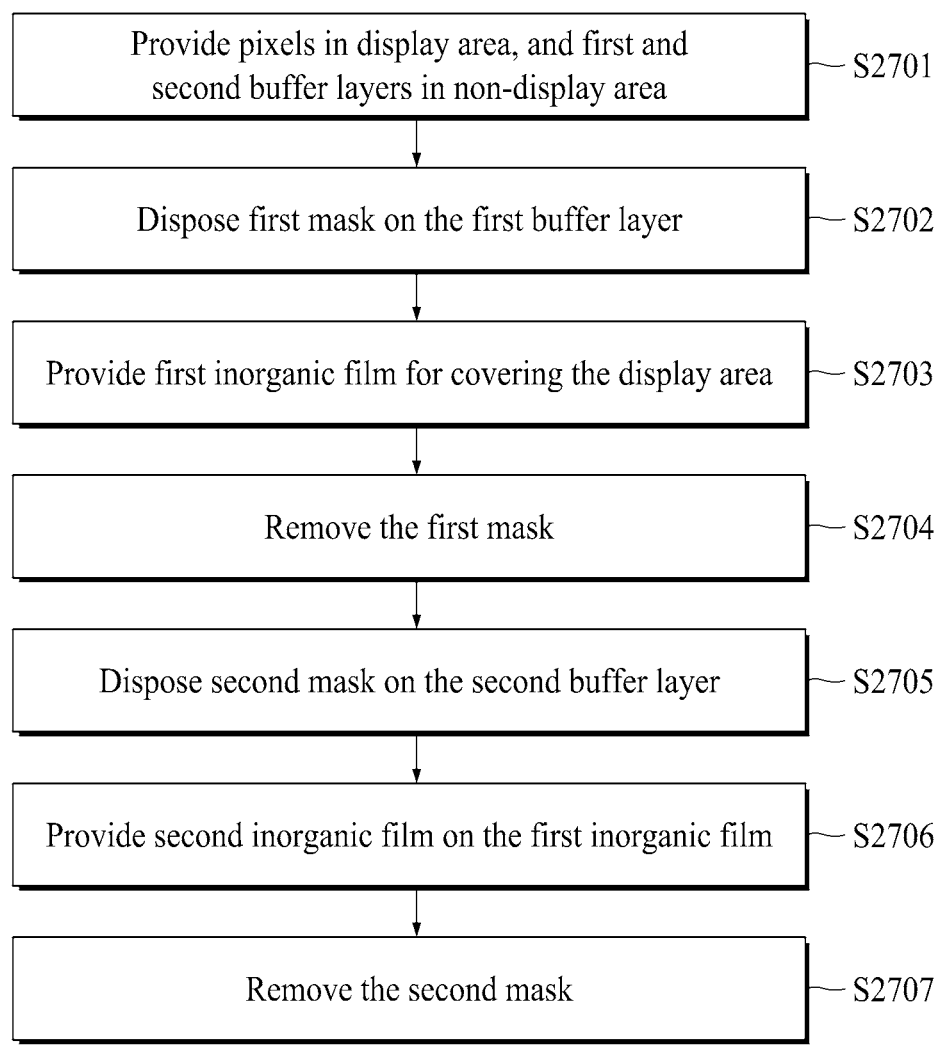
FIG. 27 is a flow chart illustrating a method for manufacturing a display device according to the second embodiment of the present invention.

FIG. 27 is a flow chart illustrating a method for manufacturing the display device according to the second embodiment of the present invention. FIGS. 28A to 28L are cross sectional views illustrating the method for manufacturing the display device according to the second embodiment of the present invention.

First, the pixel (P) is formed in the display area (DA), and the first buffer layer 132 and the second buffer layer 134 are formed in the non-display area (NDA) (S2701).

Figure 28A:
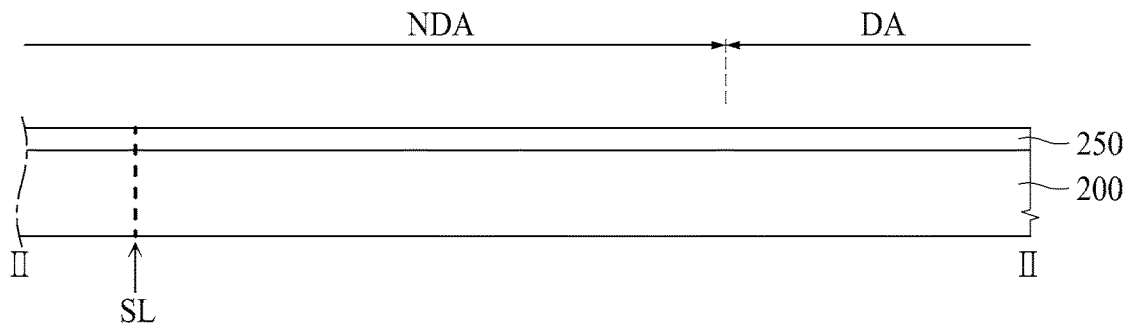
FIGS. 28A, 28B, 28C, 28D, 28E, 28F, 28G, 28H, 28I, 28J, 28K, and 28L are cross sectional views illustrating the method for manufacturing the display device according to the second embodiment of the present invention.

In more detail, as shown in FIG. 28A, the TFT substrate 200 is prepared, and the protection film 250 is formed on the TFT substrate 200. The protection film 250 functions as an insulating film. The protection film 250 may be formed in a single-layered structure of the inorganic insulating material such as silicon oxide (SiOx) or silicon nitride (SiNx), or a multi-layered structure of the above silicon oxide (SiOx) and silicon nitride (SiNx).

Figure 28B:
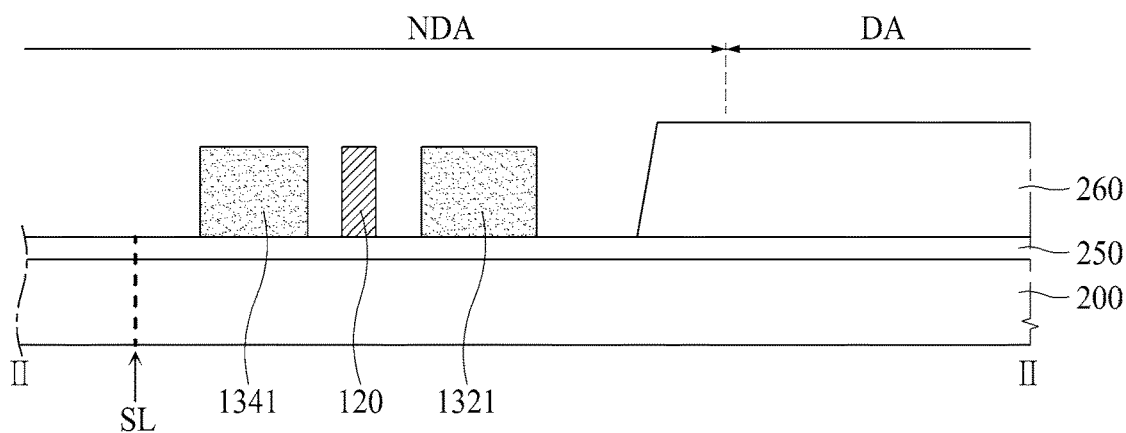

As shown in FIG. 28B, the planarization film 260, the dam 120, a first lower buffer layer 1321, and a second lower buffer layer 1341 are provided. In more detail, the planarization film 260, the dam 120, the first lower buffer layer 1321, and the second lower buffer layer 1341 are provided on the protection film 250. In this case, the dam 120 is provided between the first lower buffer layer 1321 and the second lower buffer layer 1341 in the non-display area (NDA). The first lower buffer layer 1321 is provided between the dam 120 and the planarization film 260 in the non-display area (NDA). The second lower buffer layer 1341 is provided in the periphery of the dam 120 in the non-display area (NDA).

Each of the planarization film 260, the dam 120, the first lower buffer layer 1321, and the second lower buffer layer 1341 may be formed of an organic film of an organic material, for example, acryl resin, epoxy resin, phenolic resin, polyamide resin, polyimide resin, and etc.

In FIG. 28B, the dam 120 is provided. According to another example of the present invention, it is possible to omit the dam 120.

FIG. 28B shows that the dam 120 and the planarization film 260 are manufactured at the same time. According to another example of the present invention, the dam 120 may be manufactured together with the protection film 250 or the bank 284.

Figure 28C:
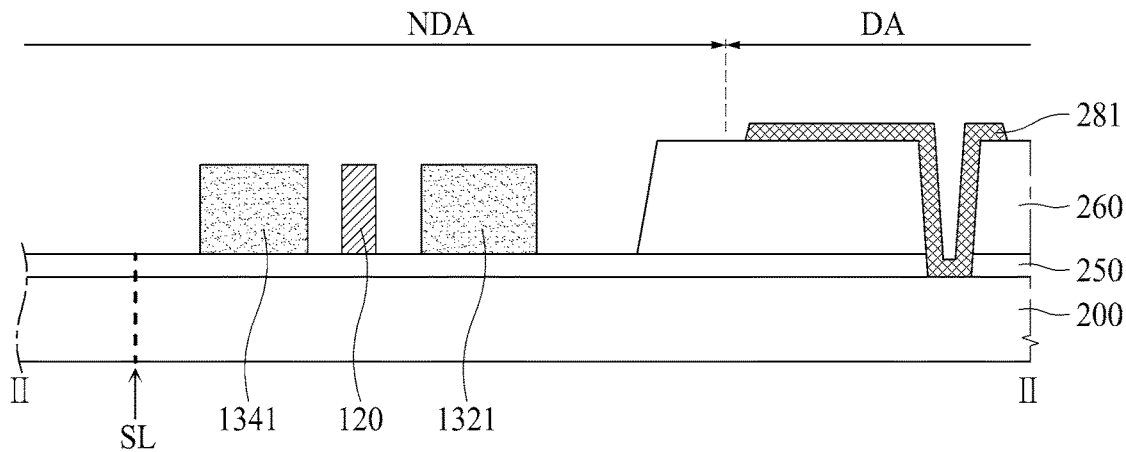

As shown in FIG. 28C, the contact hole (CH3) penetrating through the protection film 250 and the planarization film 260 is provided to expose the source or drain electrode of the thin film transistor 210, and the second electrode 281 is formed. The second electrode 281 may be formed of a metal material with high reflectance, and more particularly, a deposition structure of aluminum and titanium (Ti/Al/Ti), a deposition structure of aluminum and Indium Tin Oxide (ITO/AL/ITO), an APC alloy, and a deposition structure of APC alloy and Indium Tin Oxide (ITO/APC/ITO). Herein, the APC alloy is an alloy of argentums (Ag), palladium (Pd), and copper (Cu).

Figure 28D:
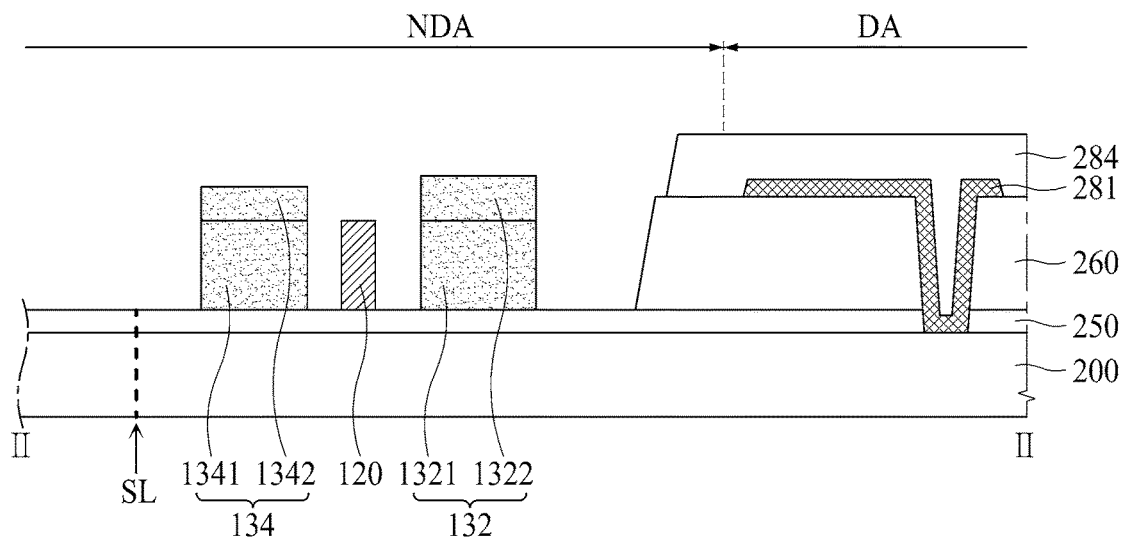

As shown in FIG. 28D, the bank 284, the first upper buffer layer 1322, and the second upper buffer layer 1342 are provided. In more detail, the bank 284 is provided to cover the edge of the second electrode 281 on the planarization film 260, to thereby divide the light-emission area (EA). Then, the first upper buffer layer 1322 is provided on the first lower buffer layer 1321, and the second upper buffer layer 1342 is provided on the second lower buffer layer 1341.

Each of the bank 284, the first upper buffer layer 1322, and the second upper buffer layer 1342 may be formed of an organic film of an organic material, for example, acryl resin, epoxy resin, phenolic resin, polyamide resin, polyimide resin, and etc.

Figure 28E:
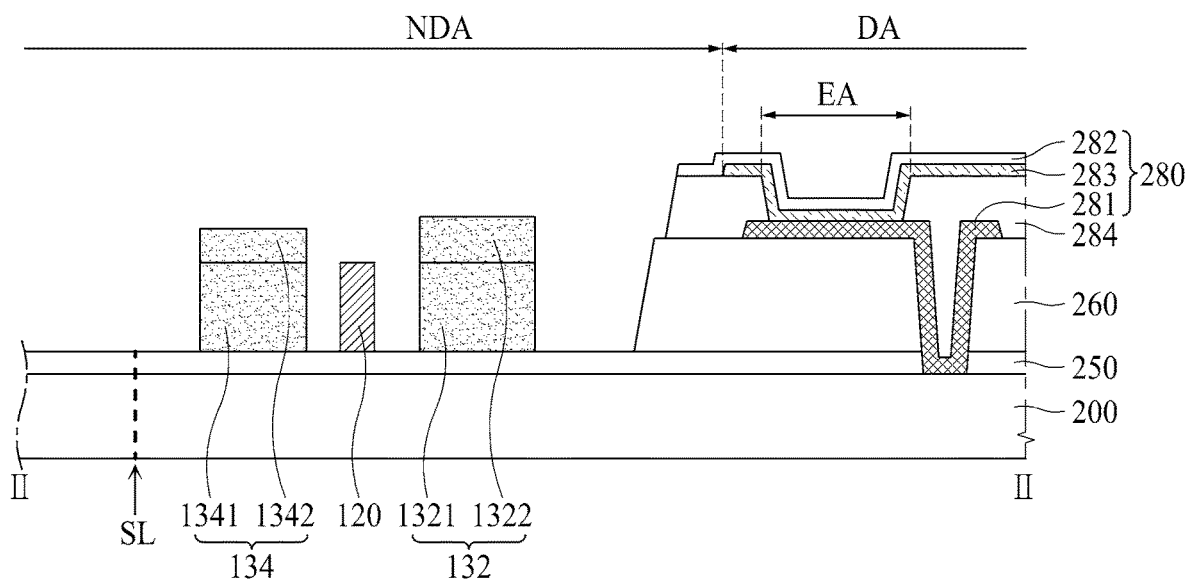

As shown in FIG. 28E, the light emitting layer 283 and the first electrode 282 are provided. In more detail, the light emitting layer 283 is provided on the second electrode 281 and the bank 284. Then, the first electrode 282 is provided on the light emitting layer 283. The first electrode 282 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). The capping layer may be provided on the first electrode 282.

Figure 28F:
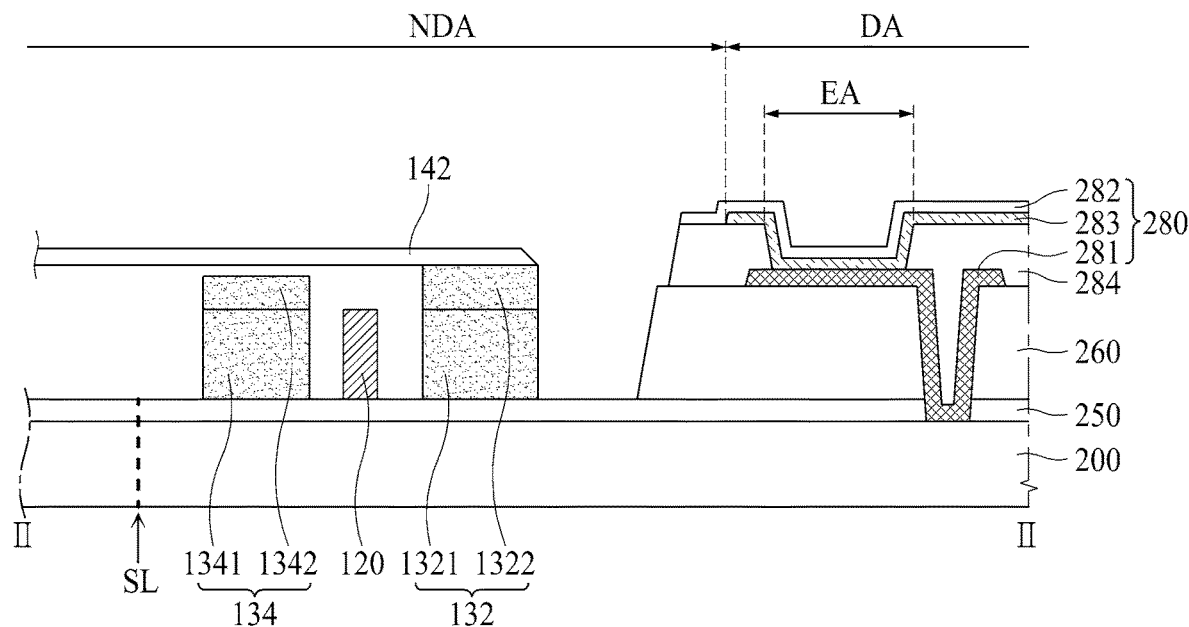

Then, the first mask 142 is disposed on the first buffer layer 132 (S2702). In more detail, as shown in FIG. 28F, the first mask 142 is disposed on the first upper buffer layer 1322 while being in contact with the first upper buffer layer 1322.

Thereafter, the first inorganic film 291 is provided to cover the display area (DA) (S2703).

Figure 28G:
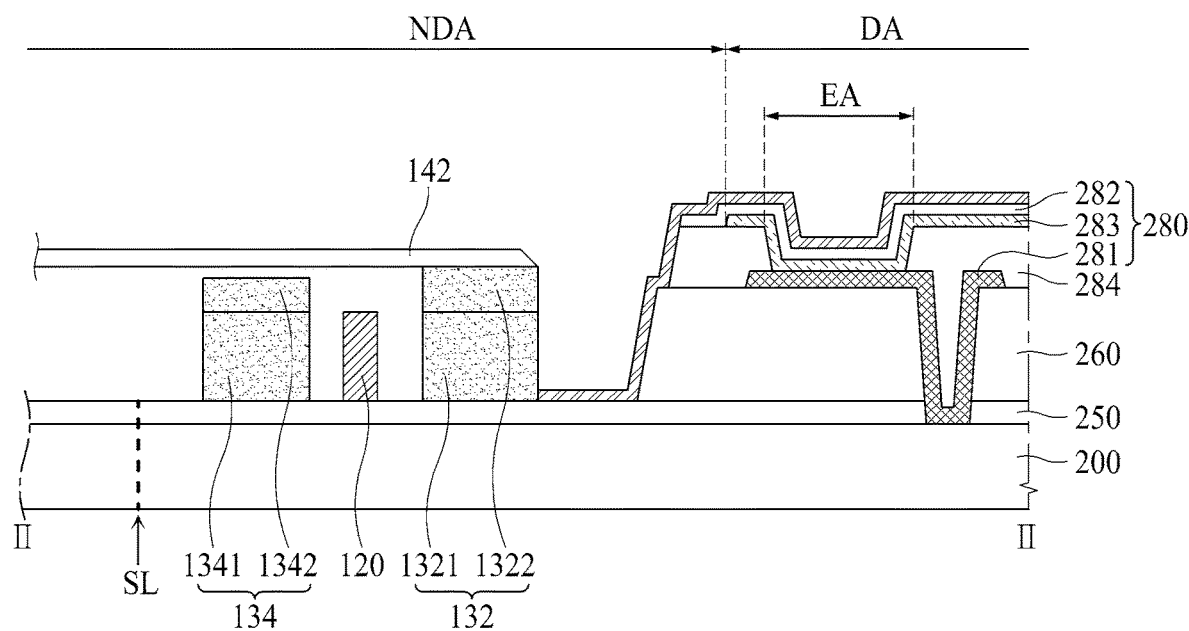

As shown in FIG. 28G, the first inorganic film 291 is provided. In more detail, the first inorganic film 291 is provided to cover the display area (DA). In this case, the first inorganic film 291 is formed in the remaining area except the area with the first mask 142 by the CVD method or the ALD method. The first inorganic film 291 may be formed of silicon nitride, aluminum nitride, zirconium nitride, titanium nitride, hafnium nitride, tantalum nitride, silicon oxide, aluminum oxide, or titanium oxide.

Figure 28H:
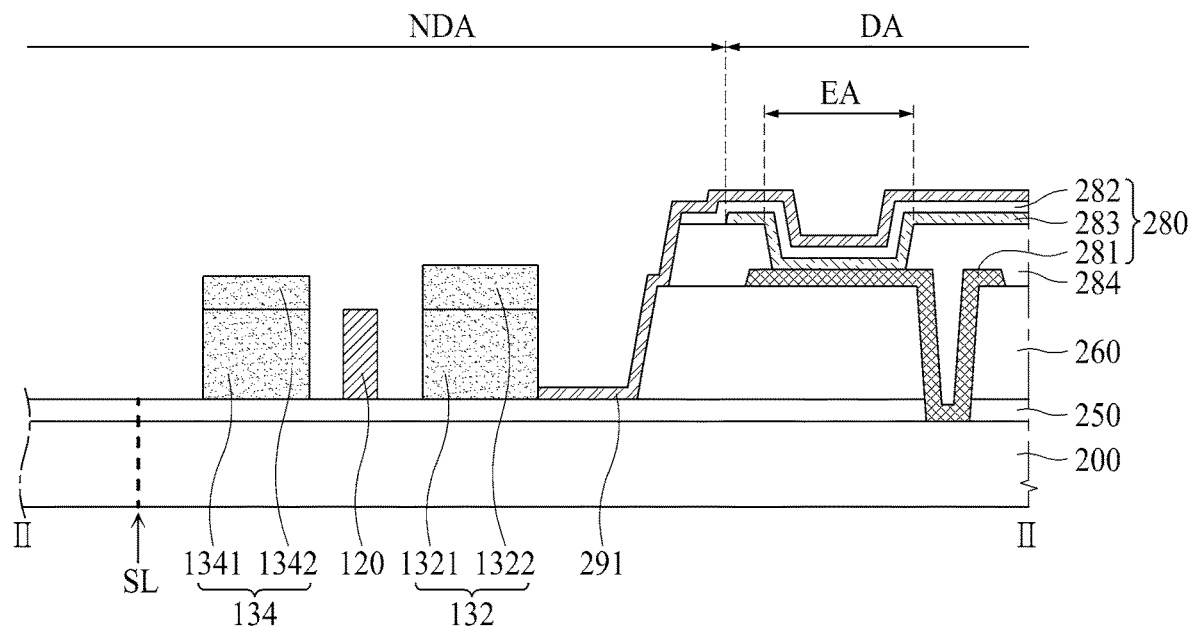

Then, the first mask 142 is removed (S2704). In more detail, the first mask 142 disposed on the first buffer layer 132 is removed, as shown in FIG. 28H. Also, as shown in FIG. 28H, the organic film 292 is provided to cover the first inorganic film 291, and not to cover the dam 120. The organic film 292 may be formed of an organic material capable of transmitting 99% or more than 99% of the light emitted from the light emitting layer 283, for example, acryl resin, epoxy resin, phenolic resin, polyamide resin, polyimide resin, and etc.

Figure 28I:
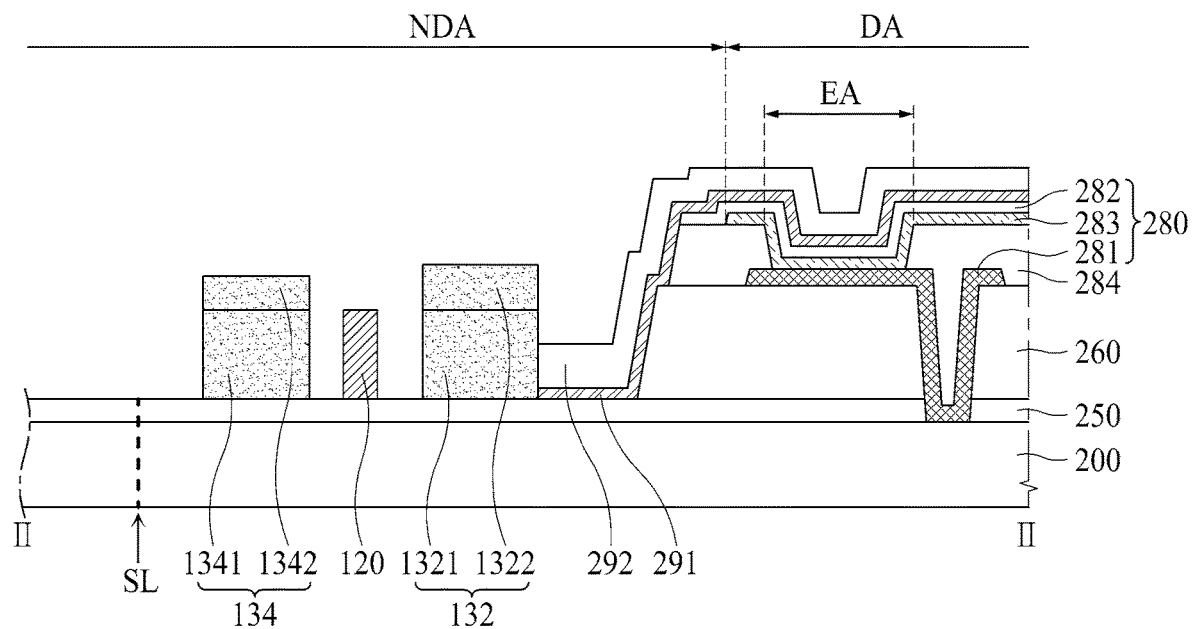

In FIG. 28I, the organic film 292 is provided on the first inorganic film 291. According to another example of the present invention, it is possible not to provide the organic film 292.

Figure 28J:
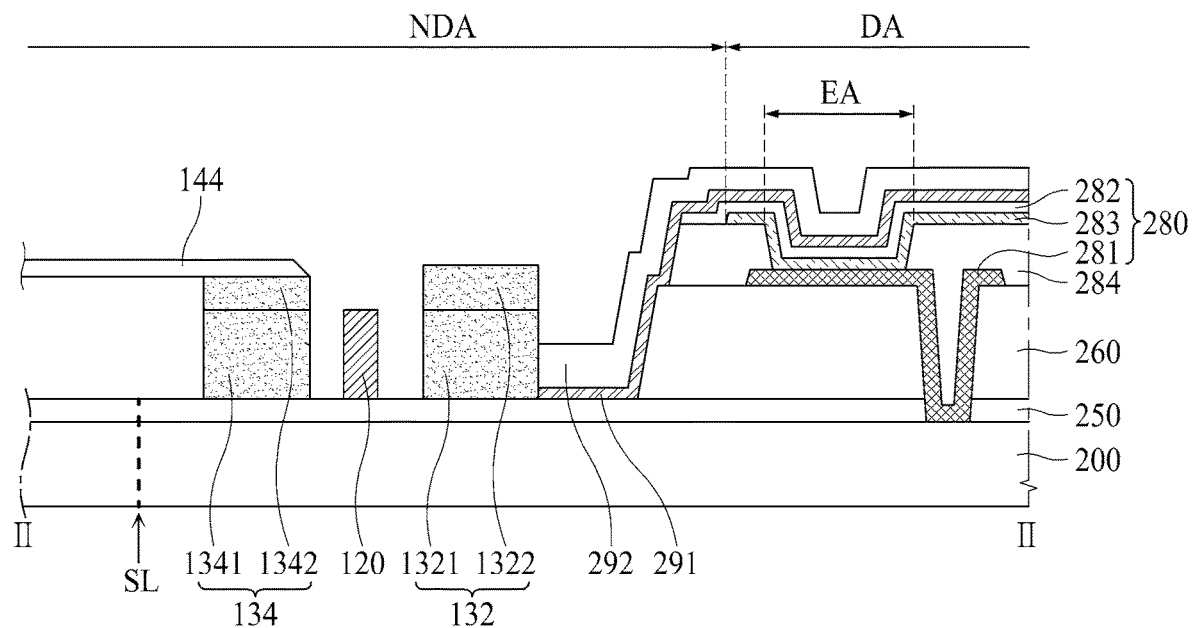

Then, the second mask 144 is disposed on the second buffer layer 134 (S2705). In more detail, as shown in FIG. 28J, the second mask 144 is disposed on the second upper buffer layer 1342 while being in contact with the second upper buffer layer 1342. In this case, an area of the second mask 144 is relatively smaller than an area of the first mask 142 so that the second inorganic film 293 is relatively larger than the first inorganic film 291.

Figure 28K:
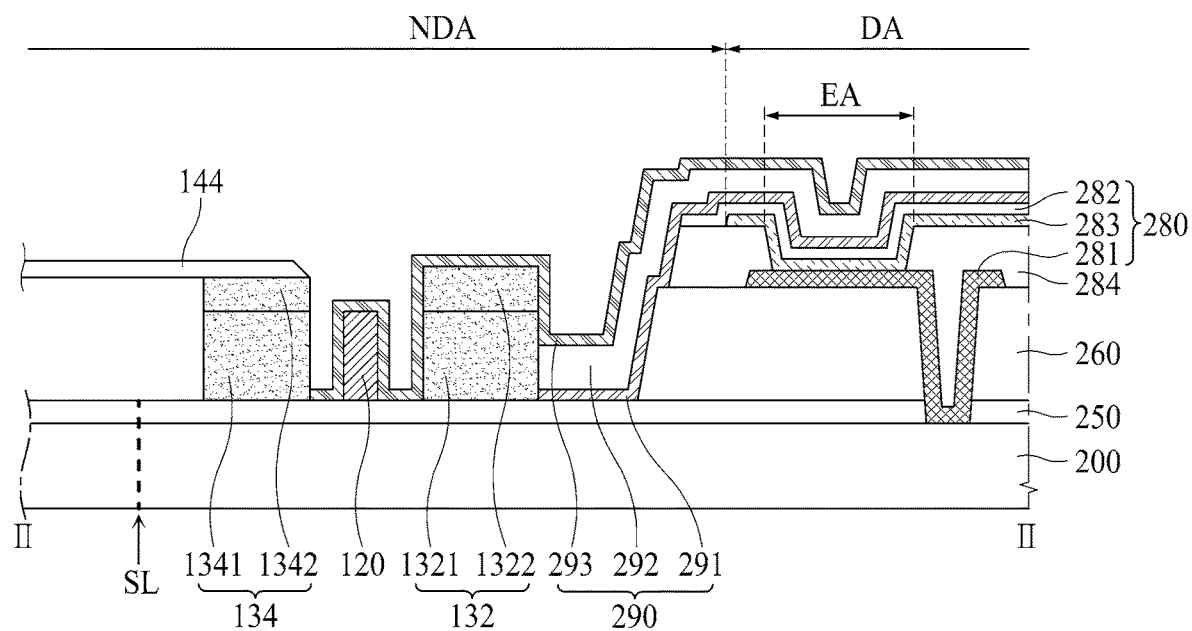

Then, the second inorganic film 293 is provided on the first inorganic film 291 (S2706). In more detail, as shown in FIG. 28K, the second inorganic film 293 is provided to cover the organic film 292. In this case, the second inorganic film 293 is provided in the remaining area except the area with the second mask 144 by the CVD method or the ALD method. The second inorganic film 293 may be formed of silicon nitride, aluminum nitride, zirconium nitride, titanium nitride, hafnium nitride, tantalum nitride, silicon oxide, aluminum oxide, or titanium oxide.

Figure 28L:
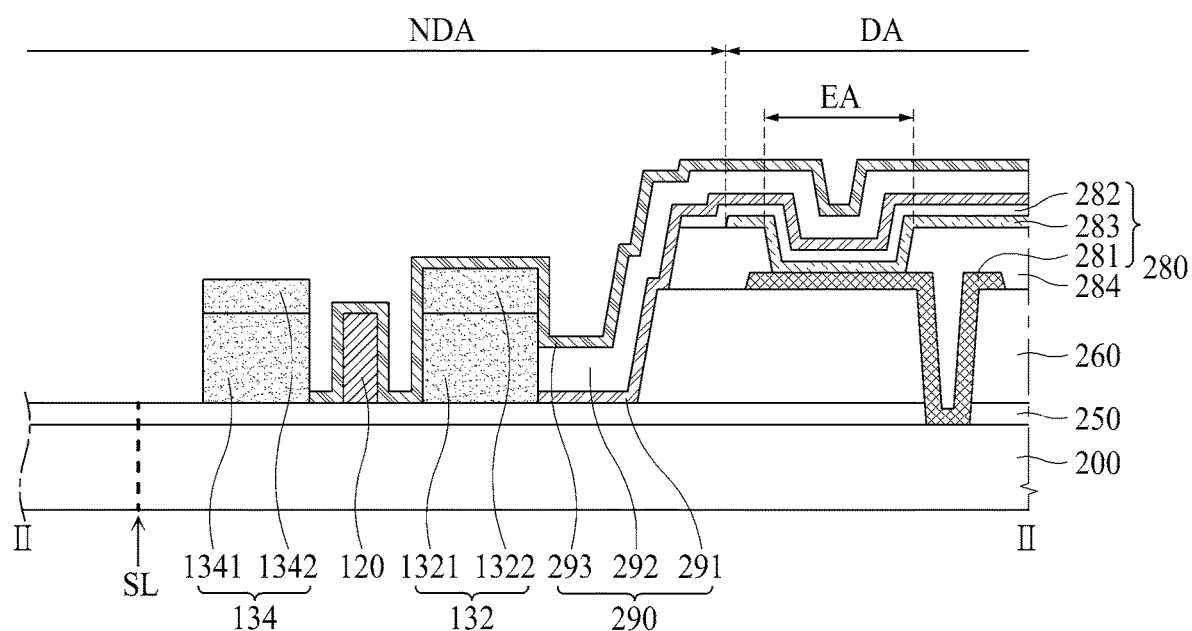

Then, the second mask 144 is removed (S2707). In more detail, as shown in FIG. 28L, the second mask 144 disposed on the second buffer layer 134 is removed. Although not shown, the first and second substrates 111 and 112 are bonded to each other. If the plurality of display devices are manufactured at the same time by the use of one mother substrate, a scribing process is carried out to divide the plurality of display panels on the mother substrate into the plurality of display devices. The scribing line (SL) is formed between each of the neighboring display panels, and a cutting process is carried out along the scribing line (SL), to thereby obtain the display device by separating the plurality of display panels from each other.

Eighth Embodiment

Figure 29:
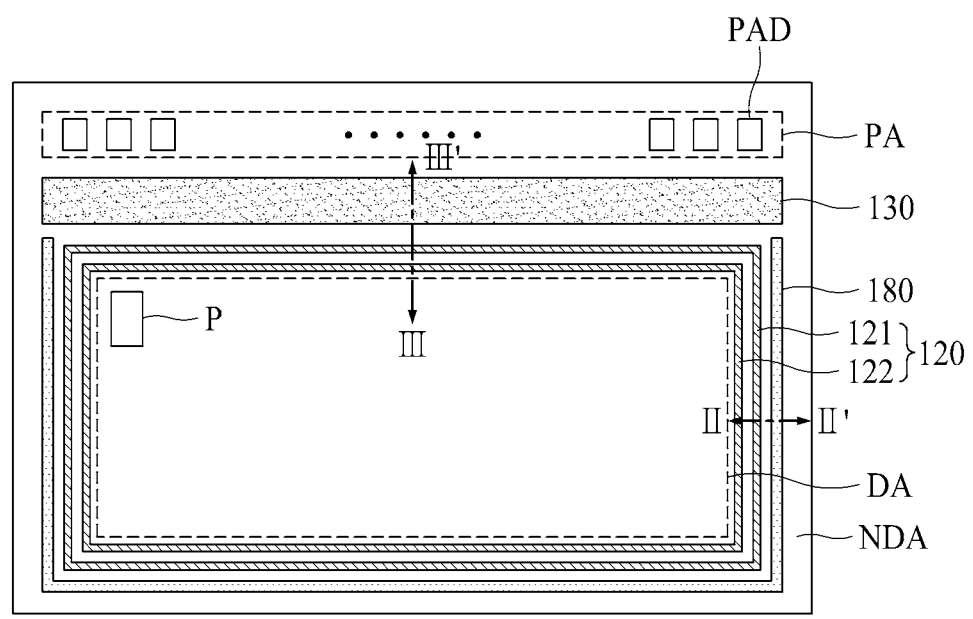
FIG. 29 is a plane view illustrating a first substrate according to the eighth embodiment of the present invention.
Figure 30:
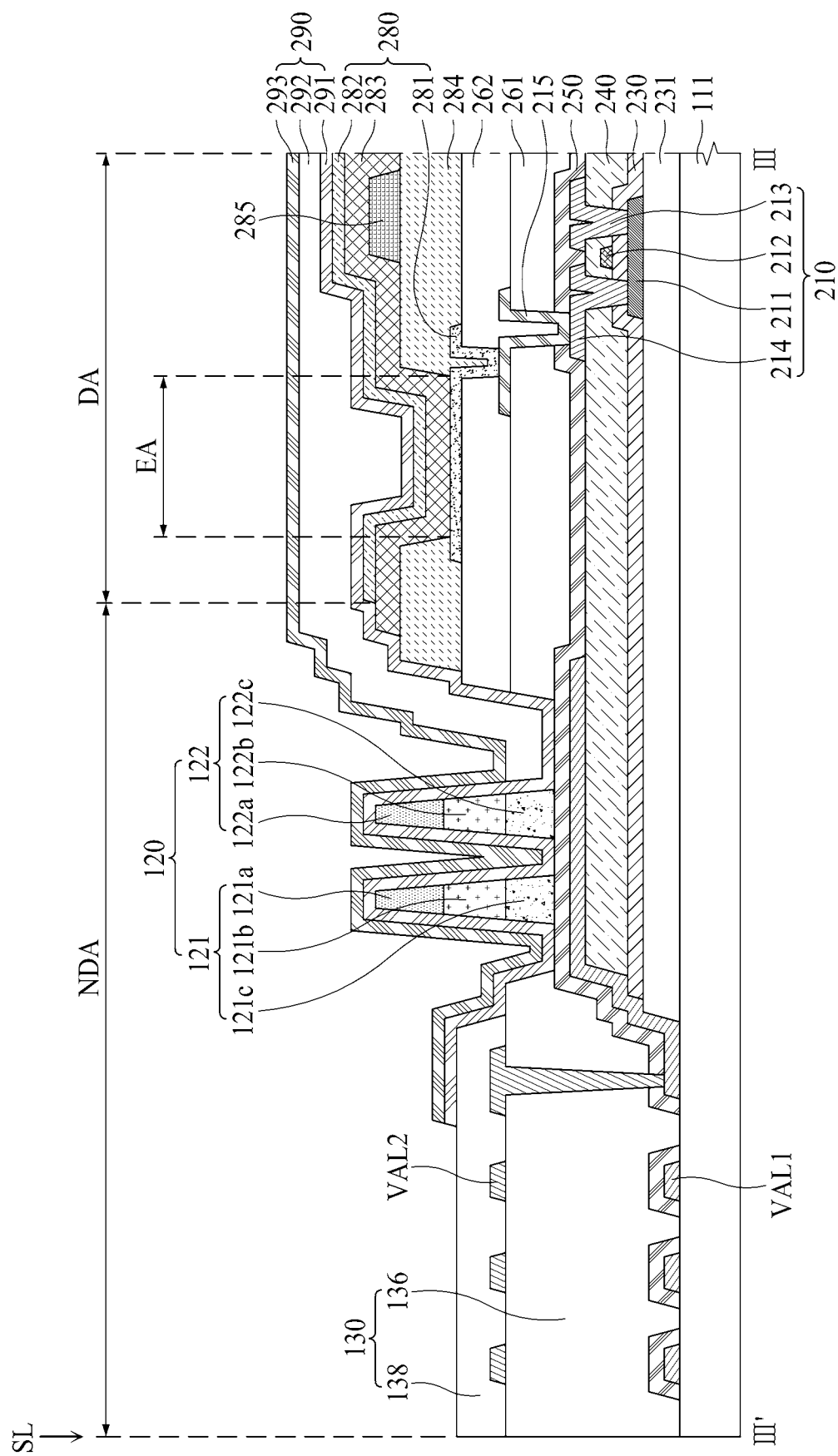
FIG. 30 is a cross sectional view along III-III' of FIG. 29.
Figure 31:
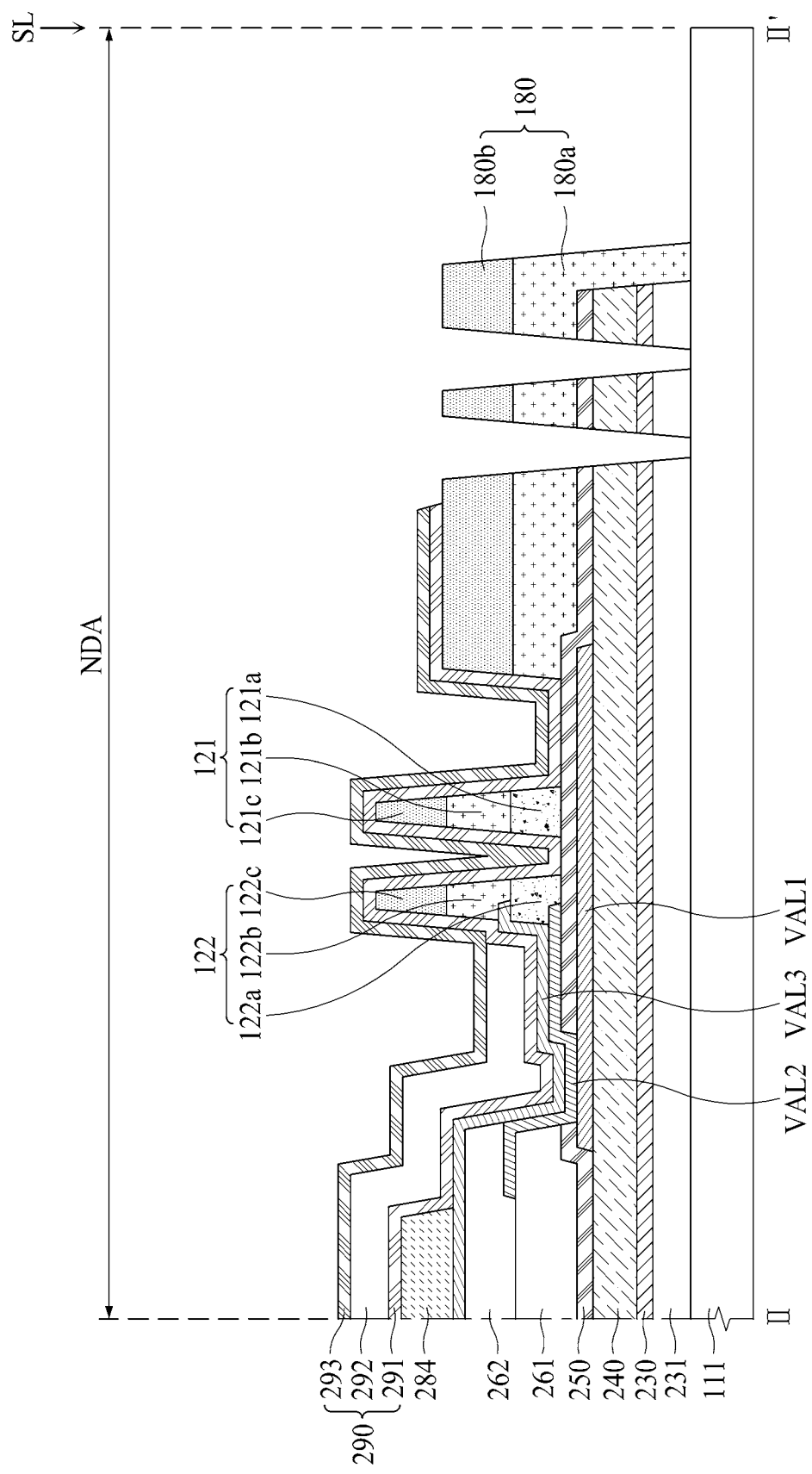
FIG. 31 is a cross sectional view along II-II' of FIG. 29.

FIG. 29 is a plane view illustrating a first substrate according to the eighth embodiment of the present invention. FIG. 30 is a cross sectional view along III-III' of FIG. 29. FIG. 31 is a cross sectional view along II-II' of FIG. 29.

Referring to FIGS. 29 to 31, the first substrate 111 is divided into a display area (DA) and a non-display area (NDA).

In the display area (DA), there are pixels (P) for displaying an image. Each of the pixels (P) may include a thin film transistor 210, a light emitting device 280, and an auxiliary electrode 215. The light emitting device 280 includes a second electrode 281, a light emitting layer 283, and a first electrode 282. If a gate signal is supplied from a gate line to each pixel (P) through the use of thin film transistor 210, a predetermined current is supplied to the light emitting device 280 in accordance with a data voltage of a data line. Accordingly, the light emitting device 280 for each of the pixels (P) may emit light with a predetermined brightness in accordance with the predetermined current.

In the non-display area (NDA), there are a pad area (PA) with pads, a dam 120, a buffer layer 130, and an auxiliary buffer layer 180.

The pad area (PA) may be provided at one peripheral side of the first substrate 111. The pad area (PA) includes the plurality of pads, and the plurality of pads are electrically connected with lines of a flexible film by the use of anisotropic conducting film (ACF).

The dam 120 may include a first dam 122 and a second dam 121. The first dam 122 and the second dam 121 surround the display area (DA), and at least one of the first dam 122 and the second dam 121 prevents a flow of an organic film 292. Also, the first dam 122 and the second dam 121 are disposed between the display area (DA) and the pad area (PA), to thereby prevent the organic film 292 for an encapsulation film 290 of the pixel (P) from overflowing and being positioned in the pad area (PA).

The buffer layer 130 is positioned in the non-display area (NDA) and is provided at a predetermined interval from the display area (DA). For example, the buffer layer 130 may be disposed between the display area (DA) and the pad area (PA), and the buffer layer 130 may protect the lines for connecting the pad (PAD) of the pad area (PA) with the pixel (P) of the display area (DA) from static electricity. Also, the buffer layer 130 may support a mask apparatus used for forming a first inorganic film 291 or a second inorganic film 293 included in the encapsulation film 290.

The auxiliary buffer layer 180 is positioned in the non-display area (NDA) and is provided at a predetermined interval from the display area (DA). For example, the auxiliary buffer layer 180 may be positioned in the non-display area (NDA) and may be provided at a predetermined interval from the second dam 121 of the dam 120. Also, the auxiliary buffer layer 180 may support the mask apparatus used for forming the first inorganic film 291 or the second inorganic films 293 included in the encapsulation film 290.

Hereinafter, the structure of the pixel (P) in the display area (DA), the dam 120, the buffer layer 130, and the auxiliary buffer layer 180 according to the eighth embodiment of the present invention will be described with reference to FIGS. 30 and 31.

FIG. 30 is a cross sectional view along III-III' of FIG. 29. FIG. 30 is a cross sectional view showing one example of the dam 120 and the buffer layer 130 in the non-display area, and the pixel (P) of the display area (DA).

Referring to FIG. 30, the thin film transistor 210 and the light emitting device 280 may be formed on one surface of the first substrate 111 in the display area (DA).

A buffer film 231 is provided on the first substrate 111 so as to protect the thin film transistors 210 from moisture permeating through the first substrate 111 which is vulnerable to moisture permeability.

Each of the thin film transistors 210 includes an active layer 211, a gate electrode 212, a source electrode 213, and a drain electrode 214. In FIG. 30, the thin film transistor 210 is provided in a top gate type where the gate electrode 212 is positioned above the active layer 211, but not limited to this type. For example, the thin film transistor 210 may be provided in a bottom gate type where the gate electrode 212 is positioned below the active layer 211, or a double gate type where the gate electrode 212 is positioned both above and below the active layer 211.

The active layer 211 is provided on the buffer film 231 of the first substrate 111. The active layer 211 may be formed a silicon-based semiconductor material or an oxide-based semiconductor material. A light shielding layer may be provided on the first substrate 111 so as to block external light being incident on the active layer 211.

A gate insulating film 230 may be provided on the active layer 211. The gate insulating film 220 may be formed in a single-layered structure of the inorganic insulating material such as silicon oxide (SiOx) or silicon nitride (SiNx), or a multi-layered structure of the above silicon oxide (SiOx) and silicon nitride (SiNx).

The gate electrode 212 may be provided on the gate insulating film 230. The gate electrode 212 may be formed in a single-layered structure or multi-layered structure among molybdenum (Mo), aluminum (Al), chrome (Cr), aurum (Au), titanium (Ti), nickel (Ni), neodymium (Nd), copper (Cu) and their alloys, but not limited to these materials.

An insulating interlayer 240 may be provided on the gate electrode 212. The insulating interlayer 240 may be formed in a single-layered structure of the inorganic insulating material such as silicon oxide (SiOx) or silicon nitride (SiNx), or a multi-layered structure of the above silicon oxide (SiOx), silicon nitride (SiNx) and their alloys.

The source electrode 213 and the drain electrode 214 may be provided on the insulating interlayer 240. Each of the source electrode 213 and the drain electrode 214 may be connected with the active layer 211 via contact holes penetrating through the gate insulating film 230 and the insulating interlayer 240. Each of the source electrode 213 and the drain electrode 214 may be formed in a single-layered structure or multi-layered structure among molybdenum (Mo), aluminum (Al), chrome (Cr), aurum (Au), titanium (Ti), nickel (Ni), neodymium (Nd), copper (Cu) and their alloys, but not limited to these materials.

A protection film 250 may be provided on the thin film transistor 210. The protection film 250 may serve as an insulating film. The protection film 250 may be formed in a single-layered structure of the inorganic material such as silicon oxide (SiOx) or silicon nitride (SiNx), or a multi-layered structure of the above silicon oxide (SiOx) and silicon nitride (SiNx).

A first planarization film 261 may be provided on the protection film 250 so as to planarize a step difference area caused by the thin film transistor 210. The first planarization film 261 may be formed of an organic film of an organic material, for example, acryl resin, epoxy resin, phenolic resin, polyamide resin, polyimide resin, and etc.

An auxiliary electrode 215 may be formed on the first planarization film 261 so as to electrically connect the drain electrode 214 and the second electrode 281 with each other. The auxiliary electrode 215 may be connected with the drain electrode 214 via a contact hole penetrating trough the first planarization film 261 and the protection film 250. The auxiliary electrode 215 may be formed in a single-layered structure or multi-layered structure among molybdenum (Mo), aluminum (Al), chrome (Cr), aurum (Au), titanium (Ti), nickel (Ni), neodymium (Nd), copper (Cu) and their alloys, but not limited to these materials.

A second planarization film 262 may be formed on the auxiliary electrode 215. The second planarization film 262 may be formed of an organic film of an organic material, for example, acryl resin, epoxy resin, phenolic resin, polyamide resin, polyimide resin, and etc.

The light emitting device 280 and bank 284 are provided on the second planarization film 262. The light emitting device 280 may include the first electrode 282, the light emitting layer 283, and the second electrode 281. The first electrode 282 may serve as a cathode electrode, and the second electrode 281 may serve as an anode electrode. A deposition area of the first electrode 282, the light emitting layer 283, and the second electrode 281 may be defined as a light-emission area (EA).

The second electrode 281 may be provided on the second planarization film 262. The second electrode 281 may be connected with the drain electrode 214 of the thin film transistor 210 via a contact hole penetrating through the second planarization film 262. The second electrode 281 may be formed of a metal material with high reflectance, and more particularly, a deposition structure of aluminum and titanium (Ti/Al/Ti), a deposition structure of aluminum and Indium Tin Oxide (ITO/AL/ITO), an APC alloy, and a deposition structure of APC alloy and Indium Tin Oxide (ITO/APC/ITO). Herein, the APC alloy is an alloy of argentums (Ag), palladium (Pd), and copper (Cu).

The bank 284 is provided to cover the edge of the second electrode 281 on the second planarization film 262, to thereby divide the light-emission area (EA). The bank 284 may be formed of an organic film of an organic material, for example, acryl resin, epoxy resin, phenolic resin, polyamide resin, polyimide resin, and etc.

A spacer 285 may be provided on the bank 284. The spacer 285 and the bank 284 may be formed of the same material.

The light emitting layer 283 is provided on the second electrode 281, the bank 284, and the spacer 285. The light emitting layer 283 may include a hole transporting layer, at least one light emitting layer, and an electron transporting layer. In this case, if a voltage is applied to the second electrode 281 and the first electrode 282, hole and electron are respectively moved to the light emitting layer via the hole transporting layer and the electron transporting layer, and are then combined to each other in the light emitting layer, to thereby emit light.

The first electrode 282 is provided on the light emitting layer 283. If an electroluminescent display device is formed in a top emission type, the first electrode 282 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). A capping layer may be provided on the first electrode 282.

The encapsulation film 290 is provided on the light emitting device 280. The encapsulation film 290 prevents moisture or oxygen from being permeated into the first electrode 282. To this end, the encapsulation film 290 may include at least one inorganic film and at least one organic film.

For example, the encapsulation film 290 may include the first inorganic film 291, the organic film 292, and the second inorganic film 293. In this case, the first inorganic film 291 covers the first electrode 282, and the organic film 292 is provided on the first inorganic film 291. The organic film 292 may be formed at a thickness enough to prevent particles from getting into the light emitting layer 283 and the first electrode 282 through the first inorganic film 291, preferably. The second inorganic film 293 covers the organic film 292.

Referring to FIG. 30, the encapsulation film 290 is formed on the first substrate 111 of the non-display area (NDA), the dam 120, and the buffer layer 130.

The encapsulation film 290 covers the light emitting device 280 provided in the display area (DA), to thereby prevent oxygen or moisture from being permeated into the light emitting device 280. In this case, the encapsulation film 290 may include at least one inorganic film and at least one organic film. For example, the encapsulation film 290 may include the first inorganic film 291, the organic film 292, and the second inorganic film 293. In this case, the first inorganic film 291 covers the first electrode 282, the organic film 292 is provided on the first inorganic film 291, and the second inorganic film 293 covers the organic film 292.

Each of the first and second inorganic films 291 and 293 may be formed of silicon nitride, aluminum nitride, zirconium nitride, titanium nitride, hafnium nitride, tantalum nitride, silicon oxide, aluminum oxide, or titanium oxide. The first and second inorganic films 291 and 293 may be deposited by a chemical vapor deposition (CVD) method or an atomic layer deposition (ALD) method, but not limited to this method.

The organic film 292 may be formed of a transparent material capable of transmitting the light emitted from the light emitting layer 283. The organic film 292 may be formed of an organic material capable of transmitting at least 99% of the light emitted from the light emitting layer 283, for example, acryl resin, epoxy resin, phenolic resin, polyamide resin, polyimide resin, and etc. The organic film 292 may be formed of a process using an organic material, for example, a vapor deposition method, a printing method, or a slit coating method, but not limited to these methods. The organic film 292 may be formed by an ink-jet process.

The dam 120 is provided to surround the periphery of the display area (DA), to thereby prevent the organic film 292 for the encapsulation film 290 from overflowing. The organic film 292 for the encapsulation film 290 has good covering properties and poor barrier properties, whereby the organic film 292 is encapsulated by the second inorganic film 293. However, if the organic film 292 flows out of a desired area, the organic film 292 is not encapsulated by the second inorganic film 293, whereby oxygen or moisture permeates through the exposed organic film 292. In order to overcome this problem, the dam 120 is provided to prevent the organic film 292 from overflowing, to thereby prevent the organic film 292 from being exposed to the outside of the display device.

Also, the dam 120 is disposed between the display area (DA) and the pad area (PA) so that it is possible to prevent the organic film 292 for the encapsulation film 290 from overflowing, and more particularly, to prevent the organic film 292 from flowing into the pad area (PA). If the organic film 292 for the encapsulation film 290 flows into the pad area (PA), it is difficult to make a proper electrical contact in the pad due to the organic film 292 flowing into the pad area (PA), whereby a driving defect or lighting inspection defect might occur. In order to overcome this problem, the dam 120 is provided to prevent the organic film 292 for the encapsulation film 290 from overflowing, to thereby prevent the organic film 292 from flowing into the pad area (PA).

As shown in FIG. 30, the dam 120 may include a first dam 122, and a second dam 121 provided at a predetermined interval from the first dam 122. The first dam 122 is disposed in the non-display area (NDA) and is provided to surround the peripheral area of the display area (DA). The second dam 121 is disposed at a predetermined interval from the first dam 122, and is provided to surround the first dam 122. The first dam 122 prevents the organic film 292 for the encapsulation film 290 from overflowing. If the organic film 292 flows out of the first dam 122, the second dam 121 provided at a predetermined interval from the first dam 122 prevents the flow of the organic film 292.

The first dam 122 and the second dam 121 may be formed in a single-layered structure including at least one of materials for the second planarization film 262 of the pixel (P), the bank 284, and the spacer 285, or a multi-layered structure including at least two of materials for the second planarization film 262 of the pixel (P), the bank 284, and the spacer 285. For example, as shown in FIG. 30, if each of the first dam 122 and the second dam 121 is formed in a three-layered structure including a lower layer 121c and 122c, a middle layer 121b and 122b, and an upper layer 121a and 122a, it may include the same materials as those of the second planarization film 262 of the pixel (P), the bank 284, and the spacer 285. The lower layer 121c and 122c in each of the first dam 122 and the second dam 121 may be formed of the same material as that of the second planarization film 262 of the pixel (P), the middle layer 121b and 122b on the lower layer 121c and 122c in each of the first dam 122 and the second dam 121 may be formed of the same material as that of the bank 284 of the pixel (P), and the upper layer 121a and 122a on the middle layer 121b and 122b in each of the first dam 122 and the second dam 121 may be formed of the same material as that of the spacer 285 of the pixel (P), but not limited to this structure. For example, the first dam 122 may be formed in a deposition structure of the same materials as those of the bank 284 and the spacer 285 of the pixel (P), and the second dam 121 may be formed in a deposition structure of the same materials as those of the second planarization film 262, the bank 284, and the spacer 285. In another way, the first dam 122 may be formed of the same material as that of the bank 284 of the pixel (P), and the second dam 121 may be formed in a deposition structure of the same materials as those of the second planarization film 262 and the bank 284 of the pixel (P).

The buffer layer 130 may be disposed in the non-display area (NDA), and may be provided at a predetermined interval from the dam 120. The buffer layer 130 supports a mask so that the mask is maintained at a predetermined interval from the first substrate 111 for a process of depositing the first inorganic film 291 or the second inorganic film 293. To this end, the mask is disposed on the buffer layer 130 while being in contact with the buffer layer 130.

As shown in FIGS. 29 and 30, the buffer layer 130 may be disposed between the pad area (PA) and the display area (DA). For example, the buffer layer 130 is disposed between the second dam 121 for the dam 120 and the pad area (PA) so that it is possible to prevent the first inorganic film 291 or the second inorganic film 293 from being formed in the pad area (PA). Also, the buffer layer 130 may protect lines (VAL1, VAL2) for electrically connecting the pad (PAD) of the pad area (PA) with the pixels (P) of the display area (DA) from static electricity.

Referring to FIG. 30, the buffer layer 130 may include a first buffer layer 136 and a second buffer layer 138. The first buffer layer 136 and the second buffer layer 138 may be disposed between the pad area (PA) and the dam 120. The first buffer layer 136 may be disposed on a first power source auxiliary line (VAL1) supplied with a power source voltage from the pad (PAD) of the pad area (PA), or may be disposed on a first data link line supplied with a data signal from the pad (PAD).

In this case, the first power source auxiliary line (VAL1) or the first data link line may be provided on the first substrate 111, and the first buffer layer 136 may be provided on the first power source auxiliary line (VAL1) or the first data link line. The first power source auxiliary line (VAL1) and the first data link line may be formed of the same material as that of the source and drain electrodes 213 and 214. The protection film 250 may be disposed between the first power source auxiliary line (VAL1)/first data link line and the first buffer layer 136, wherein the protection film 250 surrounds both lateral surfaces and upper surface of the first power source auxiliary line (VAL1) and first data link line.

A second power source auxiliary line (VAL2) or a second data link line may be provided on the first buffer layer 136, and the second power source auxiliary line (VAL2) and the second data link line may be formed of the same material as that of the auxiliary electrode 215 of the pixel (P). The second power source auxiliary line (VAL2) or the second data link line may be connected via a contact hole penetrating through the first buffer layer 136 and the protection film 250.

The second buffer layer 138 may be disposed on the second power source auxiliary line (VAL2) supplied with a power source voltage from the pad (PAD) of the pad area (PA), or may be disposed on the second data link line supplied with a data signal from the pad (PAD).

The first inorganic film 291 and the second inorganic film 292 included in the encapsulation film 290 may cover a predetermined portion of an upper surface of the second buffer layer 138.

The buffer layer 130 may protect the first power source auxiliary line (VAL1), the second power source auxiliary line (VAL2), the first data link line, and the second data link line, which are provided for electrically connecting the pad (PAD) of the pad area (PA) with the pixels (P) of the display area (PA), from static electricity. For example, the buffer layer 130 may prevent electricity fault (arcing problem) occurring for a process of forming the encapsulation film 290.

The auxiliary buffer layer 180 according to the eighth embodiment of the present invention will be described in detail with reference to FIG. 31. FIG. 31 is a cross sectional view along II-II' of FIG. 29. FIG. 31 is a cross sectional view showing one example of the auxiliary buffer layer 180 and the dam 120 in the non-display area (NDA). A detailed description for the same parts as those of FIG. 30 will be omitted.

Referring to FIG. 31, the first dam 122 and the second dam 121 constituting the dam 120 are disposed in the non-display area (NDA). As shown in FIG. 29, the first dam 122 and the second dam 121 are disposed in the non-display area (NDA), and are provided at a predetermined interval from the display area (DA). The first dam 122 is disposed in the non-display area (NDA) and is provided to surround the peripheral area of the display area (DA). The second dam 121 is disposed at a predetermined interval from the first dam 122, and is provided to surround the first dam 122. The first dam 122 prevents the organic film 292 for the encapsulation film 290 from overflowing. If the organic film 292 flows out of the first dam 122, the second dam 121 provided at a predetermined interval from the first dam 122 prevents the flow of the organic film 292.

At the lateral side of the display area (DA), the first power source auxiliary line (VAL1) may be formed on the insulating interlayer 240. The second power source auxiliary line (VAL2) is connected with the first power source auxiliary line (VAL1) disposed under the protection film 250 via the contact hole penetrating through the protection film 250. The second power source auxiliary line (VAL2) may be overlapped with a lower surface of the lower layer 122a of the first dam 122. A third power source auxiliary line (VAL3) formed on the second planarization film 262 is connected with the second power source auxiliary line (VAL2) through an opening for exposing the second power source auxiliary line (VAL2) in the area between the first dam 122 and an end of the first planarization film 261 and second planarization film 262. The third power source auxiliary line (VAL3) may be overlapped with an upper surface of the lower layer 122a of the first dam 122.

The first power source auxiliary line (VAL1) may be formed of the same material as that of the source electrode 213 and drain electrode 214 of the pixel (P). The second power source auxiliary line (VAL2) may be formed of the same material as that of the auxiliary electrode 215 of the pixel (P). The third power source auxiliary line (VAL3) may be formed of the same material as that of the second electrode 291 of the pixel (P).

The auxiliary buffer layer 180 may be disposed in the non-display area (NDA), and may be provided at a predetermined interval from the second dam 121 for the dam 120. The auxiliary buffer layer 180 supports the mask so that the mask is maintained at a predetermined interval from the first substrate 111 for a process of depositing the first inorganic film 291 or the second inorganic film 293. To this end, the mask is disposed on the auxiliary buffer layer 180 while being in contact with the auxiliary buffer layer 180.

After arranging the mask (not shown) on the auxiliary buffer layer 180, the first inorganic film 291 or the second inorganic film 293 is deposited thereon, whereby the first inorganic film 291 or the second inorganic film 293 is formed on the remaining areas except the area with the mask. For example, the auxiliary buffer layer 180 prevents the first inorganic film 291 or the second inorganic film 293 from being formed in the area between the mask and the first substrate 111, to thereby prevent the first inorganic film 291 or the second inorganic film 293 from being permeated into the area with the mask. Accordingly, the auxiliary buffer layer 180 is disposed between the dam 120 and a scribing line (SL), and the mask is in contact with the second buffer layer of the auxiliary buffer layer 180 so that it is possible to prevent the first inorganic film 291 or the second inorganic film 293 from being formed in the periphery of the auxiliary buffer layer 180, for example, the scribing line (SL). Thus, the first inorganic film 291 or the second inorganic film 293 may be partially overlapped with an upper surface of a second auxiliary buffer layer of the auxiliary buffer layer 180.

As shown in FIG. 29, the auxiliary buffer layer 180 may be arranged to surround at least three sides of the display area (DA). For example, the auxiliary buffer layer 180 may be arranged to surround the three sides of the display area (DA) except one side provided with the buffer layer 130. Accordingly, the first dam 122 is disposed in the non-display area (NDA) and is provided to surround the display area (DA). The second dam 121 is provided at a predetermined interval form the first dam 122, and is arranged to surround the first dam 122. In the area between the second dam 121 and the pad area (PA), the buffer layer 130 faces one side of the four sides of the display area (DA). The auxiliary buffer layer 180 may surround the three sides of the display area (DA) except one side facing the buffer layer 130. Among the four sides of the second dam 121 to surround the first dam 122, the three sides of the second dam 121 may be disposed between the display area (DA) and the auxiliary buffer layer 180, and the remaining one side of the second dam 121 may be disposed between the display area (DA) and the buffer layer 130.

Referring to FIG. 31, the auxiliary buffer layer 180 may include a first auxiliary buffer layer 180a provided on the protection film 250, and the second auxiliary buffer layer 180b provided on the first auxiliary buffer layer 180a.

The first auxiliary buffer layer 180a may be formed of the same material as that of the bank 284 of the pixel (P), and the second auxiliary buffer layer 180b may be formed of the same material as that of the spacer 285 of the pixel (P).

If both lateral sides of the display device are bent, cracks might occur in the auxiliary buffer layer 180. In order to prevent cracks in the display area (DA), grooves may be formed by patterning the first auxiliary buffer layer 180a and the second auxiliary buffer layer 180b. For example, grooves for exposing the first substrate 111 may be formed by removing the second auxiliary buffer layer 180b, the first auxiliary buffer layer 180a, the protection film 250, the insulating interlayer 240, the gate insulating film 230, and the buffer layer, whereby the grooves may be referred to as crack-prevention grooves.

The embodiments of the present invention may be described as follows.

The display device according to one or more embodiments of the present invention may include the substrate having the display area with the pixels and the non-display area for surrounding the display area, the encapsulation film with the inorganic film for covering the display area, and the buffer layer being in contact with the inorganic film, wherein the buffer layer is disposed in the non-display area and is provided at a predetermined interval from the display area.

According to the embodiments of the present invention, the encapsulation film may include the first inorganic film, the organic film on the first inorganic film, and the second inorganic film for covering the organic film. The buffer layer may be in contact with the edge of at least one of the first inorganic film and the second inorganic film.

According to the embodiments of the present invention, there may be an additionally-provided dam which is disposed in the non-display area and is provided to surround the display area so as to prevent the flow of the organic film.

According to one or more embodiments of the present invention, the height of the buffer layer may be greater than the height of the dam.

According to the embodiments of the present invention, the buffer layer may be disposed in the periphery of the dam.

According to the embodiments of the present invention, each of the pixels may include the first electrode, the light emitting layer on the first electrode, and the second electrode on the light emitting layer, and the buffer layer may be disposed between the dam and the pixel, and may not be overlapped with the second electrode.

According to the embodiments of the present invention, the buffer layer may include the first buffer layer disposed between the dam and the pixel, and the second buffer layer disposed in the periphery of the dam.

According to the embodiments of the present invention, the first buffer layer may be in contact with the edge of the first inorganic film, and the second buffer layer may be in contact with the edge of the second inorganic film.

According to the embodiments of the present invention, the buffer layer may be disposed to surround the display area.

According to the embodiments of the present invention, the inorganic film may cover the predetermined portion of the upper surface of the buffer layer.

According to the embodiments of the present invention, the non-display area may include the pad area having the pad, the dam may be disposed between the display area and the pad area, and the buffer layer may be disposed between the dam and the pad area.

According to the embodiments of the present invention, there may be the first power source auxiliary line supplied with the voltage from the pad, and the buffer layer may be disposed on the first power source auxiliary line.

According to the embodiments of the present invention, the buffer layer may include the third buffer layer, and the fourth buffer layer on the third buffer layer.

According to the embodiments of the present invention, there may be the second power source auxiliary line which is disposed between the third buffer layer and the fourth buffer layer and is electrically connected with the first power source auxiliary line through the contact hole penetrating through the third buffer layer.

According to the embodiments of the present invention, the buffer layer may be provided with the crack-prevention groove.

According to the embodiments of the present invention, the buffer layer may be formed of the organic material.

According to the embodiments of the present invention, the buffer layer may be formed of a plurality of island-shaped patterns.

According to the embodiments of the present invention, the second inorganic film may be provided in the periphery of the first buffer layer.

The method for manufacturing the display device according to the embodiment of the present invention may include forming the pixels on the display area of the substrate, forming the buffer layer on the non-display area, arranging the mask on the buffer layer, and removing the mask after forming the inorganic film for covering the display area.

According to the embodiments of the present invention, the step of arranging the mask may include bring the buffer layer in contact with the mask.

According to the embodiments of the present invention, the step of arranging the mask may include arranging the mask so as to expose the predetermined portion of the upper surface of the buffer layer.

According to the embodiments of the present invention, the step of forming the buffer layer on the non-display area may further include forming the dam in the non-display area.

According to the embodiments of the present invention, the height of the buffer layer may be greater than the height of the dam.

According to the embodiments of the present invention, the buffer layer may be disposed in the periphery of the dam.

According to one or more embodiments of the present invention, the buffer layer is provided between the non-display area and the scribing line, and the mask is disposed on the buffer layer for the process of depositing the inorganic film so that it is possible to prevent the inorganic film from being formed in the scribing line. Accordingly, it is possible to prevent cracks in the inorganic film for the scribing process, thereby improving yield and reliability of the display device.

Also, the buffer layer is provided in the non-display area so that it is possible to reduce the permeation of moisture or oxygen through the lateral surface of the display device, thereby improving lifespan and reliability of the display device.

Also, the height of the buffer layer is larger than the height of the dam so that it is possible to reduce the damage of the dam for the process of disposing the mask on the buffer layer. Accordingly, it is possible to prevent the moisture or oxygen from being permeated into the organic film through the damaged dam.

Also, the buffer layer is formed of the plurality of island-shaped patterns so that it is possible to reduce the increase of stress in the non-display area.

Also, the buffer layer is not overlapped with the electrode, to thereby reduce the damage of the electrode for the process of disposing the mask on the buffer layer. Accordingly, it is possible to prevent the defect caused by the damaged electrode.

According as the first buffer layer and the second buffer layer are provided, the first inorganic film and the second inorganic film have the different sizes from each other so that the second inorganic film perfectly covers the first inorganic film and the organic film, to thereby prevent the permeation of moisture or oxygen.

Also, the buffer layer is formed of the same material as that of at least one of the planarization film and the bank so that there is no need for the additional manufacturing process of the buffer layer.

Also, the buffer layer is provided on the power source auxiliary line for supplying the power source voltage to the power source line. Thus, even though a large amount of electric charges is instantaneously gathered in the edge of the mask for the process of depositing the first inorganic film or the second inorganic film, it is possible to prevent static electricity between the mask and the power source auxiliary line by the buffer layer.

Also, the buffer layer is provided with at least one groove for exposing the protection film so that it is possible to prevent external moisture or oxygen from being permeated into the inside.

According as the second power source auxiliary line is additionally provided on the first power source auxiliary line by the use of buffer layer, it is possible to increase the cross sectional area of the power source auxiliary line. Eventually, it is possible to realize the stable supply of power source by decreasing the resistance.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
    a substrate having a display area provided with pixels, and a non-display area surrounding the display area and including a pad area provided with pads;
    an encapsulation film which covers the display area and includes an inorganic film;
    a buffer layer which is spaced apart from the display area in the non-display area and is brought into contact with an edge of the inorganic film;
    a dam being provided in the non-display area so as to surround the display area; and
    a first power source auxiliary line supplied with a voltage from the pads,
    wherein the buffer layer is disposed on the first power source auxiliary line, and provided in a periphery of the dam.

2. The display device according to claim 1, wherein the encapsulation film includes:
    a first inorganic film for covering the display area;
    an organic film provided on the first inorganic film; and
    a second inorganic film for covering the organic film,
    wherein the buffer layer is brought into contact with an edge of at least one of the first inorganic film and the second inorganic film.

3. The display device according to claim 2, wherein the dam prevents the organic film from overflowing.

4. The display device according to claim 3,
wherein each of the pixels includes a first electrode, a light emitting layer provided on the first electrode, and a second electrode provided on the light emitting layer, and
the buffer layer is disposed between the dam and the pixels, and the buffer layer is not overlapped with the second electrode.

5. The display device according to claim 3, wherein the buffer layer includes:
a first buffer layer disposed between the dam and the pixels; and
a second buffer layer disposed in a periphery of the dam.

6. The display device according to claim 5, wherein the first buffer layer is in contact with an edge of the first inorganic film, and the second buffer layer is in contact with an edge of the second inorganic film.

7. The display device according to claim 6, wherein the second inorganic film is provided in a periphery of the first buffer layer.

8. The display device according to claim 1, wherein a height of the buffer layer is larger than a height of the dam.

9. The display device according to claim 1, wherein the buffer layer is provided to surround the display area.

10. The display device according to claim 1, wherein the inorganic film covers some area of an upper surface of the buffer layer.

11. The display device according to claim 1,
wherein the dam is disposed between the display area and the pad area, and the buffer layer is disposed between the dam and the pad area.

12. The display device according to claim 1, wherein the buffer layer includes a third buffer layer, and a fourth buffer layer disposed on the third buffer layer.

13. The display device according to claim 12, further comprising a second power source auxiliary line which is disposed between the third buffer layer and the fourth buffer layer and is electrically connected with the first power source auxiliary line via a contact hole penetrating through the third buffer layer.

14. The display device according to claim 1, wherein the buffer layer is provided with a crack prevention groove for preventing spread of cracks.

15. The display device according to claim 1, wherein the buffer layer is formed of an organic material.

16. The display device according to claim 1, wherein the buffer layer is formed in a plurality of island-shaped patterns.

17. A method for manufacturing a display device comprising:
providing pixels in a display area on a substrate;
providing a first power source auxiliary line supplied with a voltage from pads;
providing a dam in a non-display area as to surround the display area;
providing a buffer layer located between the pads and the dam, and brought into contact with an edge of an inorganic film;
disposing a mask on the buffer layer, wherein the mask is in contact with the buffer layer; and
providing an encapsulation film including the inorganic film for covering the display area, and removing the mask,
wherein the non-display area includes a pad area having the pads, and
wherein the buffer layer is disposed on the first power source auxiliary line, and provided in a periphery of the dam.

18. The method according to claim 17, wherein the disposing the mask on the buffer layer includes disposing the mask to expose some area of an upper surface of the buffer layer.

19. The method according to claim 17, wherein a height of the buffer layer is larger than a height of the dam.

20. The method according to claim 17, wherein the buffer layer is provided in a periphery of the dam.

21. The method according to claim 17, wherein the providing the buffer layer includes providing a first buffer layer and a second buffer layer in the non-display area, and the method further comprising:
disposing a first mask on the first buffer layer;
providing a first inorganic film for covering the display area;
removing the first mask;
disposing a second mask on the second buffer layer;
providing a second inorganic film for covering the first inorganic film;
removing the second mask.

22. The method according to claim 21, wherein the first buffer layer and the second buffer layer are deposited by different deposition methods.

* * * * *